US006769050B1

(12) United States Patent
Ware et al.

(10) Patent No.: US 6,769,050 B1
(45) Date of Patent: Jul. 27, 2004

(54) TECHNIQUES FOR INCREASING BANDWIDTH IN PORT-PER-MODULE MEMORY SYSTEMS HAVING MISMATCHED MEMORY MODULES

(75) Inventors: Frederick A. Ware, Los Altos Hills, CA (US); Richard E. Perego, San Jose, CA (US); Craig E. Hampel, San Jose, CA (US); Ely K. Tsern, Los Altos, CA (US)

(73) Assignee: Rambus Inc., Los Altos, CA (US)

( * ) Notice: Subject to any disclaimer, the term of this patent is extended or adjusted under 35 U.S.C. 154(b) by 332 days.

(21) Appl. No.: 09/948,906

(22) Filed: Sep. 10, 2001

(51) Int. Cl.[7] .......... G06F 12/00

(52) U.S. Cl. .......... 711/154; 711/149; 711/163; 711/173

(58) Field of Search .......... 711/163, 173, 711/149, 154; 365/189.02, 189.03, 189.04, 230.02, 230.03, 230.05

(56) References Cited

U.S. PATENT DOCUMENTS 4,995,005 A * 2/1991 Lodhi .......... 365/221
5,893,927 A 4/1999 Hovis
6,092,148 A * 7/2000 Sugita .......... 711/102
6,134,640 A * 10/2000 Unno et al. .......... 711/171
6,138,204 A * 10/2000 Amon et al. .......... 711/104
6,216,248 B1 * 4/2001 Mc Connell et al. .......... 714/763
6,636,935 B1 * 10/2003 Ware et al. .......... 711/5

* cited by examiner

*Primary Examiner*—Matthew Kim
*Assistant Examiner*—Stephen Elmore
(74) *Attorney, Agent, or Firm*—Hunton & Williams LLP

(57) ABSTRACT

Techniques for increasing bandwidth in port-per-module memory systems having mismatched memory modules are disclosed. In one exemplary embodiment, the techniques are realized through a memory controller for controlling access to a memory module, wherein the memory module has a memory component with a memory core for storing data therein. The memory controller comprises a first set of interface connections for providing access to the memory module, and a second set of interface connections for providing access to the memory module. The memory controller also comprises memory access circuitry for providing memory access signals to the memory module for selecting between a first mode wherein a first portion of the memory core is accessible through the first set of interface connections and a second portion of the memory core is accessible through the second set of interface connections, and a second mode wherein both the first portion and the second portion of the memory core are accessible through the first set of interface connections.

34 Claims, 45 Drawing Sheets

Multiplexer Path Selection for the Memory Component

| | | | read | | write | |
|---|---|---|---|---|---|---|
| memory connected to: | Config[1:0] | $A_{CL}[0]$ | QY | QX | D1 | D0 |
| Port 1x/ 1y | 00 | - | Q1 | Q0 | DY | DX |
| Port 1x/ 1y | 01 | 0 | - | Q0 | 0..0 | DX |
| Port 1x/ 1y | 01 | 1 | Q1 | - | DY | 0..0 |
| Port 2 | 10 | 0 | - | Q0 | 0..0 | DX |
| Port 2 | 10 | 1 | - | Q1 | DX | 0..0 |

Figure 10

Multiplexer Path Selection by the Controller with 1x/8x modules present

| | read | | write | | |
|---|---|---|---|---|---|
| A[NA+2],A[NA+1],A[NA],A[NA-1] | Ry | Rx | QD1y | QD1x | QD2 |
| 0000 .. 0110 | QD1y | QD1x | Wy | Wx | - |
| 0111 | QD2 | QD1x | - | Wx | Wy |
| 1000 | QD1y | QD2 | Wy | - | Wx |

Figure 11

Address Generation by the Controller with 1x/8x modules present

| | Port 1x/1y | | | Port 2 | | |
|---|---|---|---|---|---|---|
| A[NA+2],A[NA+1],A[NA],A[NA-1] | Config[1:0] | $A_{CL}[0]$ | A1[NA+2]..A1[NA-1] @ | Config[1:0] | $A_{CL}[0]$ | A2[NA+2]..A2[NA-1] # |
| 0000 .. 0110 | 00 | - | 0000 .. 0110 | - | - | - |
| 0111 | 01 | 0 | 0111 | 10 | 0 | 0001 |
| 1000 | 01 | 1 | 0111 | 10 | 1 | 0000 |

TECHNIQUES FOR INCREASING BANDWIDTH IN PORT-PER-MODULE MEMORY SYSTEMS HAVING MISMATCHED MEMORY MODULES

CROSS-REFERENCE TO RELATED APPLICATIONS

This patent application is related to U.S. patent application Ser. No. 09/949,464, filed Sep. 7, 2001, entitled "Improved Granularity Memory Column Access" which is hereby incorporated by reference herein in its entirety.

This patent application is also related to U.S. patent application Ser. No. 09/948,755, U.S. patent application Ser. No. 09/948,905, and U.S. patent application Ser. No. 09/948,769, each of which having been filed concurrently herewith, each of which being entitled "Techniques for Increasing Bandwidth in Port-Per-Module Memory Systems Having Mismatched Memory Modules", and each of which being hereby incorporated by reference herein in its entirety.

FIELD OF THE INVENTION

The present invention relates generally to memory systems and, more particularly, to techniques for increasing bandwidth in port-per-module memory systems having mismatched memory modules.

BACKGROUND OF THE INVENTION

Most electronic memory systems permit two or more memory modules to be connected to each memory port of a memory controller. This feature allows a memory system manufacturer to connect one memory module to each memory controller port, while still allowing a memory system owner to later upgrade the memory system by adding at least one additional memory module to each memory controller port.

However, in memory systems having a high rate of data signaling or other restrictive signaling requirements, only a single memory module is permitted to be connected to each memory controller port. This is sometimes called a point-to-point connection topology, or a port-per-module memory system. When a memory system is constrained in this fashion, and when it is still necessary to allow the memory system to be upgraded at least once after its initial manufacture, then problems can arise when the memory capacities of the initial memory module and the additional memory module(s) do not match.

To illustrate these problems, it is useful to first describe memory systems having point-to-point memory module connections wherein only a single memory module is employed or multiple memory modules of matching memory capacity are employed. For example, FIG. 1 illustrates two such memory systems having point-to-point memory module connections. More particularly, FIG. 1A shows a memory system 10 with one memory module 12 connected to a first port 14 of a memory controller 16. FIG. 1B shows a memory system 20 with the first memory module 12 connected to the first port 14 of the memory controller 16, and a second memory module 28 connected to a second port 30 of the memory controller 16.

The memory modules 12 and 28 in FIGS. 1A and 1B are divided into ranks (rows) of memory components (MEM) 32. The number of ranks is denoted $N_R$, and may vary from module to module. Note that in some memory systems the point-to-point connection constraint may extend to the memory component as well as the memory module. In such a case, the number of ranks $N_R$ is limited to one.

The memory modules 12 and 28 in FIGS. 1A and 1B are also divided into slices (columns) of memory components (MEM) 32. The number of slices is denoted $N_S$, and may also vary from module to module. However, the number of slices $N_S$ times the number of data-type signals per slice $N_{dq}$ is a constant ($N_{DQ}=N_S*N_{dq}$) determined by the number of data-type signals at a memory controller port $N_{DQ}$.

The notion of "slice" is used to distinguish address-type signals "A" from data-type signals "QD". The data-type signals (QD) from a slice of a memory controller port are only connected to a corresponding slice of each rank of memory components in a memory module. The address-type signals (A) are connected to all slices of each rank of memory components in a memory module. The address-type signals (A) can usually fan-out to more memory components than can data-type signals for several reasons including: [1] the signaling rate of address-type signals (A) is typically lower than data-type signals, and [2] address-type signals (A) are typically unidirectional (flowing from memory controller to memory components) and data-type signals (QD) are typically bi-directional (flowing in one direction at one time and flowing in the opposite direction at another time).

In addition to memory components (MEM) 32, each memory module 12 and 28 also contains some form of termination structure (T) 22 at the end of each signal wire. This is typically some sort of resistor component, and is typically required due to high signaling rates in a memory system.

Other connection topologies within a memory module are also possible, and will be described in detail below. The topologies shown in FIG. 1 are representative of these other connection topologies, and are used as an example to illustrate the problem arising from the need to upgrade memory systems with point-to-point connections between memory controller and memory module(s).

FIG. 2 shows the internal detail of the memory component (MEM) 32 that is used in the memory modules of FIG. 1. The address-type signals (A) typically comprise row signals ($A_{RCLK}/A_{RSTROBE}$, $A_{REN}$, $OP_R$, $A_{BR}$, and $A_R$) and column signals ($A_{CCLK}/A_{CSTROBE}$, $A_{CEN}$, $OP_C$, $A_{BC}$, and $A_C$). The data-type signals (QD) typically comprise read signals ($Q_{EN}$, $Q_{CLK}$, $Q_{STROBE}$, and Q) and write signals ($D_{EN}$, $D_{CLK}$, $D_{STROBE}$, D and DM). Both the address-type signals (A) and the data-type signals (QD) are used to control access to $2^{NB}$ banks of memory core 34.

$A_{RCLK}/A_{RSTROBE}$ is a timing signal which is used to indicate when other row signals carry valid information. Such a timing signal is usually called a "clock" or "strobe" signal. $A_{REN}$ is a control signal which is optionally present. It is an "enable" signal that can indicate when the valid information carried by other row signals is to be used or ignored by the memory component (MEM) 32. $OP_R$ is a set of signals (a set of Nopr wires) that is used to indicate what type of row operation is to take place. $A_{BR}$ is a set of signals (a set of Nb wires) that is used to indicate the bank address for a row operation. $A_R$ is a set of signals (a set of Nr wires) that is used to indicate the row address for a row operation. Three row decode blocks 36 are provided which include storage elements (registers and/or latches) and logic that are needed to provide row control signals to the memory core 34 at the appropriate time.

$A_{CCLK}/A_{CSTROBE}$ is timing signal which is used to indicate when other column signals carry valid information. Such a timing signal is usually called a "clock" or "strobe" signal. $A_{CEN}$ is a control signal which is optionally present. It is an "enable" signal that can indicate when the valid information carried by other column signals is to be used or ignored by the memory component. $OP_C$ is a set of signals (a set of Nopc wires) that is used to indicate what type of column operation is to take place. $A_{BC}$ is a set of signals (a set of Nb wires) that is used to indicate the bank address for a column operation. $A_C$ is a set of signals (a set of Nc wires) that is used to indicate the column address for a column operation. Three column decode blocks 38 are provided which include storage elements (registers and/or latches) and logic that are needed to provide column control signals to the memory core 34 at the appropriate time.

Note that in some memory components, some of the above sets of signals could share the same wires. However, these signals are shown in FIG. 2 in unshared form for purposes of descriptive clarity.

There are two principle types of row operation: activate and precharge. When an activate operation is indicated, one of the $2^{Nr}$ rows of the $2^{Nb}$ banks of the memory core 34 is selected by row drivers 40 of the memory core 34. ($2^{Nc}$*M*Ndq) bits of the selected row are then sensed and latched by column sense amplifiers 42 of the memory core 34. When a precharge operation is indicated, the column sense amplifiers 42, row drivers 40, and other circuitry of the memory core 34 are returned to a precharged state to await the next activate operation.

There are two principle types of column operation: read and write. When a read operation is indicated, one of the $2^{Nc}$ columns of the $2^{Nb}$ banks of the memory core 34 is selected, and (M*Ndq) bits of the selected column are transferred to a multiplexer 44. This data is grouped into "M" sets of "Ndq" bits. The multiplexer 44, which performs a parallel-to-serial conversion on the data, transfers "Ndq" bits at a time (repeated "M" separate times) to "Ndq" data output pins (Q). $Q_{CLK}$ and $Q_{STROBE}$ are timing signals which are asserted and generated, respectively, to indicate when the data output pins (Q) carry valid information. Note that $Q_{CLK}$ is typically supplied by an external source, but could be generated inside the memory component (MEM) 32. It could also be synthesized internally from one of the other timing signals. $Q_{STROBE}$ is typically generated inside the memory component (MEM) 32 in response to $Q_{LCK}$. A memory component might have both $Q_{CLK}$ and $Q_{STROBE}$ present, or it might have only one of the signals present, or it might have neither present. In the last case, a timing signal for output data is typically synthesized from other timing signals present in the memory component (MEM) 32.

$Q_{EN}$ is a control signal which is optionally present. It is an "enable" signal that can indicate whether the memory component (MEM) 32 is to drive output data onto the data output pins (Q).

When a write operation is indicated, one of the $2^{Nc}$ columns of the $2^{Nb}$ banks of the memory core 34 is selected, and (M*Ndq) bits are received at a first demultiplexer 46. This data is grouped into "M" sets of "Ndq" bits. The first demultiplexer 46, which performs a serial-to-parallel conversion on the data, receives "Ndq" bits at a time (repeated "M" separate times) from "Ndq" data input pins (D). $D_{CLK}$ and $D_{STROBE}$ are timing signals which are asserted to indicate when the data input pins (D) carry valid information. Note that these timing signals are typically supplied from an external source. They could also be synthesized internally from one of the other timing signals. A memory component might have both $Q_{CLK}$ and $Q_{STROBE}$ present, or it might have only one of the signals present, or it might have neither present. In the last case, a timing signal for input data is typically synthesized from other timing signals present in the memory component (MEM 32).

$D_{EN}$ is a control signal which is optionally present. It is an "enable" signal that can indicate whether the memory component (MEM) 32 is to receive input data from the data input pins (D).

The "DM" pins carry "Ndm" signals which supply mask information for the write operation. These signals are treated like the write data signals from a timing perspective, passing though a second demultiplexer 48 and undergoing a serial-to-parallel conversion. The (M*Ndm) mask signals are passed to the memory core 34 along with the (M*Ndq) data signals and control which of the data bits are written to the selected (M*Ndq) storage cells of the column sense amplifier and eventually to the corresponding storage cells of the selected row of the selected bank.

Note that the signals carried on input (D) and output (Q) pins are usually carried on the same wires (i.e., the QD data lines shown). However, they are shown separately in FIG. 2 for purposes of descriptive clarity. Also note that some of the other timing and control signals could also share the same wires. Again, however, these signals are shown in FIG. 2 in unshared form for purposes of descriptive clarity. In any event, as previously indicated, all the signals associated with the input (D) and output (Q) pins share the same topology (i.e., connecting from a slice of a memory controller port to corresponding slices of ranks of memory components in a memory module).

With the basic point-to-point connection topology memory systems of FIG. 1 now having been fully described, it is now appropriate to describe the problems which can arise when port-per-module memory systems having point-to-point memory module connections employ memory modules of differing memory capacity. To describe these problems, it is useful to describe several alternative port-per-module memory systems having point-to-point memory module connections wherein multiple memory modules of differing memory capacity are employed.

FIG. 3 illustrates the simplest alternative port-per-module memory system called an exclusive port-per-module memory system. In this alternative, a memory request is directed to either of two memory controller ports. There is no attempt to operate the two memory controller ports simultaneously. This alternative has the advantage that the performance of the memory system does not depend upon the relative sizes and presence of the memory modules. The disadvantage of this alternative is that the memory system has underutilized resources (the memory controller ports and memory modules) relative to a memory system which is able to operate memory modules simultaneously.

In FIG. 3, there are five cases shown: a first memory module 62 of capacity "1x" only in FIG. 3A; the first memory module 62 and a second memory module 64 with memory capacities of "1x"/"1x", respectively, in FIG. 3B; the first memory module 62 and a second memory module 66 with memory capacities of "1x"/"2x", respectively, in FIG. 3C; the first memory module 62 and a second memory module 68 with memory capacities of "1x"/"4x", respectively, in FIG. 3D; and the first memory module 62 and a second memory module 70 with memory capacities of "1x"/"8x", respectively, in FIG. 3E. In each case, a memory controller 50 comprises a read multiplexer 52 that selects read data from one of two memory controller ports 58 and 60, and two drivers 54 and 56 that transmit write data to one of two memory controller ports 58 and 60. Also, in each case, the unified memory space presented by the memory controller 50 to the rest of the system consists of the larger memory space in the lower addresses, and the smaller memory space in the upper addresses. In the case of FIG. 3E with the "1x"/"8x" memory modules, the "8x" memory module 70 occupies the low $2^{NA+3}$ words. The "1x" memory module 62 occupies the high $2^{NA}$ words.

Each addressable word is $N_D$ bits in size, where $N_D=M*N_{DQ}$, and $N_{DQ}=N_S*N_{dq}$. $N_{DQ}$ is the number of QD signal wires per rank, and $N_D$ is the number of bits transferred serially in "M" successive time intervals on the $N_{DQ}$ wires. $N_S$ is the number of slices (memory components) per rank, and $N_{dq}$ is the number of QD signal wires per slice (memory component).

FIG. 4 illustrates a second alternative port-per-module memory system called an independent port-per-module memory system. In this system, there are two sets of address, read data, and write data signals between a memory controller 74 and the rest of the system (not shown). These two sets of signals are appended with a "u" or "v" to distinguish them. They are connected to memory request sources in the system (e.g., central processing unit, graphics unit, I/O unit, etc), and they permit two simultaneous memory requests to be performed.

In FIG. 4, there are five cases shown: a first memory module 86 of capacity "1x" only in FIG. 4A; the first memory module 86 and a second memory module 88 with memory capacities of "1x"/"1x", respectively, in FIG. 4B; the first memory module 86 and a second memory module 90 with memory capacities of "1x"/"2x", respectively, in FIG. 4C; the first memory module 86 and a second memory module 92 with memory capacities of "1x"/"4x", respectively, in FIG. 4D; and the first memory module 86 and a second memory module 94 with memory capacities of "1x"/"8x", respectively, in FIG. 4E. In each case, the memory controller 74 comprises two address multiplexers 76*u* and 76*v*, two read data multiplexers 78*u* and 78*v*, and two write data multiplexers 80*u* and 80*v*. The address multiplexers 76*u* and 76*v* have address queues 82*u* and 82*v*, respectively, and the write data multiplexers 80*u* and 80*v* write data queues 84*u* and 84*v*, respectively, for accumulating memory request addresses and write data, as described in detail below.

This second alternative port-per-module memory system is called an independent port-per-module memory system because two memory module spaces are accessed independently. Typically, a high order address bit of the Au and Av address buses is used to select between the first and the second memory modules. Each memory request on the "u" and "v" buses is steered to the queue for the appropriate memory module.

In the case of FIG. 4E with the "1x"/"8x" memory modules, the second memory module 94 will typically receive eight times as many memory requests (per unit of time) as the first memory module 86 if the requests are evenly distributed across the memory spaces. This is the reason for the queues, since they permit memory requests to the more-dense memory module to be accumulated until each less frequent memory requests for the less-dense memory module is received. This insures that the memory system achieves the best possible performance level, but doesn't fix the fundamental problem of an uneven request rate to the two mismatched memory modules.

Some applications may be able to guarantee that the numbers of memory requests per unit of time to each memory module are reasonably balanced. This may be possible by placing more frequently accessed code and data structures in the less-dense memory module. If this is not possible, then the performance of a system with two mismatched memory modules (e.g., 1x/8x) might have lower performance than a system with two matched modules (e.g., 1x/1x) even though there is more memory in the mismatched system. This is very undesirable, since it is expected that if the amount of memory is increased in a system, the performance will increase.

FIG. 5 illustrates a third alternative port-per-module memory system called a lockstep port-per-module memory system. As in the second alternative memory system of FIG. 4, in the third alternative memory system of FIG. 5 there are two sets of read data and write data signals between a memory controller 96 and the rest of the system (not shown). These two sets of signals are appended with a "u" or "v" to distinguish them. They are connected to memory request sources in the system (e.g., central processing unit, graphics unit, I/O unit, etc), and they permit two simultaneous memory requests to be performed.

However, unlike the second alternative memory system of FIG. 4, in the third alternative memory system of FIG. 5 there is only a single address bus "A" between the memory controller 96 and the rest of the system (not shown).

In FIG. 5, there are five cases shown: a first memory module 114 of capacity "1x" only in FIG. 5A; the first memory module 114 and a second memory module 116 with memory capacities of "1x"/"1x", respectively, in FIG. 5B; the first memory module 114 and a second memory module 118 with memory capacities of "1x"/"2x", respectively, in FIG. 5C; the first memory module 114 and a second memory module 120 with memory capacities of "1x"/"4x", respectively, in FIG. 5D; and the first memory module 114 and a second memory module 122 with memory capacities of "1x"/"8x", respectively, in FIG. 5E. In each case, the memory controller 96 comprises address decode logic 98, a read data buffer 100, a read data multiplexer 102, a read data driver 104, a write data buffer 106, a write data multiplexer 108, and two write data drivers 110 and 112.

This third alternative memory system of FIG. 5 is called a lockstep port-per-module memory system because each memory request is made to two memory modules in lockstep (i.e., simultaneously). The Ru read data and Wu write data is steered from/to the QD1 data bus of a first memory controller port 124, and the Rv read data and Wv write data is steered from/to the QD2 data bus of a second memory controller port 126. This permits memory requests to be completed at the maximum possible rate as long as there are equal amounts of memory in each memory module. However, if the memory modules are mismatched, the performance will drop. This can be best seen in the case of FIG. 5E with the "1x/8x" memory modules 114 and 122, respectively. When the memory space above the $2^{NA}$ address is accessed, memory locations will only be available in the second memory module 122. For a read operation, it will be necessary to access two memory locations sequentially in the second memory module 122 and steer them to the Ru and Rv buses. For a write operation, it will be necessary to steer the Wu and Wv buses to the second memory module 122 for two sequential accesses. As a result, the upper memory space can only be accessed at half the rate of the lower memory space. As in the second alternative memory system of FIG. 4, in the third alternative memory system of FIG. 5 it is possible that adding memory to the system may cause its performance to be lowered.

In view of the foregoing, it would be desirable to provide at least one technique for increasing bandwidth in port-per-module memory systems having mismatched memory modules which overcomes the above-described inadequacies and shortcomings in an efficient and cost effective manner.

SUMMARY OF THE INVENTION

According to the present invention, techniques for increasing bandwidth in port-per-module memory systems having mismatched memory modules are provided. In one exemplary embodiment, the techniques are realized through a memory controller for controlling access to a memory module, wherein the memory module has a memory component with a memory core for storing data therein. The memory controller comprises a first set of interface connections for providing access to the memory module, and a second set of interface connections for providing access to the memory module. The memory controller also comprises memory access circuitry for providing memory access signals to the memory module for selecting between a first mode wherein a first portion of the memory core is accessible through the first set of interface connections and a second portion of the memory core is accessible through the second set of interface connections, and a second mode wherein both the first portion and the second portion of the memory core are accessible through the first set of interface connections.

In accordance with other aspects of this exemplary embodiment of the present invention, the first and second sets of interface connections provide access to the memory module so as to read data from the memory core and write data to the memory core. Also, the memory access circuitry includes decode logic for decoding address signals so as to generate the memory access signals.

In another exemplary embodiment, the techniques are realized through a method for controlling access to a memory module, wherein the memory module has a memory component with a memory core for storing data therein. The method comprises decoding address signals so as to generate memory access signals for the memory module, and then providing the memory access signals to the memory module for selecting between a first mode wherein a first portion of the memory core is accessible through a first set of interface connections and a second portion of the memory core is accessible through a second set of interface connections, and a second mode wherein both the first portion and the second portion of the memory core are accessible through the first set of interface connections.

In accordance with other aspects of this exemplary embodiment of the present invention, the memory core is accessible during the first and second modes to read data from the memory core and write data to the memory core. Also, the memory core is accessible during the first and second modes through a multiplexing stage.

In another exemplary embodiment, the techniques are realized through a memory controller for controlling access to a memory module, wherein the memory module has at least one memory component for providing a first group of memory storage locations and a second group of memory storage locations for storing data therein. The memory controller comprises a first set of interface connections for providing access to the memory module, and a second set of interface connections for providing access to the memory module. The memory controller also comprises memory access circuitry for providing memory access signals to the memory module for selecting between a first mode wherein the first group of memory storage locations is accessible through the first set of interface connections and the second group of memory storage locations is accessible through the second set of interface connections, and a second mode wherein both the first group and the second group of memory storage locations are accessible through the first set of interface connections.

In accordance with other aspects of this exemplary embodiment of the present invention, the first and second sets of interface connections provide access to the memory module so as to read data from the first and second groups of memory storage locations and write data to the first and second groups of memory storage locations. Also, the memory access circuitry includes decode logic for decoding address signals so as to generate the memory access signals.

In another exemplary embodiment, the techniques are realized through a method for controlling access to a memory module, wherein the memory module has at least one memory component for providing a first group of memory storage locations and a second group of memory storage locations for storing data therein. The method comprises decoding address signals so as to generate memory access signals for the memory module, and then providing the memory access signals to the memory module for selecting between a first mode wherein the first group of memory storage locations is accessible through a first set of interface connections and the second group of memory storage locations is accessible through a second set of interface connections, and a second mode wherein both the first group and the second group of memory storage locations are accessible through the first set of interface connections.

In accordance with other aspects of this exemplary embodiment of the present invention, the first and second groups of memory storage locations are accessible during the first and second modes to read data from the first and second groups of memory storage locations and write data to the first and second groups of memory storage locations. Also, the first and second groups of memory storage locations are accessible during the first and second modes through a multiplexing stage.

In another exemplary embodiment, the techniques are realized through a memory controller for controlling access to a plurality of memory modules, wherein each of the plurality of memory modules has at least one memory component for providing memory storage locations for storing data therein. The memory controller comprises a first set of interface connections for providing access to a first of the plurality of memory modules, a second set of interface connections for providing access to a second of the plurality of memory modules, and a third set of interface connections for providing access to a third of the plurality of memory modules. The memory controller also comprises memory access circuitry for controlling access to the first, second, and third memory modules through the first, second, and third sets of interface connections, respectively, such that a first memory storage location in the first memory module may be accessed through the first set of interface connections simultaneously while a second memory storage location in the second memory module is accessed through the second set of interface connections, and a third memory storage location in the first memory module may be accessed through the first set of interface connections simultaneously while a fourth memory storage location in the third memory module is accessed through the third set of interface connections.

In accordance with other aspects of this exemplary embodiment of the present invention, the first, second, and third sets of interface connections provide access to the first, second, and third memory modules, respectively, so as to read data from the memory storage locations and write data to the memory storage locations.

In accordance with further aspects of this exemplary embodiment of the present invention, the memory access circuitry includes memory mapping logic for establishing groups of memory storage locations between the first memory module and the second memory module, and between the first memory module and the third memory module.

In accordance with still further aspects of this exemplary embodiment of the present invention, the memory access circuitry also controls access to the first, second, and third memory modules through the first, second, and third sets of interface connections, respectively, such that a fifth memory storage location in the second memory module may be accessed through the second set of interface connections simultaneously while a sixth memory storage location in the third memory module is accessed through the third set of interface connections.

In accordance with still further aspects of this exemplary embodiment of the present invention, the memory access circuitry includes memory mapping logic for establishing groups of memory storage locations between the second memory module and the third memory module.

In another exemplary embodiment, the techniques are realized through a method for controlling access to a plurality of memory modules, wherein each of the plurality of memory modules has at least one memory component for providing memory storage locations for storing data therein. The method comprises mapping memory storage locations in each of the plurality of memory modules so as to establish a first group of memory storage locations between a first of the plurality of memory modules and a second of the plurality of memory modules, and a second group of memory storage locations between the first of the plurality of memory modules and a third of the plurality of memory modules. The method also comprises simultaneously accessing a first memory storage location in the first memory module through a first set of interface connections and a second memory storage location in the second memory module through a second set of interface connections, wherein the first memory location and the second memory location are part of the first group of memory storage locations. The method further comprises simultaneously accessing a third memory storage location in the first memory module through the first set of interface connections and a fourth memory storage location in the third memory module through a third set of interface connections, wherein the third memory location and the fourth memory location are part of the second group of memory storage locations.

In accordance with other aspects of this exemplary embodiment of the present invention, the first, second, and third sets of interface connections provide access to the first, second, and third memory modules, respectively, so as to read data from the memory storage locations and write data to the memory storage locations.

In accordance with further aspects of this exemplary embodiment of the present invention, the method further comprises mapping memory storage locations in each of the plurality of memory modules so as to establish a third group of memory storage locations between the second memory module and the third memory module, and simultaneously accessing a fifth memory storage location in the second memory module through the second set of interface connections and a sixth memory storage location in the third memory module through the third set of interface connections, wherein the fifth memory location and the sixth memory location are part of the third group of memory storage locations.

In another exemplary embodiment, the techniques are realized through a memory controller for controlling access to a plurality of memory modules, wherein each of the plurality of memory modules has at least one memory component for providing memory storage locations for storing data therein, and wherein each memory storage location has a unique address. The memory controller comprises a first set of interface connections for providing access to a first of the plurality of memory modules, and a second set of interface connections for providing access to a second of the plurality of memory modules. The memory controller also comprises memory access circuitry for controlling access to the first and second memory modules through the first and second sets of interface connections, respectively, such that memory storage locations in the first and second memory modules may be accessed either independently or jointly through the first and second sets of interface connections, respectively, based upon the unique addresses of the memory storage locations.

In accordance with other aspects of this exemplary embodiment of the present invention, the memory access circuitry also controls access to the first and second memory modules through the first and second sets of interface connections, respectively, such that memory storage locations in the first and second memory modules may be accessed either independently or jointly through the first and second sets of interface connections, respectively, based upon a source requesting access to the memory storage locations in the first and second memory modules.

In accordance with further aspects of this exemplary embodiment of the present invention, the memory access circuitry alternatively controls access to the first and second memory modules through the first and second sets of interface connections, respectively, such that memory storage locations in the first and second memory modules may be accessed either independently or jointly through the first and second sets of interface connections, respectively, based upon a source requesting access to the memory storage locations in the first and second memory modules.

In accordance with still further aspects of this exemplary embodiment of the present invention, the first and second sets of interface connections provide access to the first and second memory modules, respectively, so as to read data from the memory storage locations and write data to the memory storage locations. If such is the case, the memory storage locations in the first and second memory modules may be accessed independently through the first and second sets of interface connections, respectively, such that only a single memory storage location in either the first memory module or the second memory module is accessed through the first set of interface connections or the second set of interface connections, respectively. Alternatively, the memory storage locations in the first and second memory modules may be accessed jointly through the first and second sets of interface connections, respectively, such that a first memory storage location in the first memory module is accessed through the first set of interface connections at essentially the same time as a second memory storage location in the second memory module is accessed through the second set of interface connections.

In another exemplary embodiment, the techniques are realized through a method for controlling access to a plurality of memory modules, wherein each of the plurality of memory modules has at least one memory component for providing memory storage locations for storing data therein, and wherein each memory storage location has a unique address. The method comprises receiving a request to access the plurality of memory modules, and then accessing the plurality of memory modules in response to the request such that memory storage locations in a first of the plurality of memory modules and a second of the plurality of memory modules are accessed either independently or jointly through a first set of interface connections and a second set of interface connections, respectively, based upon the unique addresses of the memory storage locations.

In accordance with other aspects of this exemplary embodiment of the present invention, accessing the plurality of memory modules in response to the request includes accessing memory storage locations in a first of the plurality of memory modules and a second of the plurality of memory modules either independently or jointly through a first set of interface connections and a second set of interface connections, respectively, also based upon a source requesting access to the plurality of memory modules.

In accordance with further aspects of this exemplary embodiment of the present invention, accessing the plurality of memory modules in response to the request includes accessing memory storage locations in a first of the plurality of memory modules and a second of the plurality of memory modules either independently or jointly through a first set of interface connections and a second set of interface connections, respectively, alternatively based upon a source requesting access to the plurality of memory modules.

In accordance with still further aspects of this exemplary embodiment of the present invention, the first and second sets of interface connections provide access to the first and second memory modules, respectively, so as to read data from the memory storage locations and write data to the memory storage locations.

In accordance with still further aspects of this exemplary embodiment of the present invention, independently accessing memory storage locations includes accessing only a single memory storage location in either the first memory module or the second memory module through the first set of interface connections or the second set of interface connections, respectively.

In accordance with still further aspects of this exemplary embodiment of the present invention, jointly accessing memory storage locations includes accessing a first memory storage location in the first memory module through the first set of interface connections at essentially the same time as a second memory storage location in the second memory module is accessed through the second set of interface connections.

The present invention will now be described in more detail with reference to exemplary embodiments thereof as shown in the appended drawings. While the present invention is described below with reference to preferred embodiments, it should be understood that the present invention is not limited thereto. Those of ordinary skill in the art having access to the teachings herein will recognize additional implementations, modifications, and embodiments, as well as other fields of use, which are within the scope of the present invention as disclosed and claimed herein, and with respect to which the present invention could be of significant utility.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

FIG. 10 is a table showing multiplexer path selections for the memory component (MEM) of FIG. 7.

FIG. 11 is a table showing multiplexer path selections for the memory controller of FIGS. 6, 8, and 9.

FIG. 12 is a table showing specific examples of address modification by the memory controller of FIGS. 6, 8, and 9.

DETAILED DESCRIPTION OF EXEMPLARY EMBODIMENT(S)

Figure 6A:
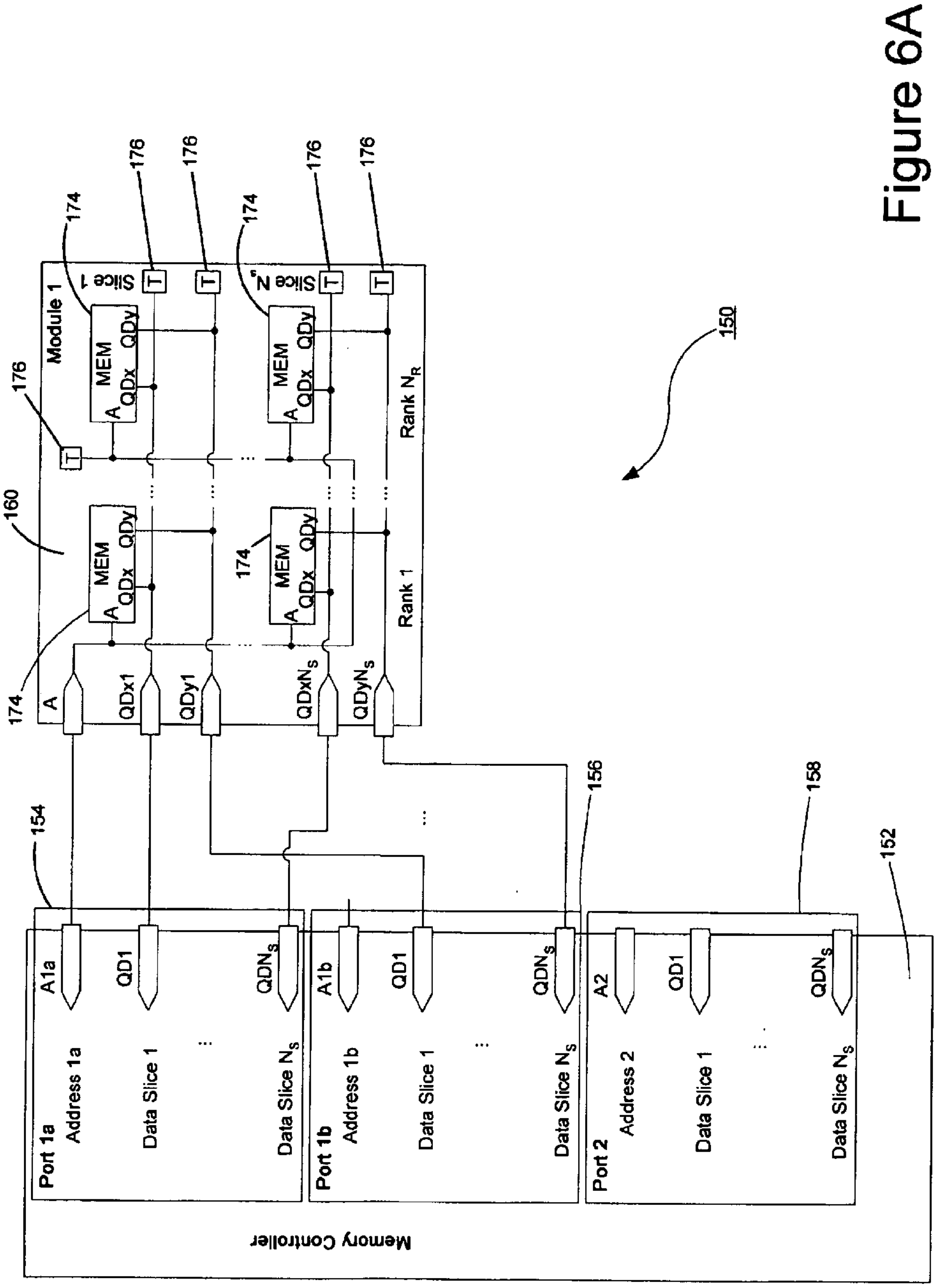
FIG. 6A shows a first asymmetric port memory system having a first memory module in accordance with the present invention.

Referring to FIG. 6A, there is shown a first asymmetric port memory system 150 in accordance with the present invention. The asymmetric port memory system 150 comprises a memory controller 152 having a first port (Port 1*a*) 154, a second port Port 1*b*) 156, and a third port (Port 2) 158, all of equal size. The asymmetric port memory system 150 also comprises a first memory module 160 connected to both the first port (Port 1*a*) 154 and the second port (Part 1*b*) 156 of the memory controller 152.

Figure 6B:
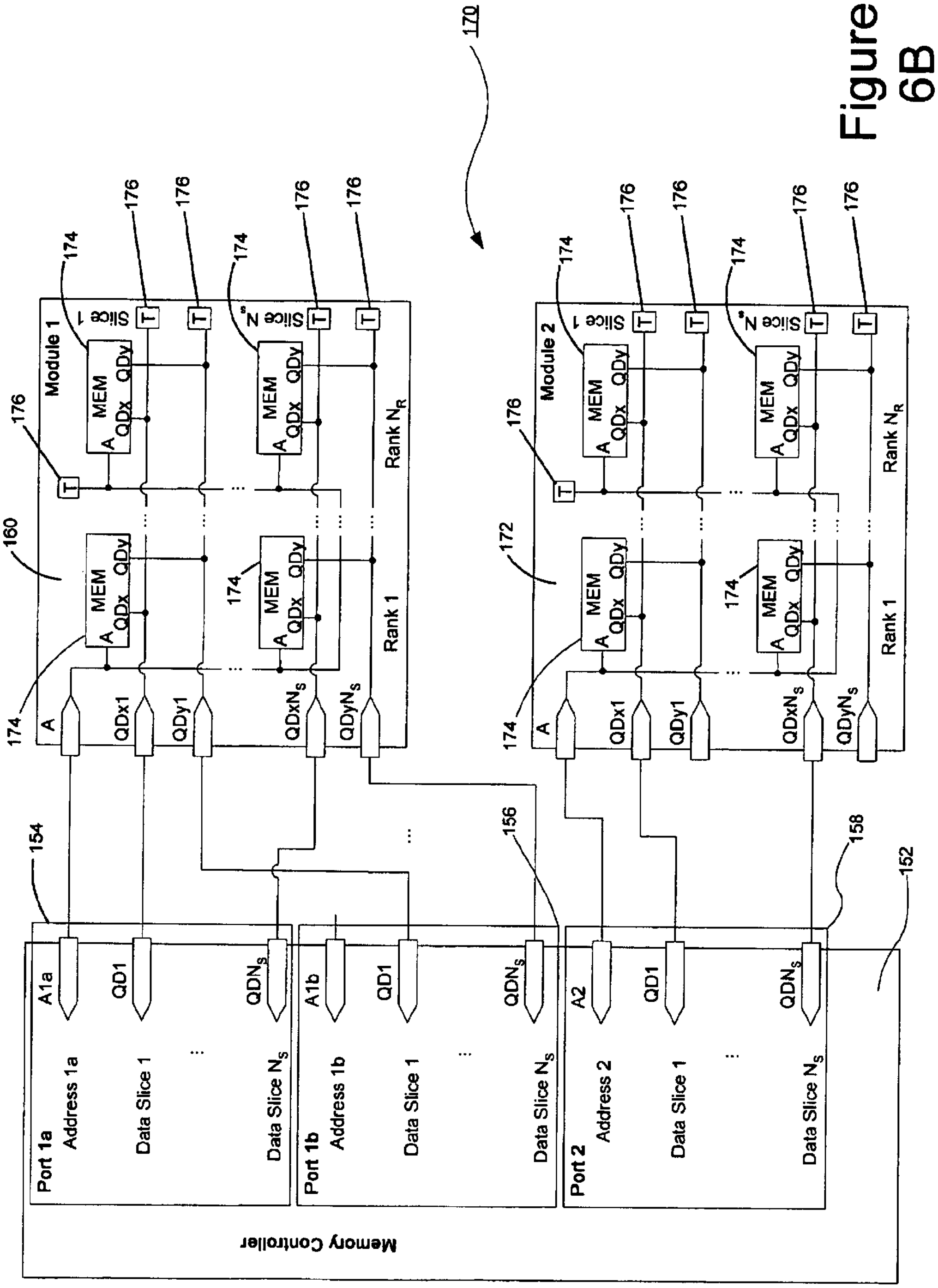
FIG. 6B shows a second asymmetric port memory system having first and second memory modules in accordance with the present invention.

Referring to FIG. 6B, there is shown a second asymmetric port memory system 170 in accordance with the present invention. The asymmetric port memory system 170 comprises the memory controller 152 having the first port (Port 1*a*) 154, the second port (Port 1*b*) 156, and the third port (Port 2) 158, all of equal size. The asymmetric port memory system 170 also comprises the first memory module 160 connected to both the first port (Port 1*a*) 154 and the second port (Port 1*b*) 156 of the memory controller 152, as well as a second memory module 172 connected to the third port (Port 2) 158 of the memory controller 152.

The memory modules 160 and 172 in FIGS. 6A and 6B are divided into ranks (rows) of memory components (MEM) 174. The number of ranks is denoted $N_R$, and may vary from module to module.

The memory modules 160 and 172 in FIGS. 6A and 6B are also divided into slices (columns) of memory components (MEM) 174. The number of slices is denoted $N_S$, and may also vary from module to module. However, the number of slices $N_S$ times the number of data-type signals per slice $N_{dq}$ is a constant ($N_{DQ}=N_S*N_{dq}$), determined by the number of data-type signals at a memory controller port $N_{DQ}$.

As described above, the notion of "slice" is used to distinguish address-type signals "A" from data-type signals "QD". The data-type signals (QD) from a slice of a memory controller port are only connected to a corresponding slice of each rank of memory components in a memory module. The address-type signals (A) are connected to all slices of each rank of memory components in a memory module. The address-type signals (A) can usually fan-out to more memory components than can data-type signals for several reasons including: [1] the signaling rate of address-type signals (A) is typically lower than data-type signals, and [2] address-type signals (A) are typically unidirectional (flowing from memory controller to memory components) and data-type signals (QD) are typically bi-directional (flowing in one direction at one time and flowing in the opposite direction at another time).

In addition to memory components (MEM) 174, each memory module 160 and 172 also contains some form of termination structure (T) 176 at the end of each signal wire. This is typically some sort of resistor component, and is typically required due to high signaling rates in a memory system.

Each memory component (MEM) 174 has two data bus ports denoted QDx and QDy. These ports are operated in two different modes. In a first mode, some of the storage locations in the memory component (MEM) 174 are accessible through a QDx data bus formed on the memory modules 160 and 172, and the remaining storage locations in the memory component (MEM) 174 are accessible through a QDy data bus formed on the memory modules 160 and 172. In a second mode, all the storage locations in the memory component (MEM) 174 are accessible through the QDx data bus, and the QDy data bus is unused.

Typically, in the first mode, exactly half of the storage locations in the memory component (MEM) 174 are accessible through a QDx data bus formed on the memory modules 160 and 172, and the other half of the storage locations in the memory component (MEM) 174 are accessible through a QDy data bus formed on the memory modules 160 and 172.

Thus, in the asymmetric port memory system 150 of FIG. 6A, wherein the first memory module 160 is connected to both the first port (Port 1*a*) 154 and the second port (Port 1*b*) 156 of the memory controller 152 through the QDx data bus and the QDy data bus, respectively, the memory components (MEM) 174 in the first memory module 160 are operated in the first mode with half of the storage locations in the memory components (MEM) 174 accessible through the QDx data bus and the other half of the storage locations in the memory component (MEM) 174 accessible through the QDy data bus. It should be noted, however, that the memory components (MEM) 174 in the first memory module 160 may also be operated in the second mode with all of the storage locations accessible through the QDx data bus, and the QDy data bus is unused.

The asymmetric port memory system 170 of FIG. 6B is similar to the asymmetric port memory system 150 of FIG. 6A in that the first memory module 160 is connected to both the first port (Port 1*a*) 154 and the second port (Port 1*b*) 156 of the memory controller 152 through the QDx data bus and the QDy data bus, respectively. Thus, the memory components (MEM) 174 in the first memory module 160 in the asymmetric port memory system 170 of FIG. 6B may be configured similarly to the memory components (MEM) 174 in the first memory module 160 in the asymmetric port memory system 150 of FIG. 6A. That is, the memory components (MEM) 174 in the first memory module 160 in the asymmetric port memory system 170 of FIG. 6B are operated in the first mode with half of the storage locations in the memory components (MEM) 174 accessible through the QDx data bus and the other half of the storage locations in the memory component (MEM) 174 accessible through the QDy data bus. However, as with the asymmetric port memory system 150 of FIG. 6A, it should be noted that the memory components (MEM) 174 in the first memory module 160 in the asymmetric port memory system 170 of FIG. 6B may also be operated in the second mode with all of the storage locations accessible through the QDx data bus, and the QDy data bus is unused.

The asymmetric port memory system 170 of FIG. 6B differs from the asymmetric port memory system 150 of FIG. 6A in that the asymmetric port memory system 170 of FIG. 6B has the second memory module 172 connected to the third port (Port 2) 158 of the memory controller 152 through the QDx data bus. Thus, the memory components (MEM) 174 in the second memory module 172 are operated in the second mode with all of the storage locations accessible through the QDx data bus, and the QDy data bus is unused.

Figure 7:
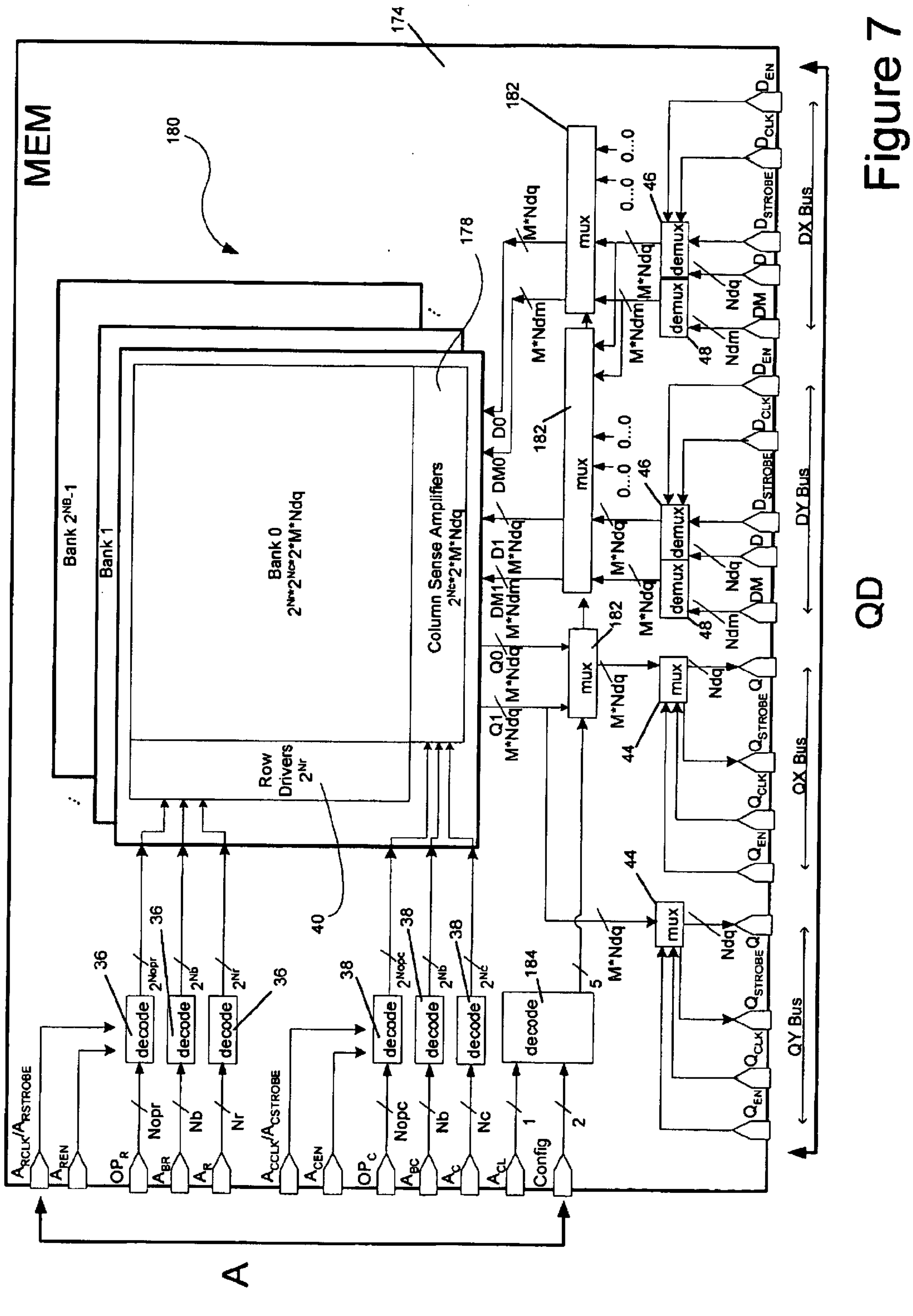
FIG. 7 shows the internal detail of the memory component (MEM) that is used in the memory modules of FIG. 6.

Referring to FIG. 7, the internal detail of the memory component (MEM) 174 is shown in accordance with the present invention. The memory component (MEM) 174 is actually a modified version of the memory component (MEM) 32 shown in FIG. 2, thus common reference designators are used where applicable. For example, similar to the memory component (MEM) 32 of FIG. 2, the memory component (MEM) 174 of FIG. 7 includes row decode blocks 36, column decode blocks 38, row drivers 40, multiplexers 44, and demultiplexers 46 and 48.

Figure 2:
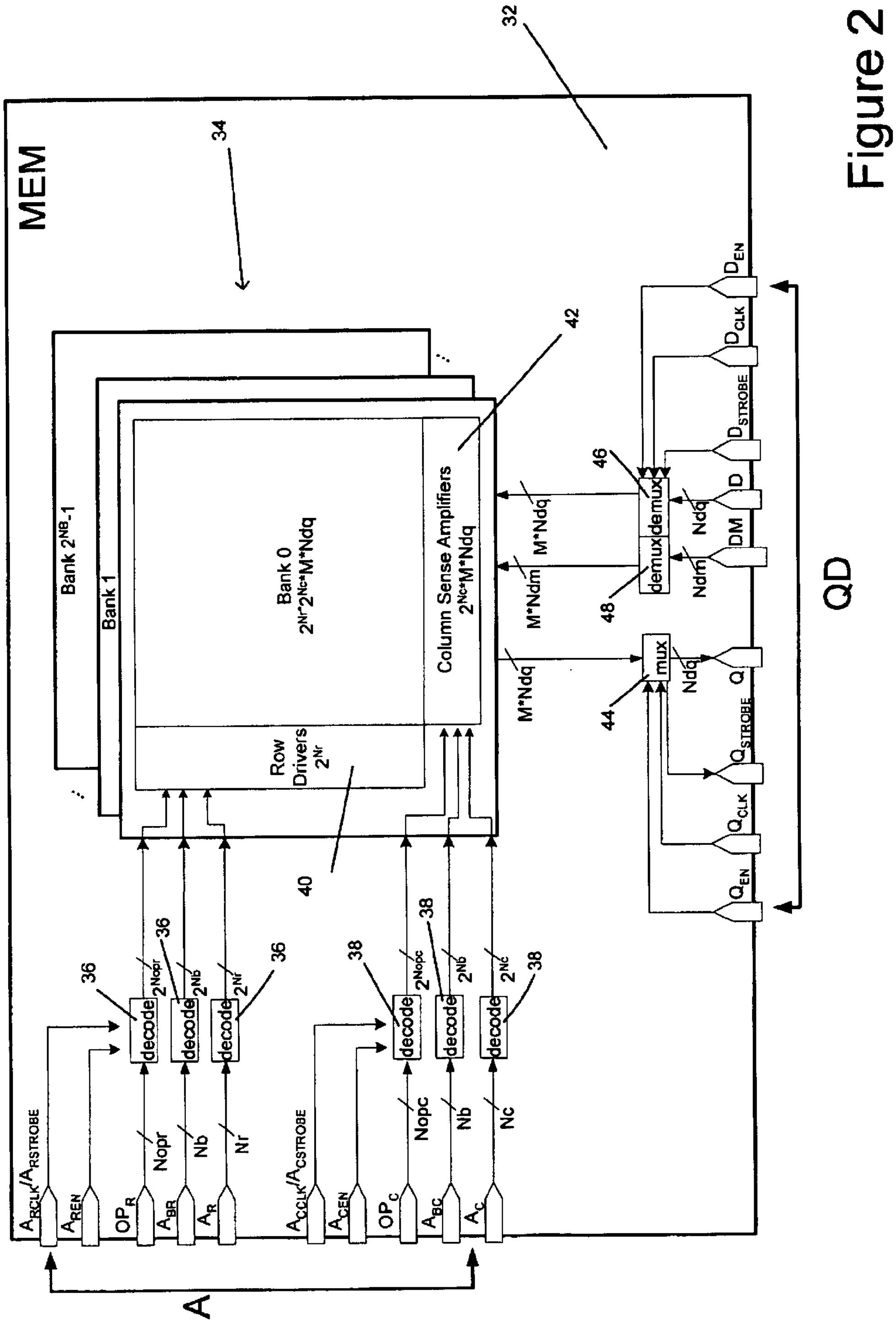
FIG. 2 shows the internal detail of the memory component (MEM) that is used in the memory modules of FIG. 1.
Figure 3A:
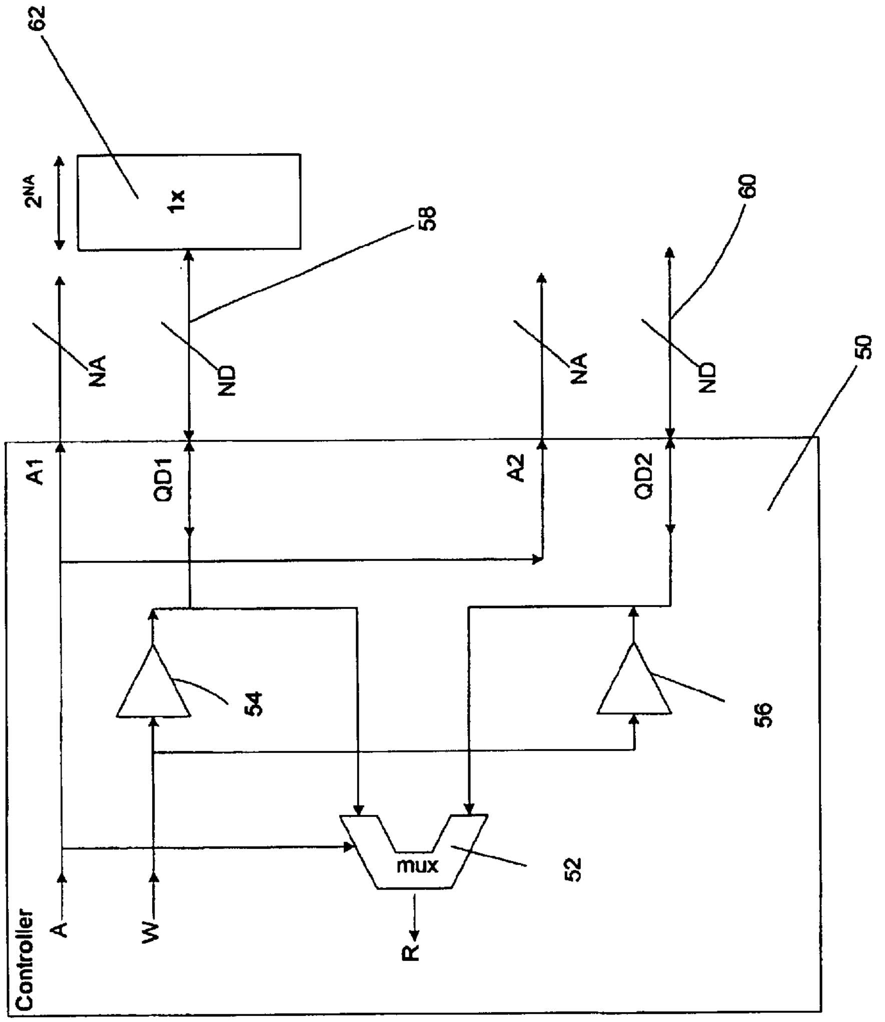
FIG. 3A illustrates an exclusive port-per-module memory system having a first memory module of memory capacity "1x" only.
Figure 3B:
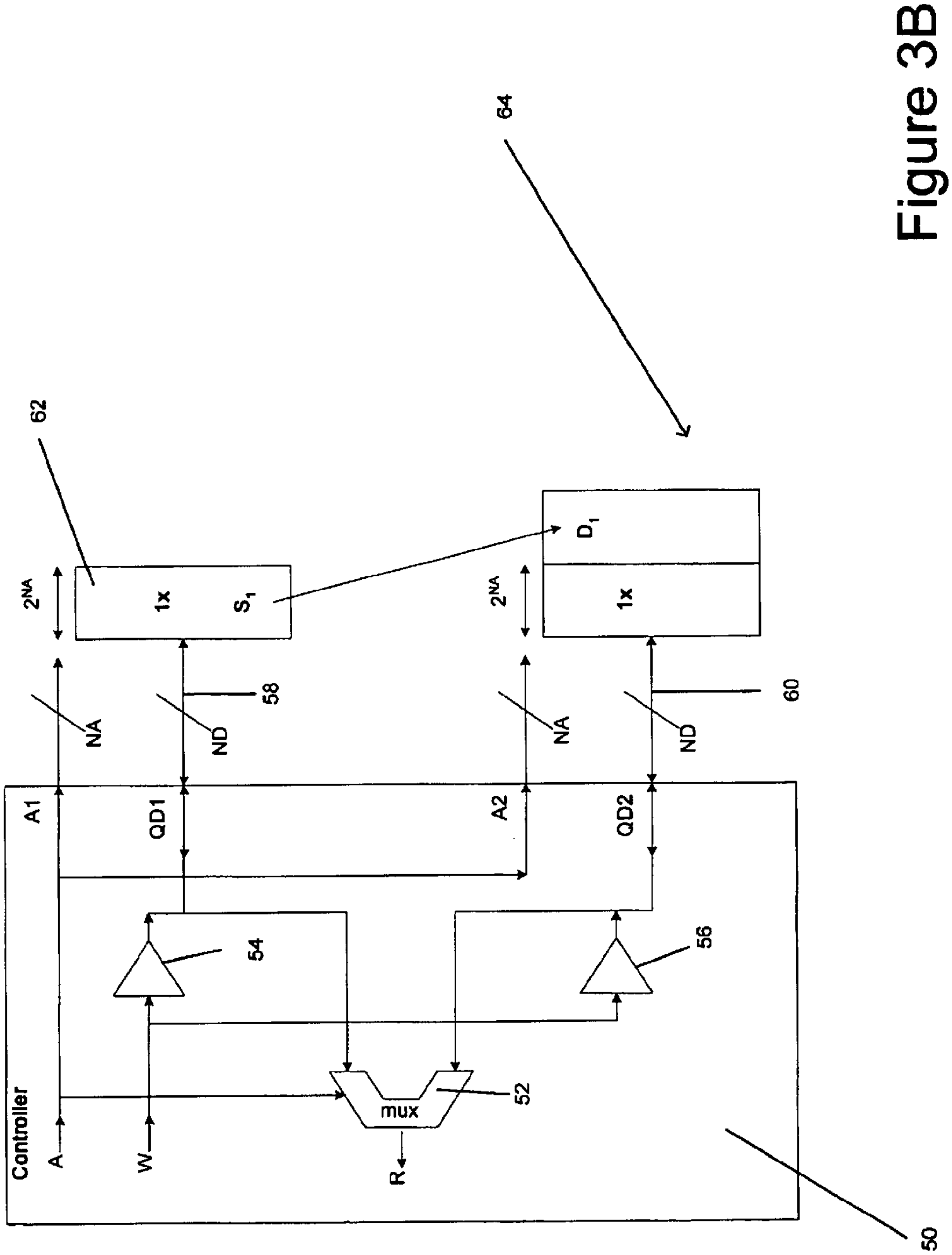
FIG. 3B illustrates an exclusive port-per-module memory system having a first memory module and a second memory module with memory capacities of "1x"/"1x", respectively.
Figure 3C:
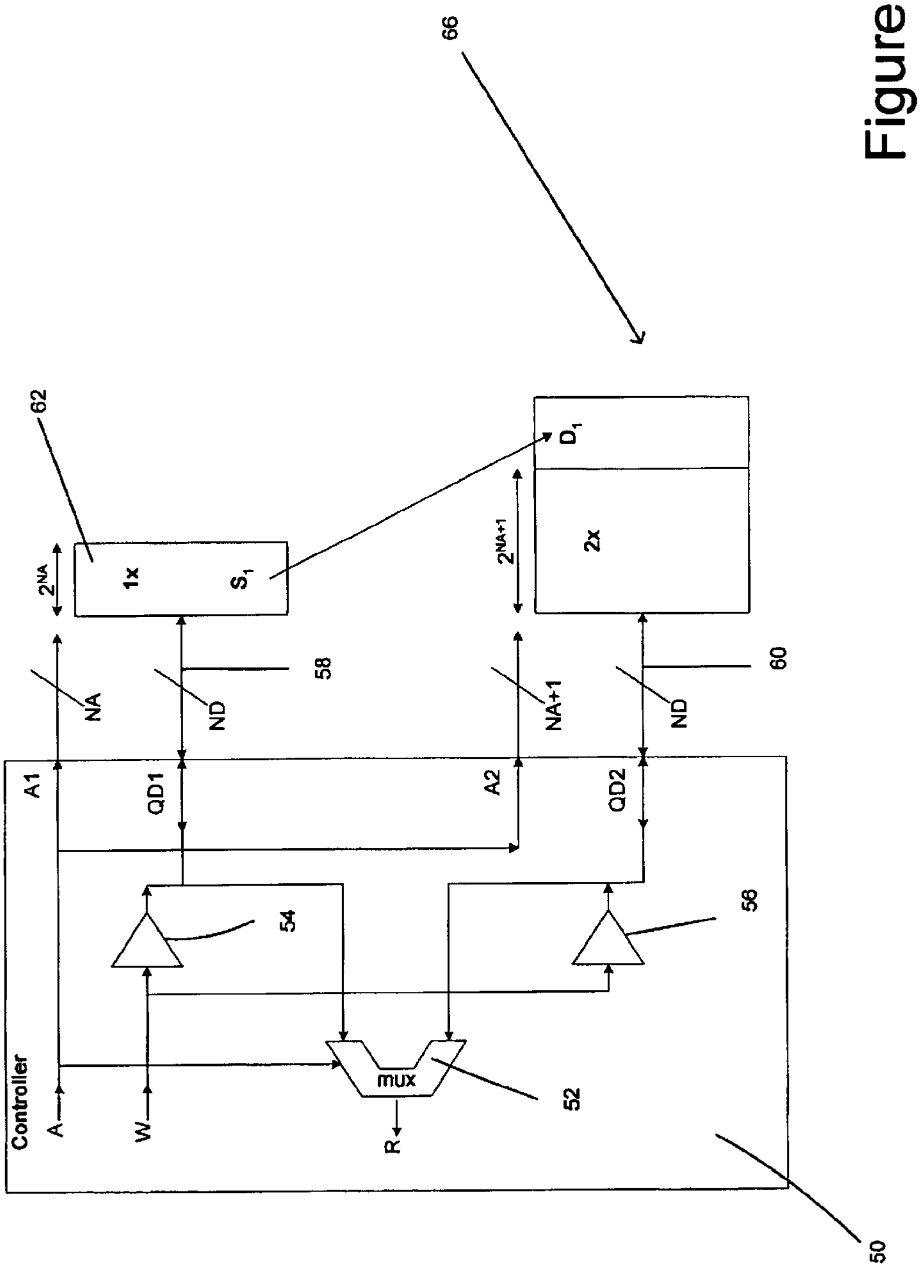
FIG. 3C illustrates an exclusive port-per-module memory system having a first memory module and a second memory module with memory capacities of "1x"/"2x", respectively.
Figure 3D:
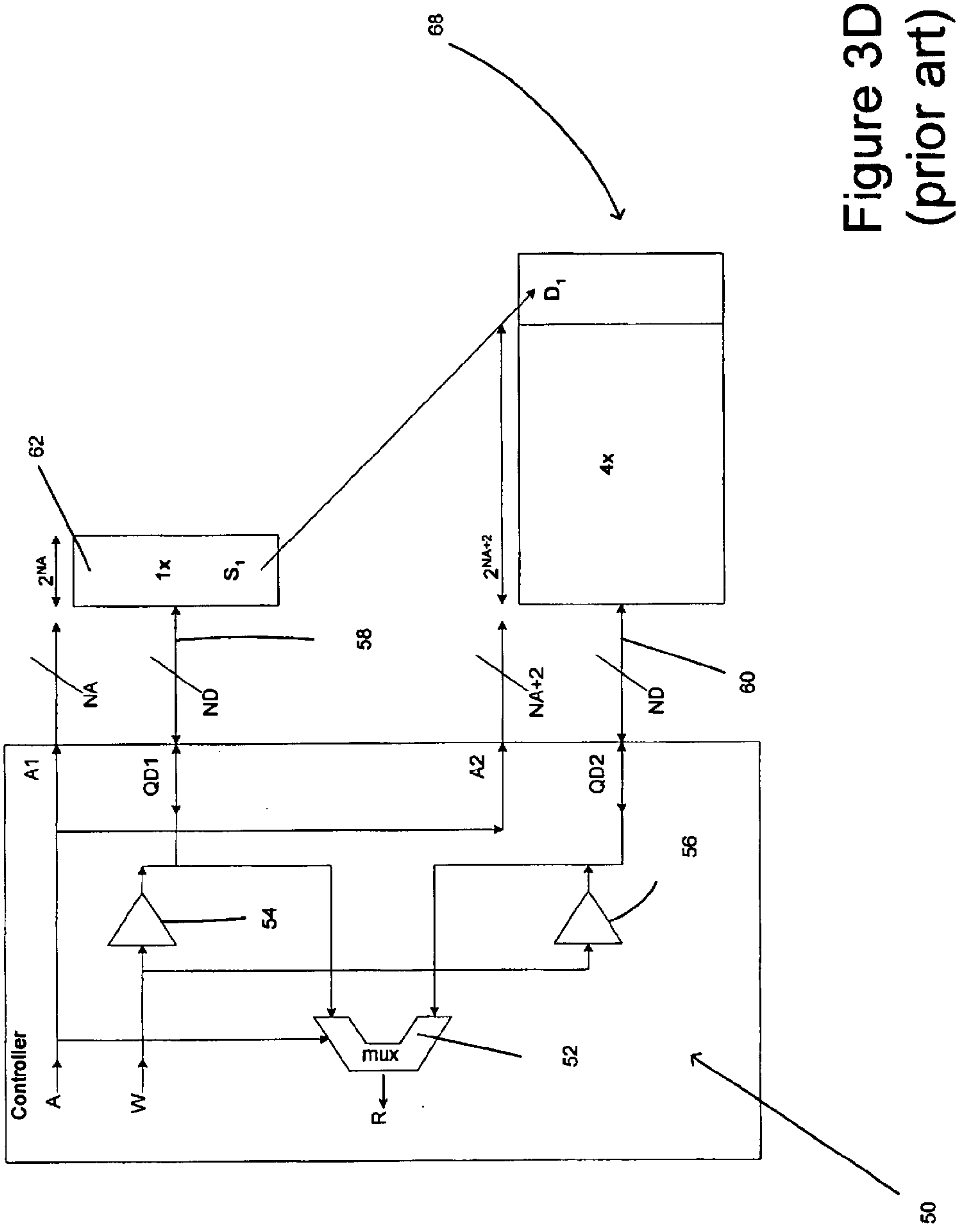
FIG. 3D illustrates an exclusive port-per-module memory system having a first memory module and a second memory module with memory capacities of "1x"/"4x", respectively.
Figure 3E:
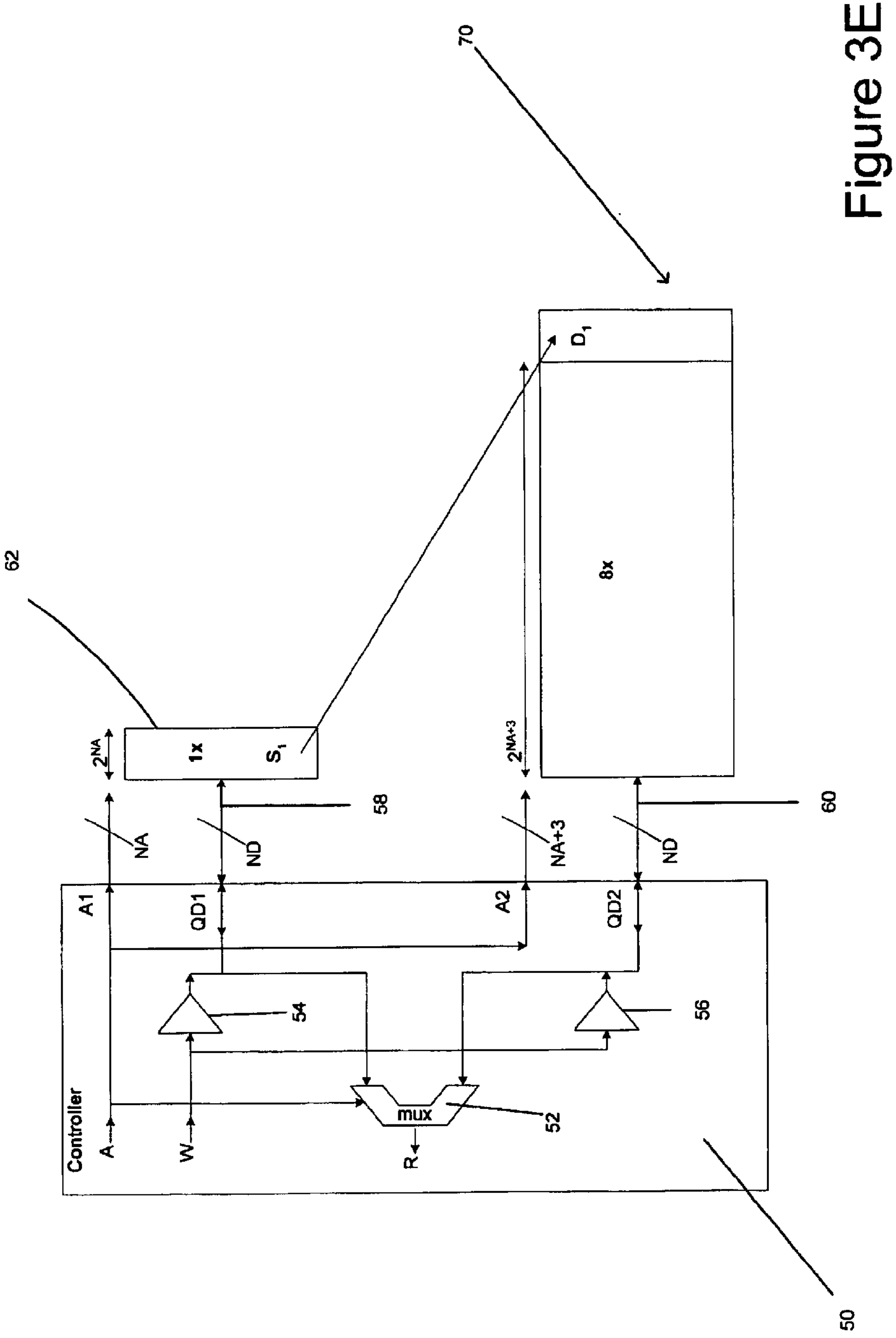
FIG. 3E illustrates an exclusive port-per-module memory system having a first memory module and a second memory module with memory capacities of "1x"/"8x", respectively.
Figure 4A:
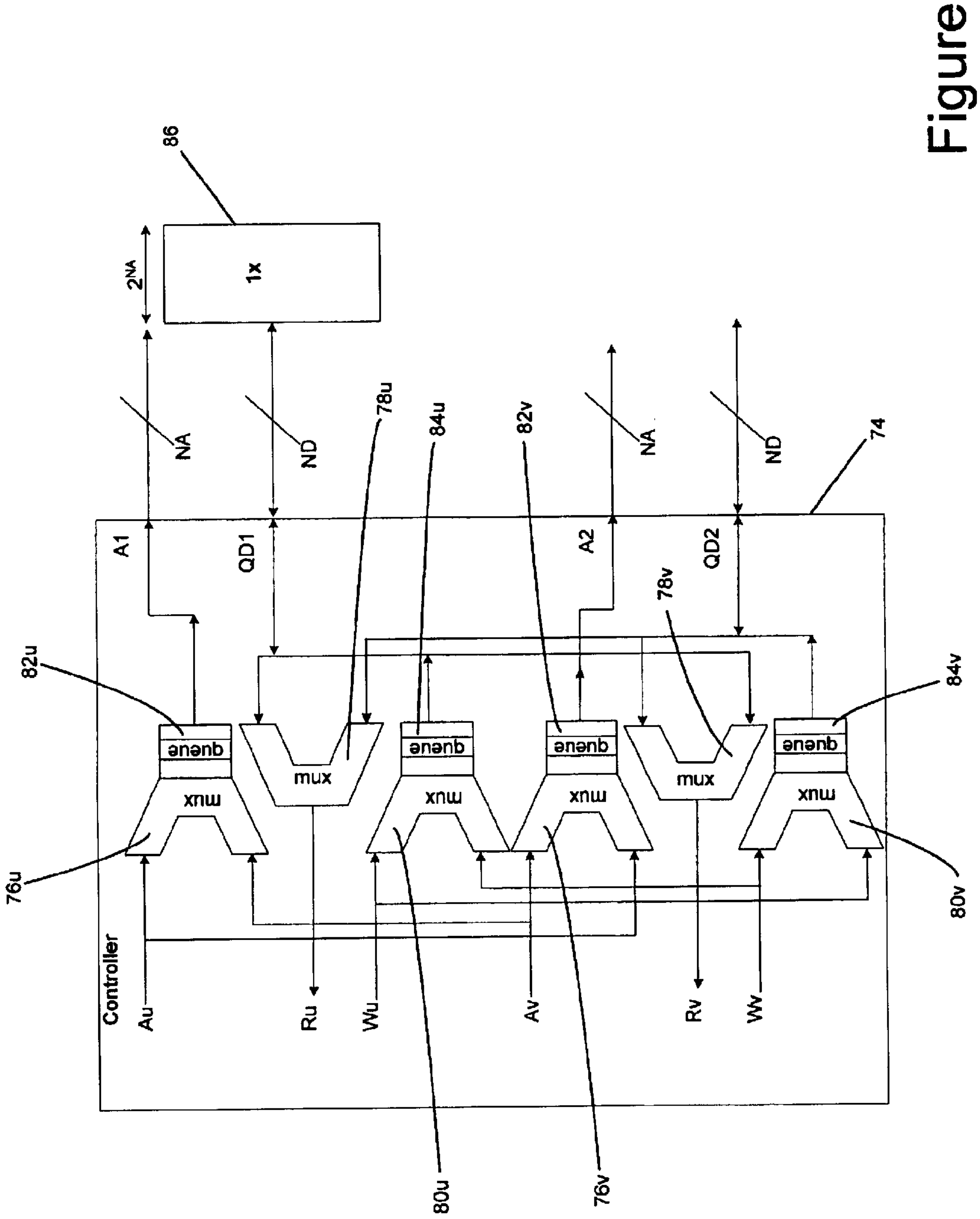
FIG. 4A illustrates an independent port-per-module memory system having a first memory module of memory capacity "1x" only.
Figure 4B:
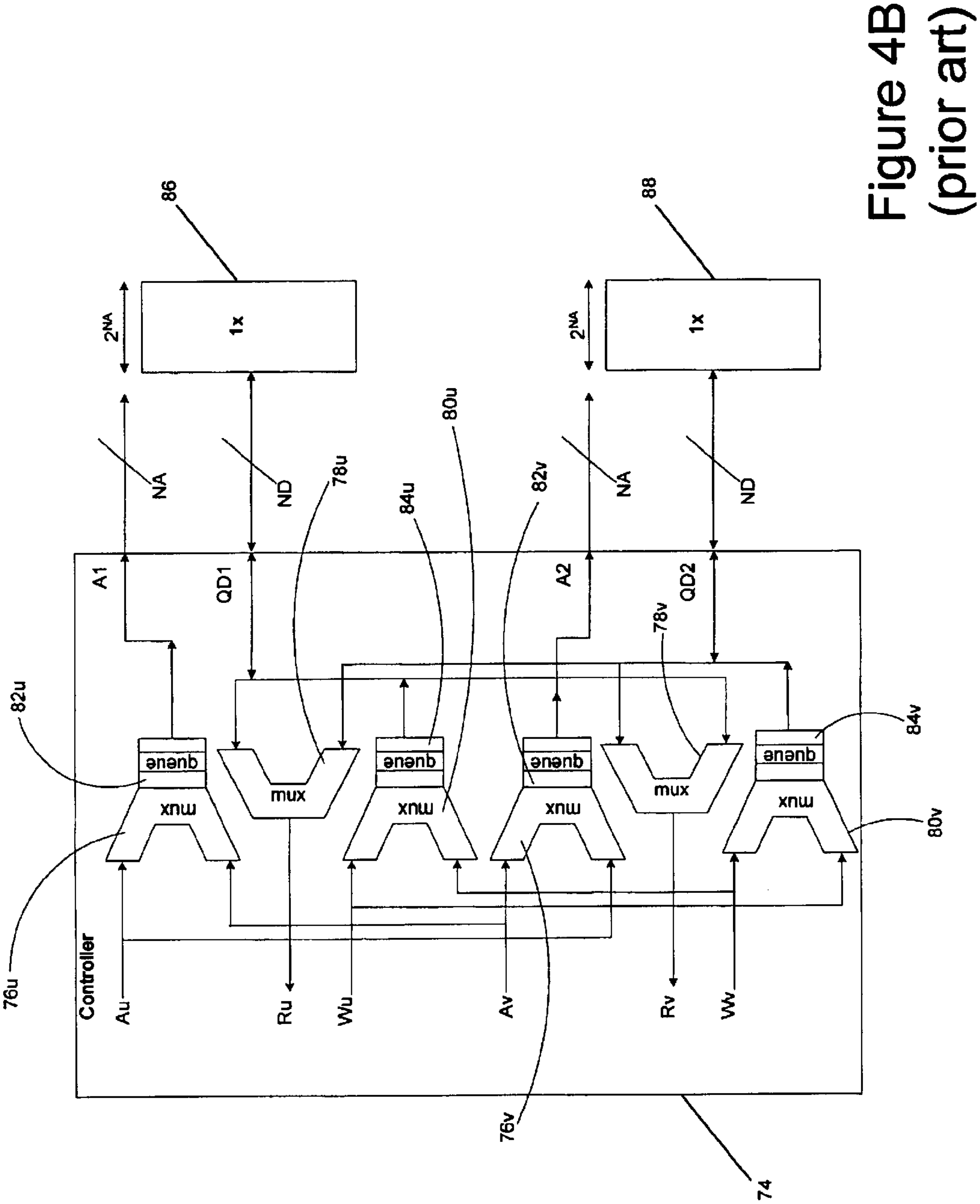
FIG. 4B illustrates an independent port-per-module memory system having a first memory module and a second memory module with memory capacities of "1x"/"1x", respectively.
Figure 4C:
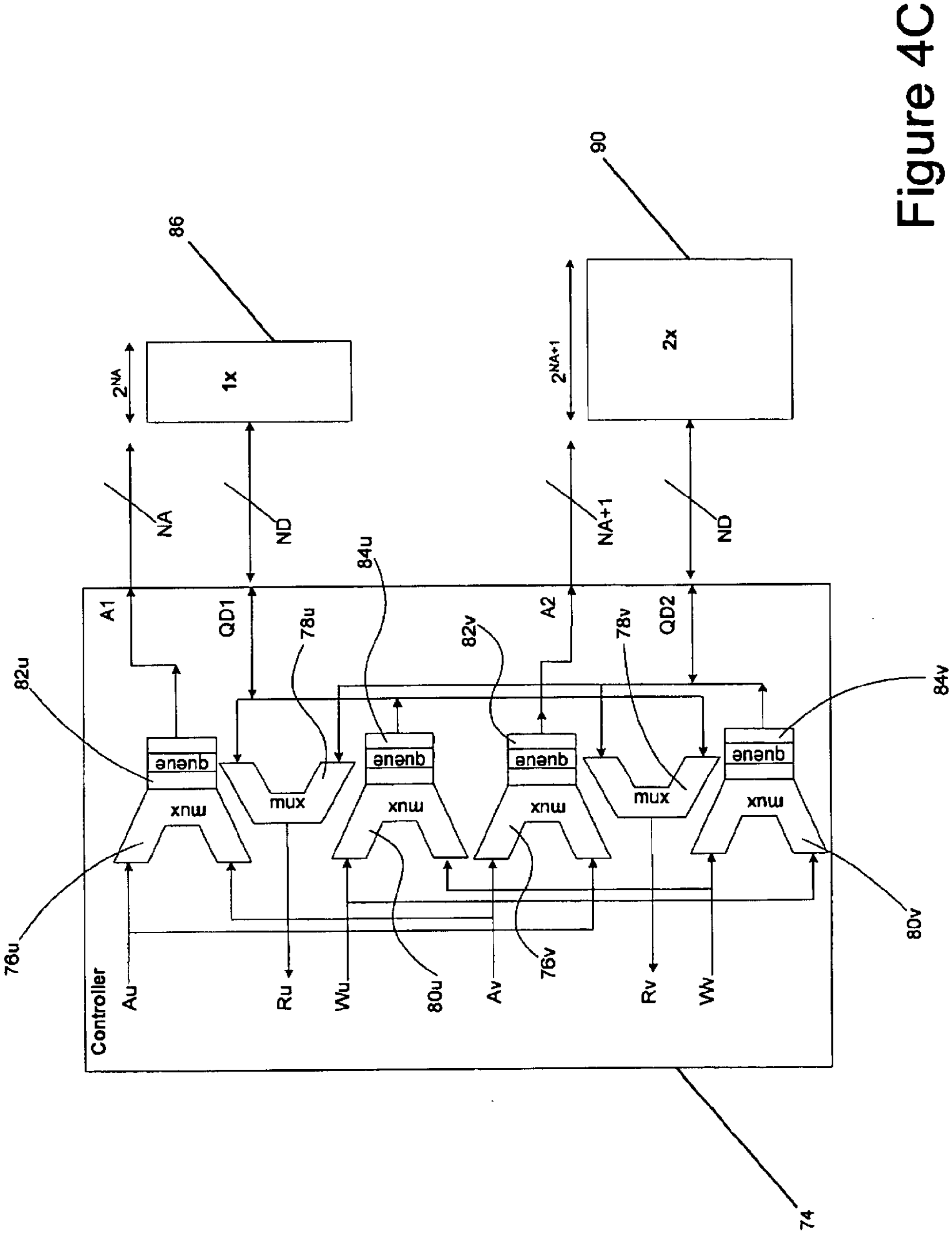
FIG. 4C illustrates an independent port-per-module memory system having a first memory module and a second memory module with memory capacities of "1x"/"2x", respectively.
Figure 4D:
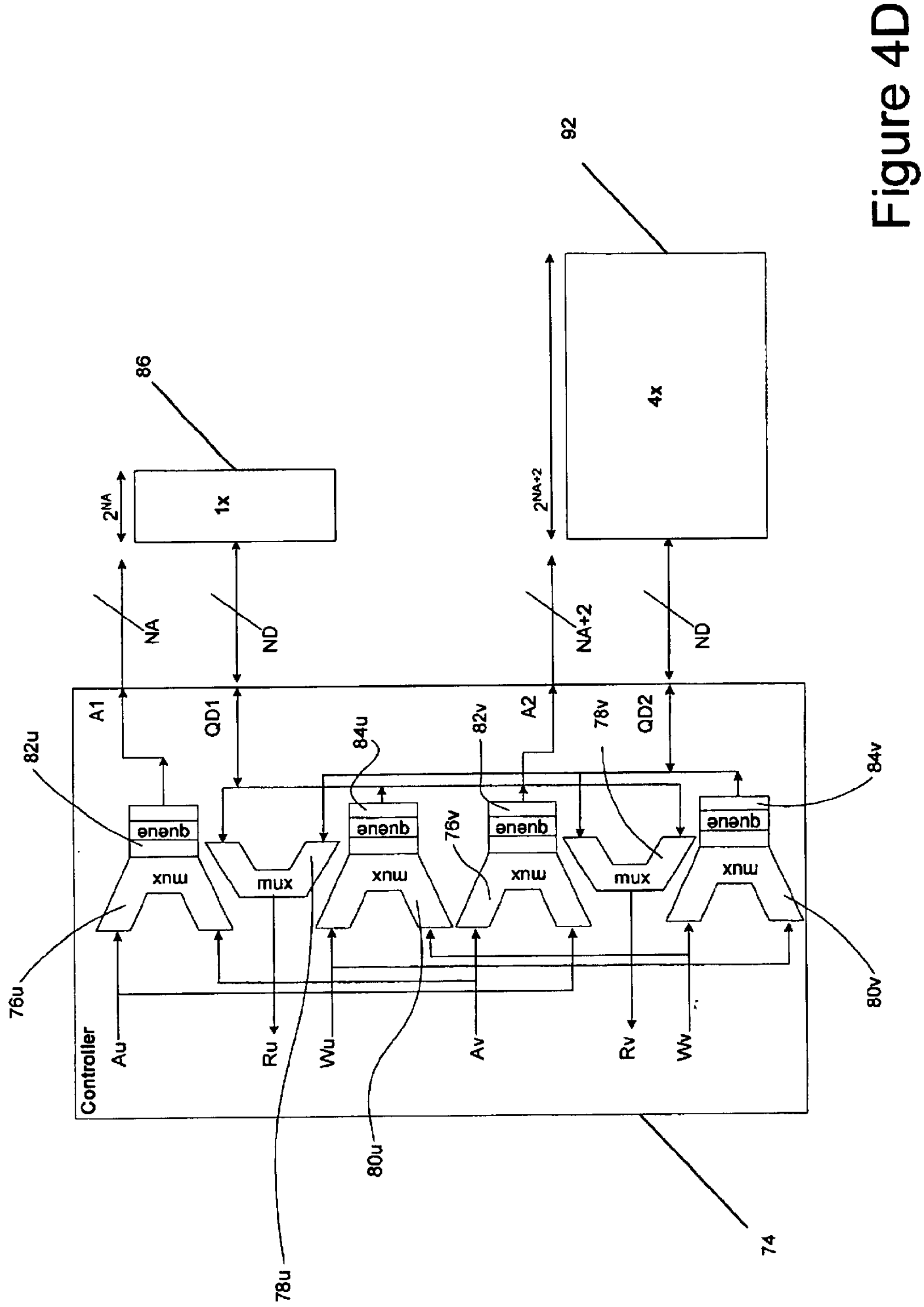
FIG. 4D illustrates an independent port-per-module memory system having a first memory module and a second memory module with memory capacities of "1x"/"4x", respectively.
Figure 4E:
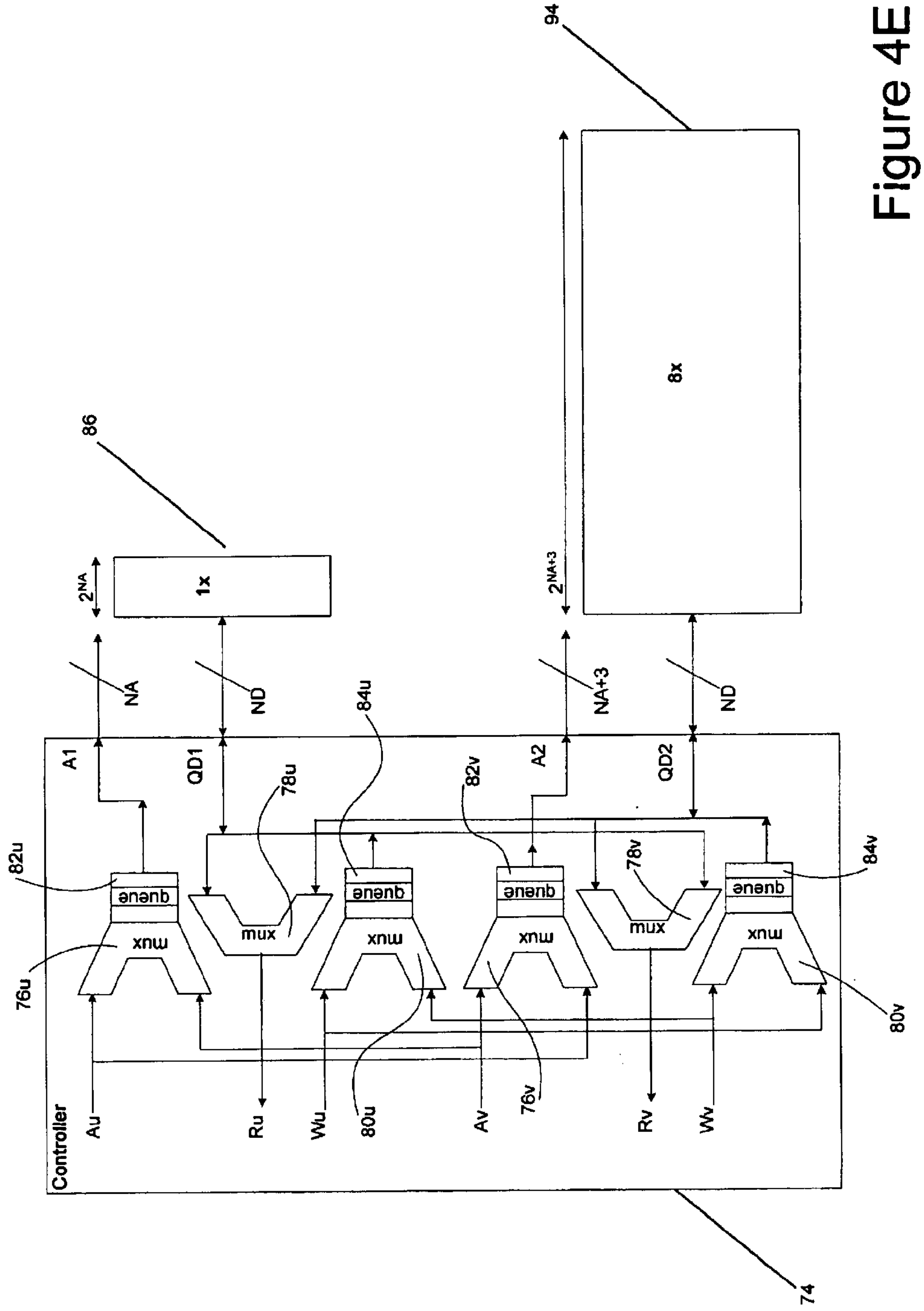
FIG. 4*e* illustrates an independent port-per-module memory system having a first memory module and a second memory module with memory capacities of "1x"/"8x", respectively.
Figure 5A:
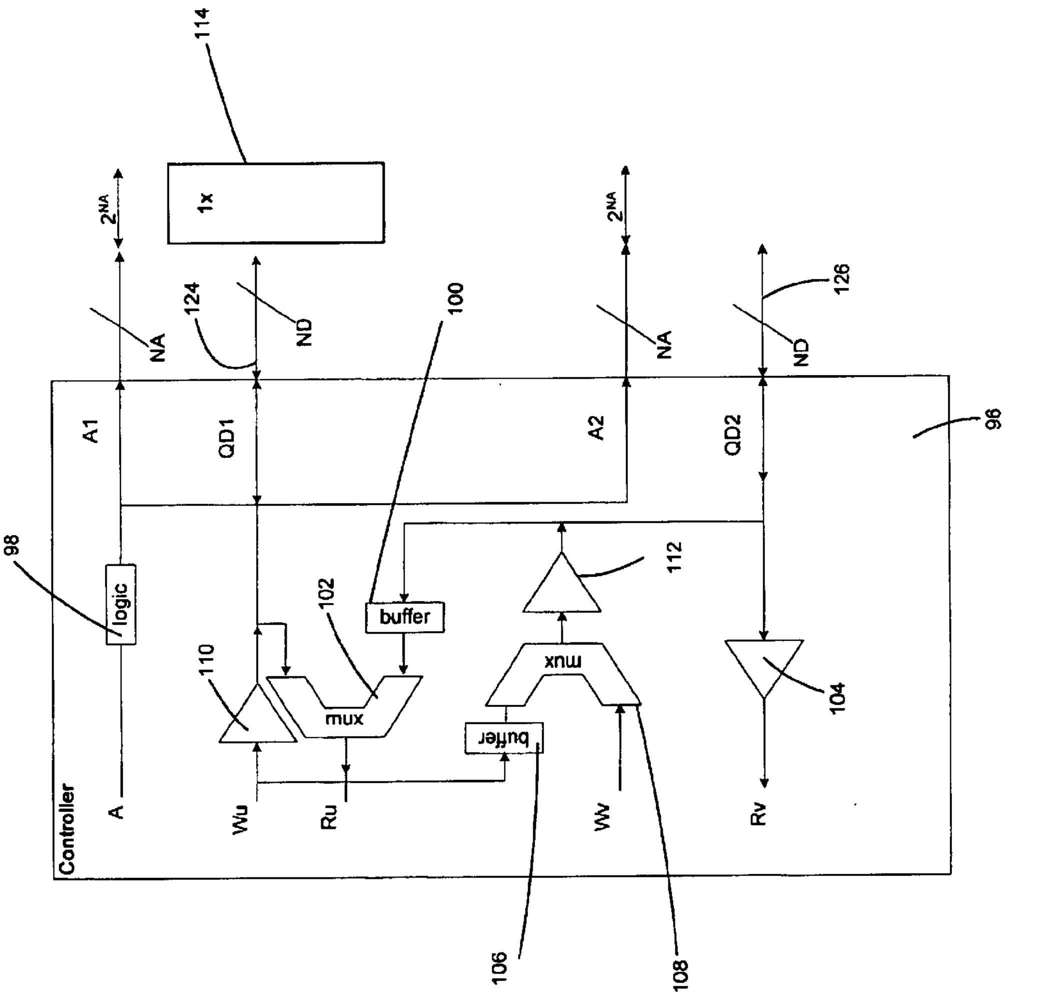
FIG. 5A illustrates a lockstep port-per-module memory system having a first memory module of memory capacity "1x" only.
Figure 5B:
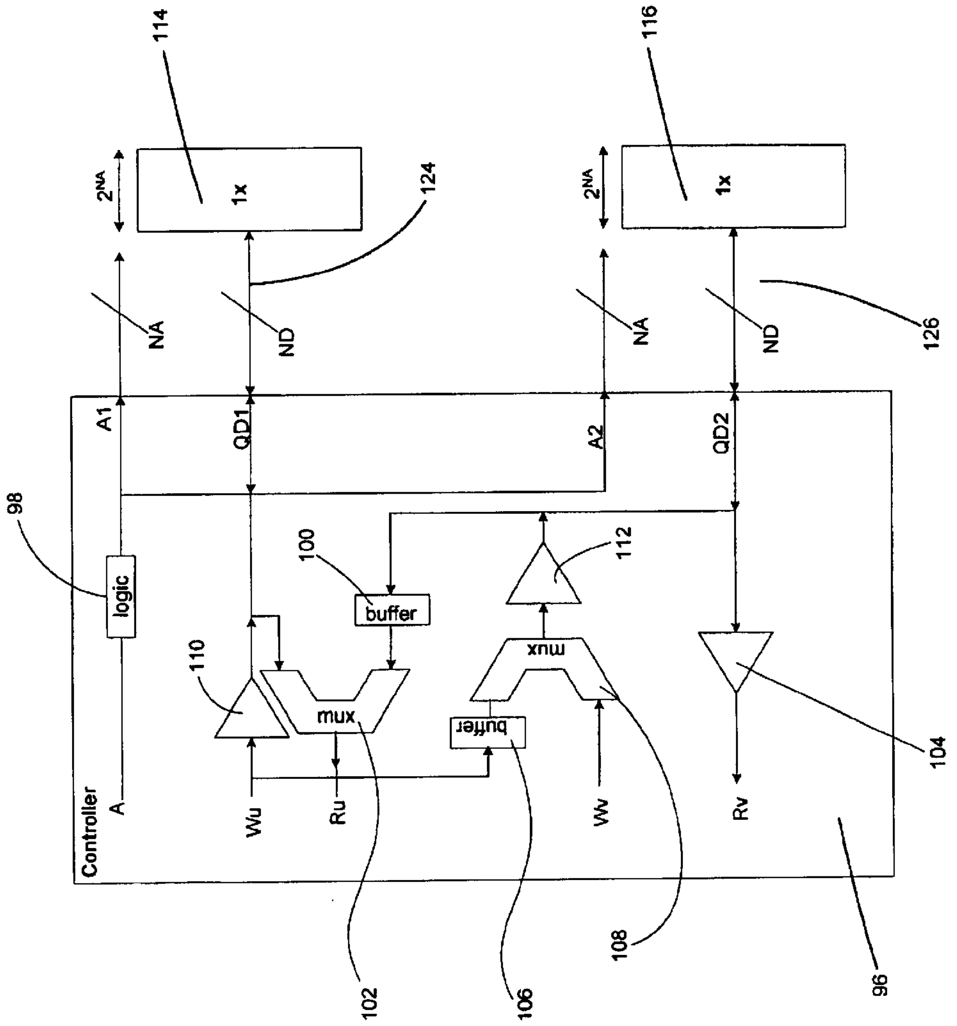
FIG. 5B illustrates a lockstep port-per-module memory system having a first memory module and a second memory module with memory capacities of "1x"/"1x", respectively.
Figure 5C:
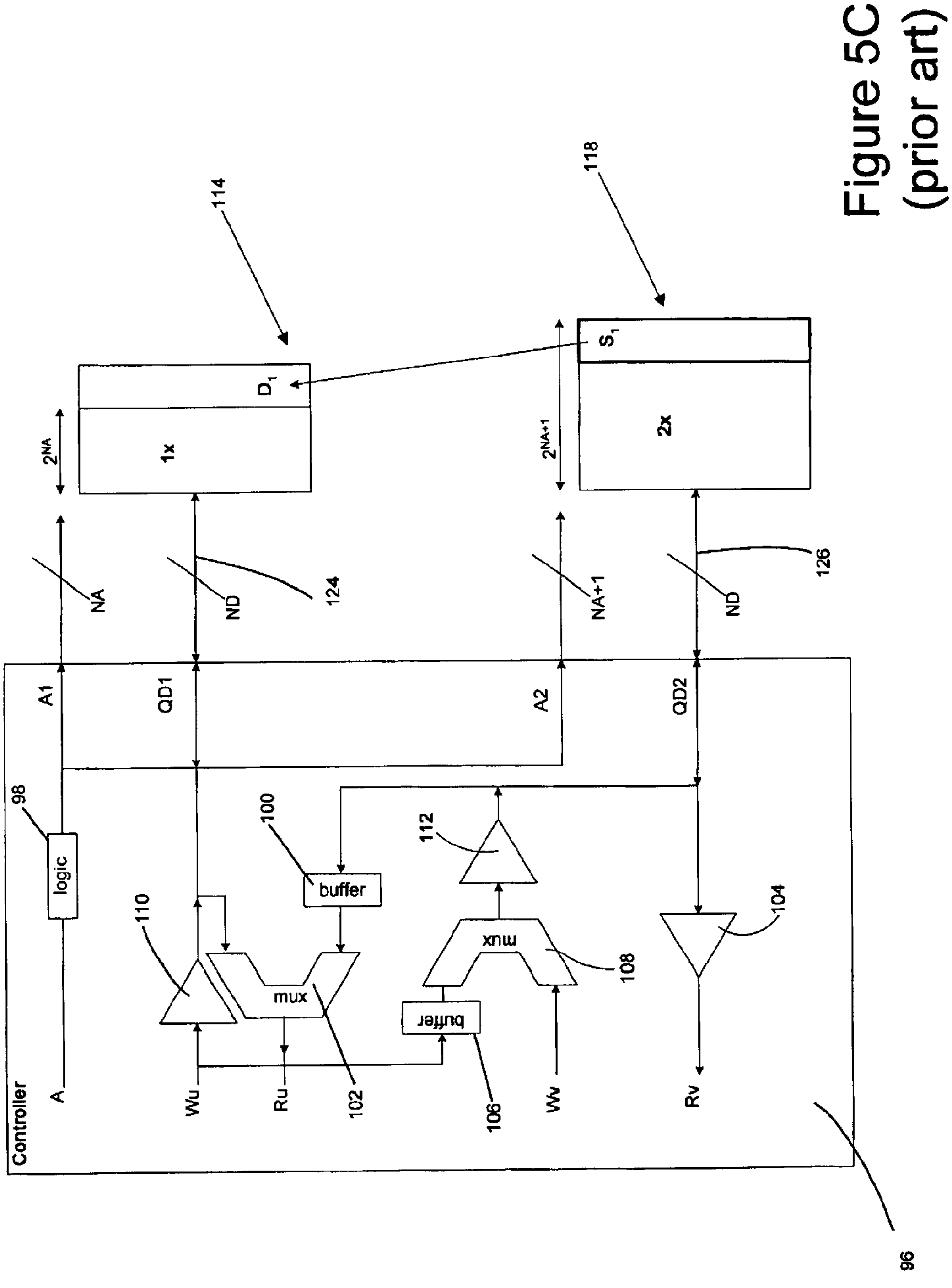
FIG. 5C illustrates a lockstep port-per-module memory system having a first memory module and a second memory module with memory capacities of "1x"/"2x", respectively.
Figure 5D:
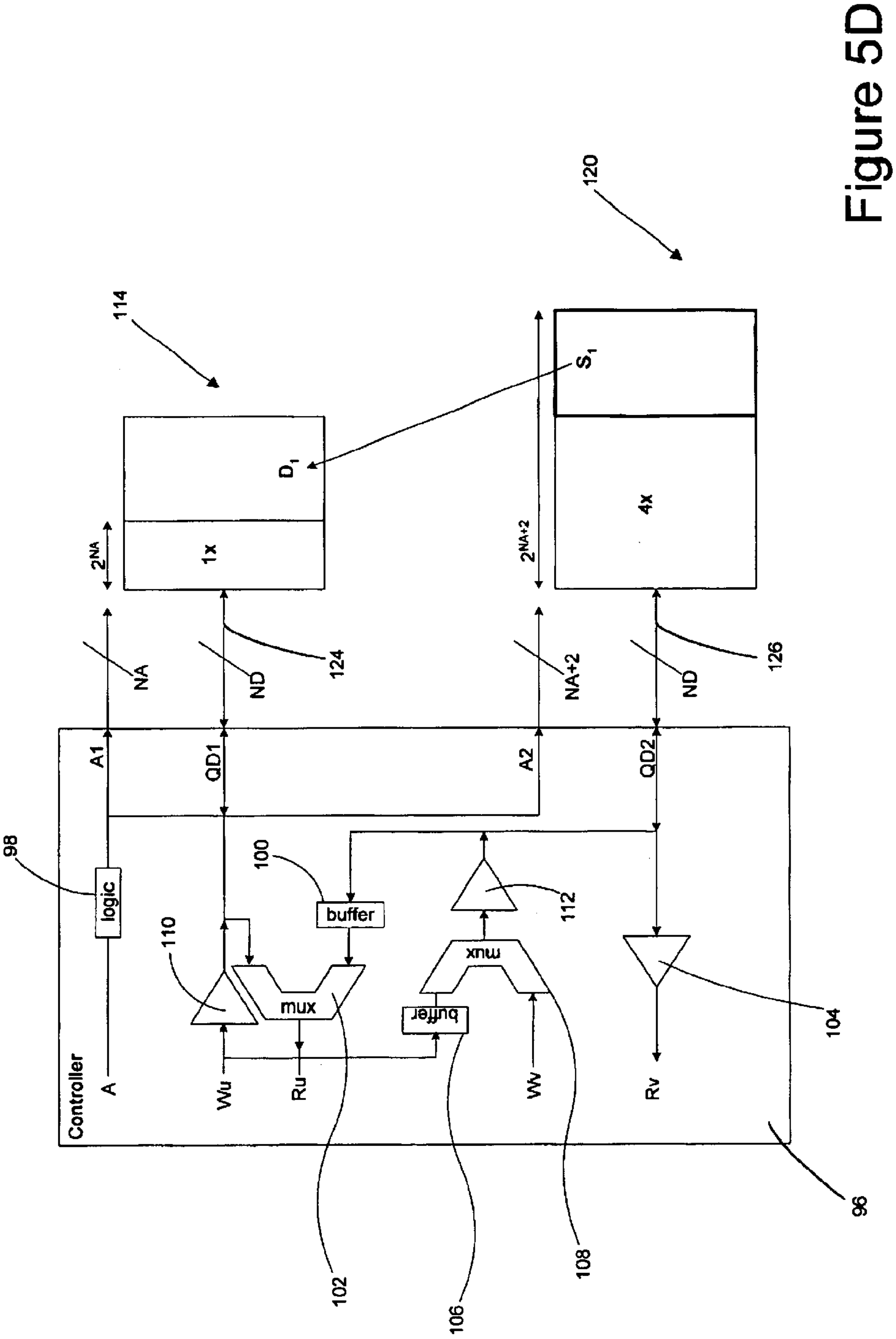
FIG. 5D illustrates a lockstep port-per-module memory system having a first memory module and a second memory module with memory capacities of "1x"/"4x", respectively.
Figure 5E:
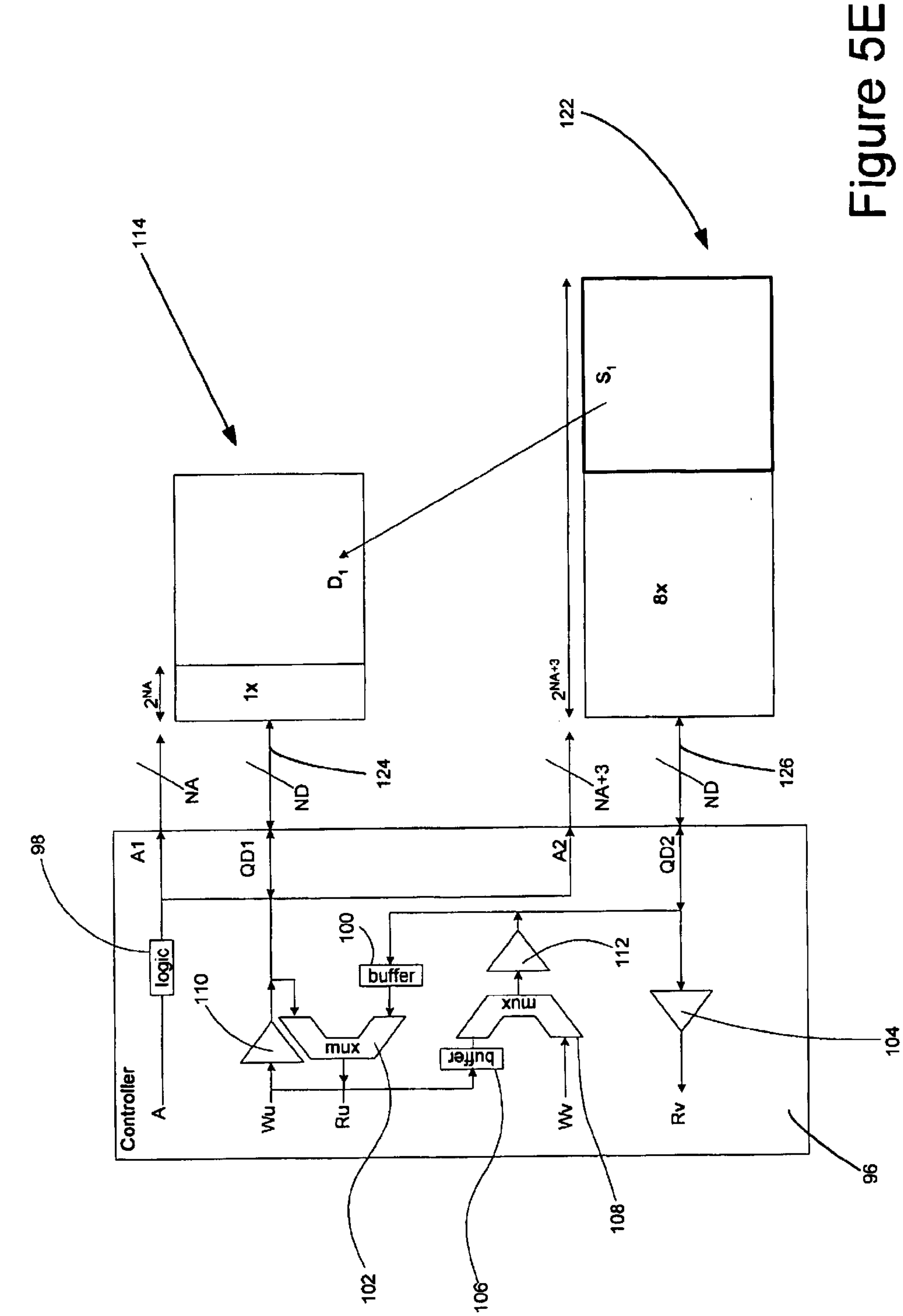
FIG. 5E illustrates a lockstep port-per-module memory system having a first memory module and a second memory module with memory capacities of "1x"/"8x", respectively.

The memory component (MEM) 32 of FIG. 2 is modified in several aspects to allow the memory component (MEM) 174 of FIG. 7 to be used in the asymmetric port memory systems 150 and 170 of FIGS. 6A and 6B. First, the definition of "Nc" is changed so that twice as many bits are accessed from column sense amplifiers 178 in a column operation (read or write). This is accomplished by changing the size of a bank of memory core 180 from "$2^{Nr}*2^{Nc'}*$M*Ndq" to "$2^{Nr}*2^{Nc}*2*$M*Ndq", wherein Nc'=Nc+1.

Also, there are two sets of read and write data buses labeled "Q1", "Q0", "D1", and "D0", each "M*Ndq" bits in width. There are also two sets of mask buses labeled "DM1" and "DM0", each "M*Ndm" bits in width.

Furthermore, there are three multiplexers 182 which allow the read and write data buses and mask buses to be steered to and from external buses "QY", "QX", "DY", and "DX", which include external read and write data buses that are "Ndq" bits in width and external mask buses that are "Ndm" bits in width. It should be noted that the external read and write data buses and the external mask buses may be combined into sets of bi-directional data buses, including corresponding unidirectional mask buses. These buses are shown separately in FIG. 7 for purposes of descriptive clarity, but are shown combined together in the asymmetric port memory systems 150 and 170 of FIGS. 6A and 6B.

The three multiplexers 182 are controlled by the $A_{CL}$ and the Config signals. The $A_{CL}$ signal serves as a low-order column address bit, since the number of $A_C$ signals have been reduced by one (i.e., Nc=Nc'−1). The Config signals indicate which mode the memory component (MEM) 174 is to be operated in (i.e., whether both the QDX and QDY ports are used or just the QDX port is used). The $A_{CL}$ signal and the Config signals are decoded by a decoder 184. The table of FIG. 10 shows how the $A_{CL}$ signal and the Config signals are used to control access to the memory component (MEM) 174. That is, how the Q1 and Q0 buses are steered to the QY and QX buses, and how the DY and DX buses are steered to the D1 and D0 buses.

It is important to note that the memory component (MEM) 174 uses a single-port memory core 180. That is, the memory core 180 is only capable of performing a single column access (read or write transfer) at a time. However, the accesses to/from the memory component (MEM) 174 of FIG. 7 are potentially twice as wide as the accesses to/from the memory component (MEM) 32 of FIG. 2. The multiplexers 182 and the decode logic 184 that is added between the memory core 180 and the memory interface logic 44–48 is all that is needed to allow the memory component (MEM) 174 to be configurable in the different modes described above with reference to the asymmetric port memory systems 150 and 170 of FIGS. 6A and 6B.

It is also important to note that each memory component (MEM) 174 must be able to provide access to some storage locations from two different sets of data pins. This is accomplished by adding the multiplexers 182 and the decode logic 184 between the memory core 180 and the memory interface logic 44–48, as previously described. However, the multiplexers 182 and the decode logic 184 could also be (alternatively) added to the memory modules, thereby allowing standard memory components (with a single data bus) to be used.

Referring to FIG. 8, there are shown five examples of asymmetric port memory systems in accordance with the present invention. More particularly, FIG. 8A shows the memory controller 152 with a first memory module 190 of capacity "1x" (similar to the asymmetric port memory system 150 of FIG. 6A); FIG. 8B shows the memory controller 152 with the first memory module 190 and a second memory module 192 with memory capacities of "1x"/"1x", respectively (similar to the asymmetric port memory system 170 of FIG. 6B); FIG. 8C shows the memory controller 152 with a first memory module 194 and the second memory module 192 with memory capacities of "2x"/"1x", respectively (similar to the asymmetric port memory system 170 of FIG. 6B); FIG. 8D shows the memory controller 152 with a first memory module 196 and the second memory module 192 with memory capacities of "4x"/"1x", respectively (similar to the asymmetric port memory system 170 of FIG. 6B); and FIG. 8E shows the memory controller 152 with a first memory module 198 and the second memory module 192 with memory capacities of "8x"/"1x", respectively (similar to the asymmetric port memory system 170 of FIG. 6B).

In each example, the memory controller 152 comprises a pair of read data multiplexers 200, a write data multiplexer 202, and a pair of write data drivers 204 that steer data on the QD1x, QD1y, and QD2 buses to/from Wx, Rx, Wy, and Ry buses that connect to the rest of the system. The memory controller 152 also comprises address decode logic 206 for controlling access to the memory modules and controlling the states of the multiplexers. The table of FIG. 11 shows the multiplexer path selection scheme for the memory controller 152.

Figure 8A:
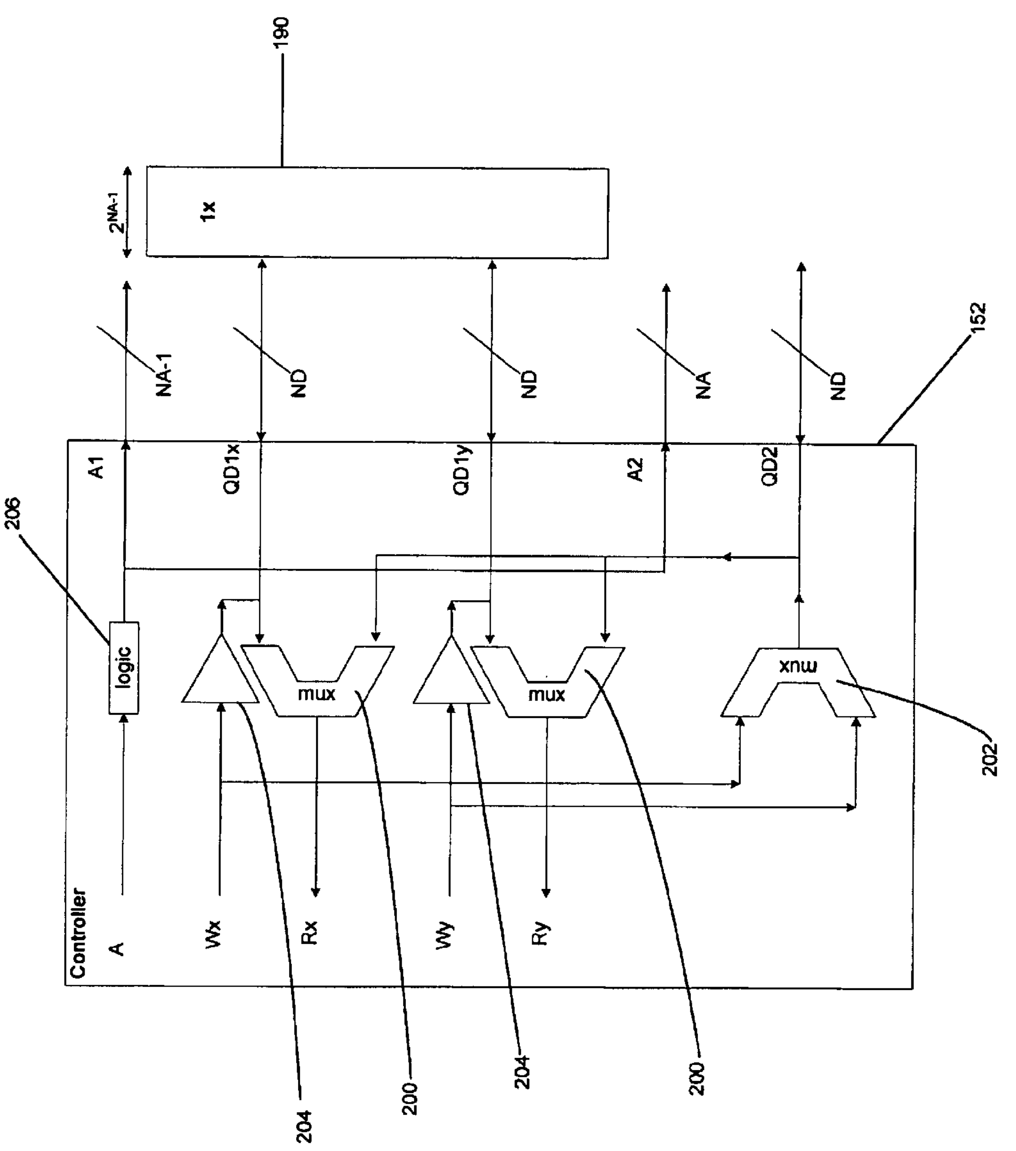
FIG. 8A illustrates an asymmetric port memory system having a memory module of memory capacity "1x" in accordance with the present invention.
Figure 8B:
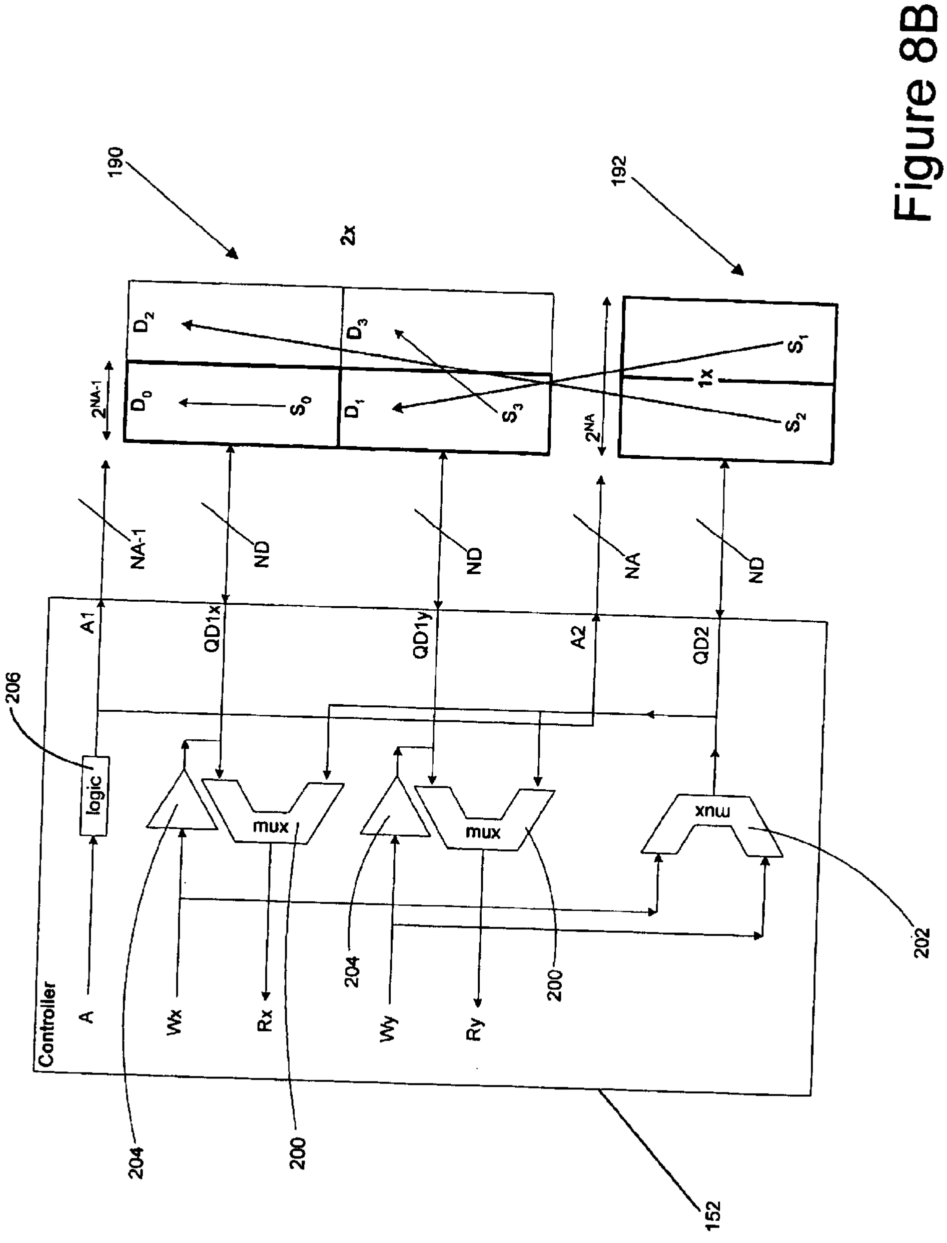
FIG. 8B illustrates an asymmetric port memory system having a first memory module and a second memory module with memory capacities of "1x"/"1x", respectively, in accordance with the present invention.
Figure 8C:
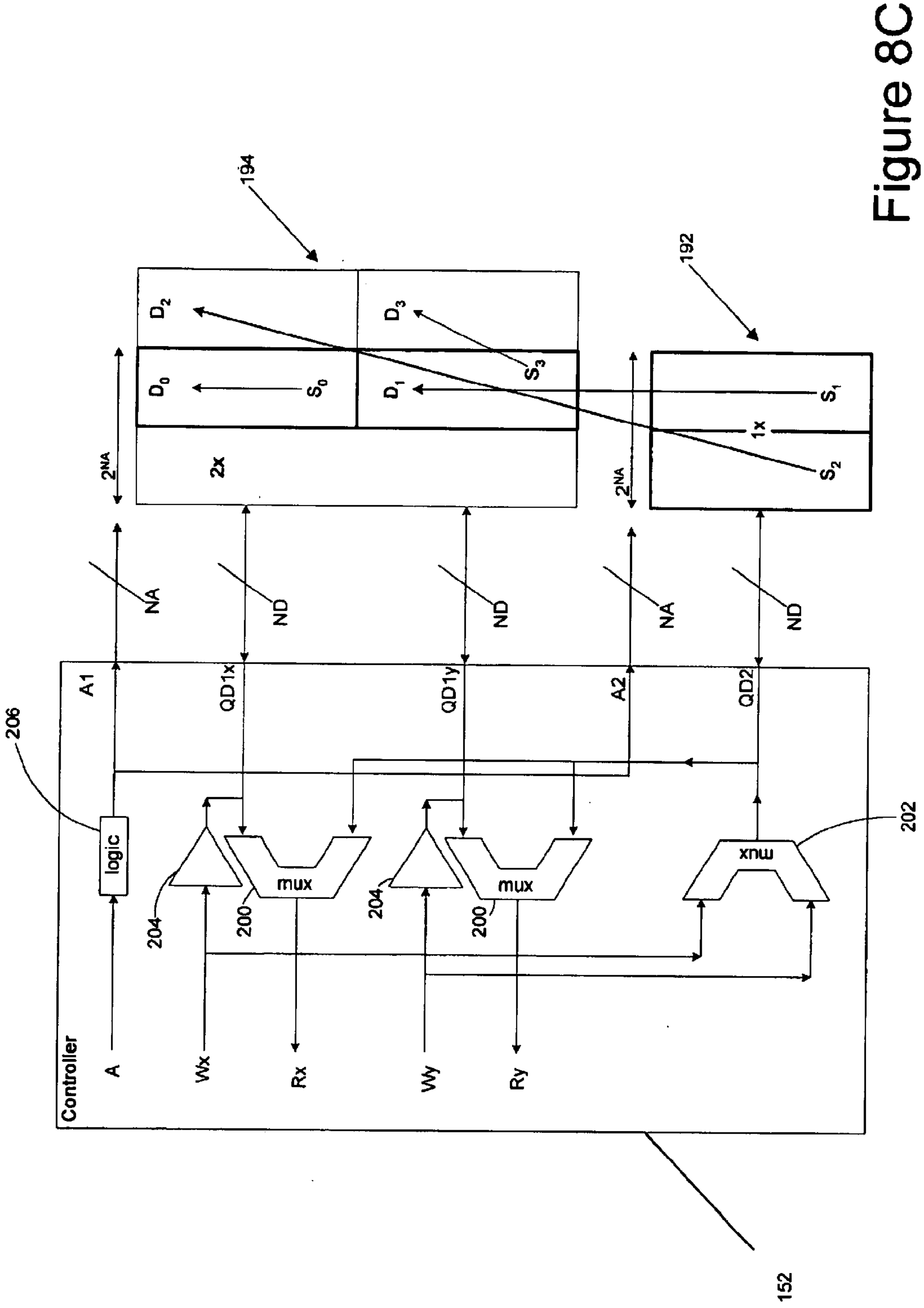
FIG. 8C illustrates an asymmetric port memory system having a first memory module and a second memory module with memory capacities of "2x"/"1x", respectively, in accordance with the present invention.
Figure 8D:
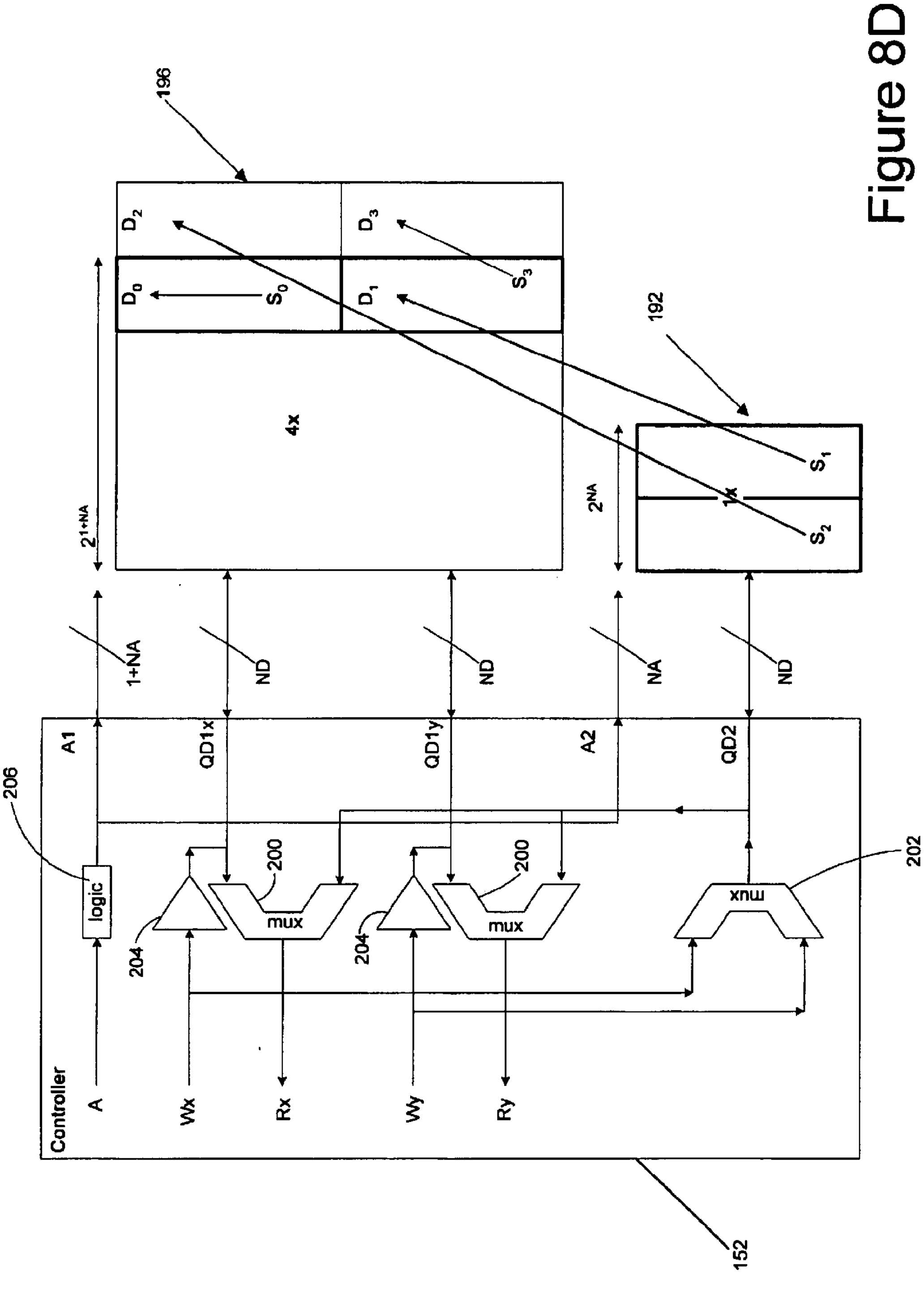
FIG. 8D illustrates an asymmetric port memory system having a first memory module and a second memory module with memory capacities of "4x"/"1x", respectively, in accordance with the present invention.
Figure 8E:
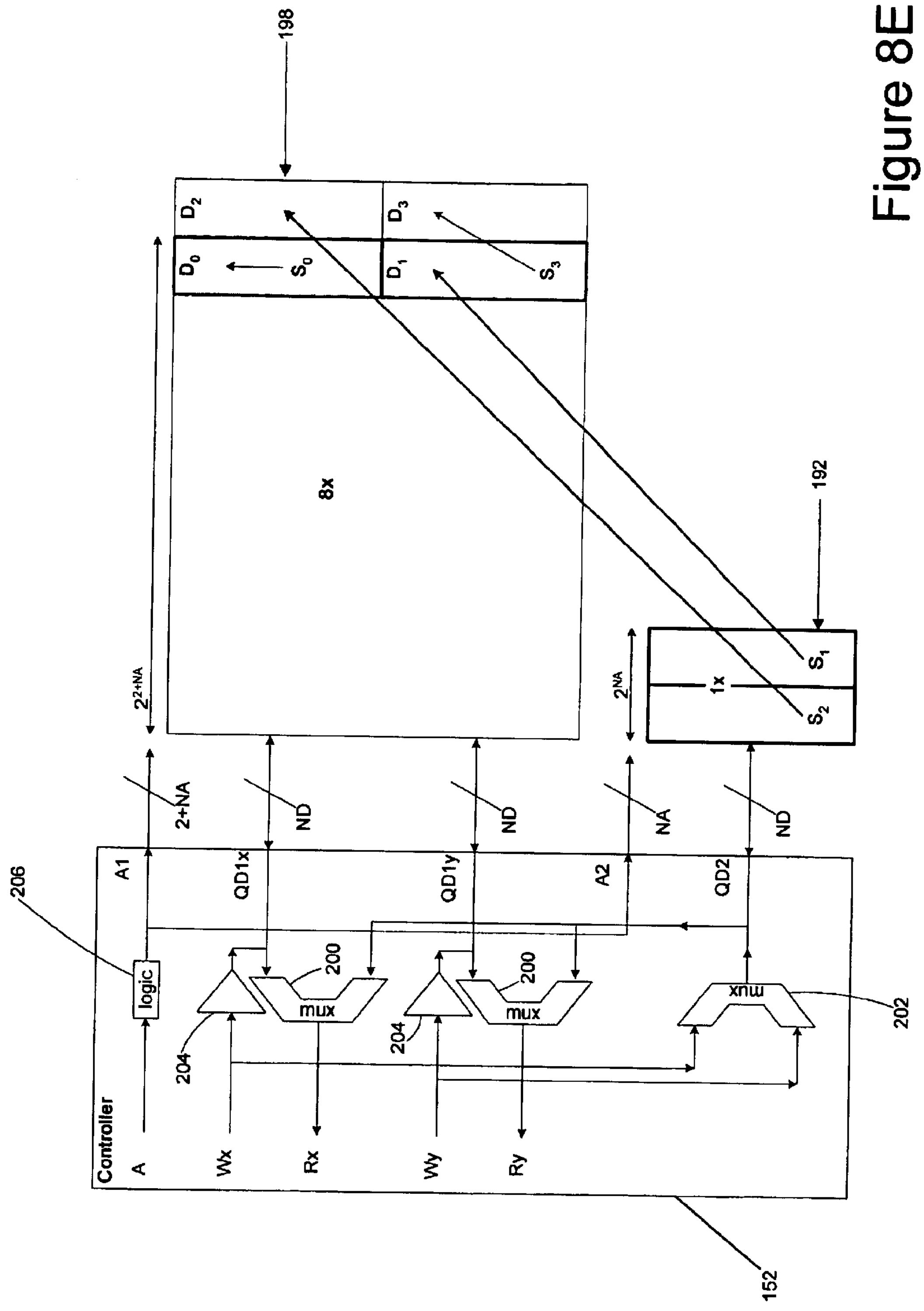
FIG. 8E illustrates an asymmetric port memory system having a first memory module and a second memory module with memory capacities of "8x"/"1x", respectively, in accordance with the present invention.

In the example of FIG. 8E with the "8x"/"1x" memory modules, the "1x" memory module 192 occupies $^2$NA words and the "8x" memory module 198 occupies $2^{NA+3}$ words ($2^{NA+2}$ double-words). That is, the two pieces of the 1x memory module (S1 and S2) 192 are effectively moved to positions D1 and D2 at the top of the "8x" memory module 198 address space. The two pieces of the 8x memory module (S0 and S3) 198 are effectively moved to new positions D0 and D3 at the top of the 8x memory module 198 address space.

A similar remapping of the memory pieces is performed for the other two-memory module combinations shown. As a result, there is constant, balanced data bandwidth available on the Wx/Rx and Wy/Ry data buses that connect to the rest of the system. This is true regardless of whether there is a single memory module in the system, or there is any combination of two memory modules in the system.

It is important to note that in the asymmetric port memory systems of FIG. 8, three ports are present on the memory controller 152, but only two ports of bandwidth is available inside the memory controller 152. While this scheme obviously results in a waste of some bandwidth, this scheme is still a better than the exclusive port-per-module memory systems of FIG. 3, wherein two ports are present on the memory controller 50, but only one port of bandwidth is available inside the memory controller 50. Moreover, the asymmetric port memory systems of FIG. 8 provide constant bandwidth for any combination of memory modules that are present, unlike the independent port-per-module memory systems of FIG. 4 and the lockstep port-per-module memory systems of FIG. 5, wherein two ports are present on the memory controllers 74 and 96, but only one port of bandwidth is available over part of the address space.

Figure 9:
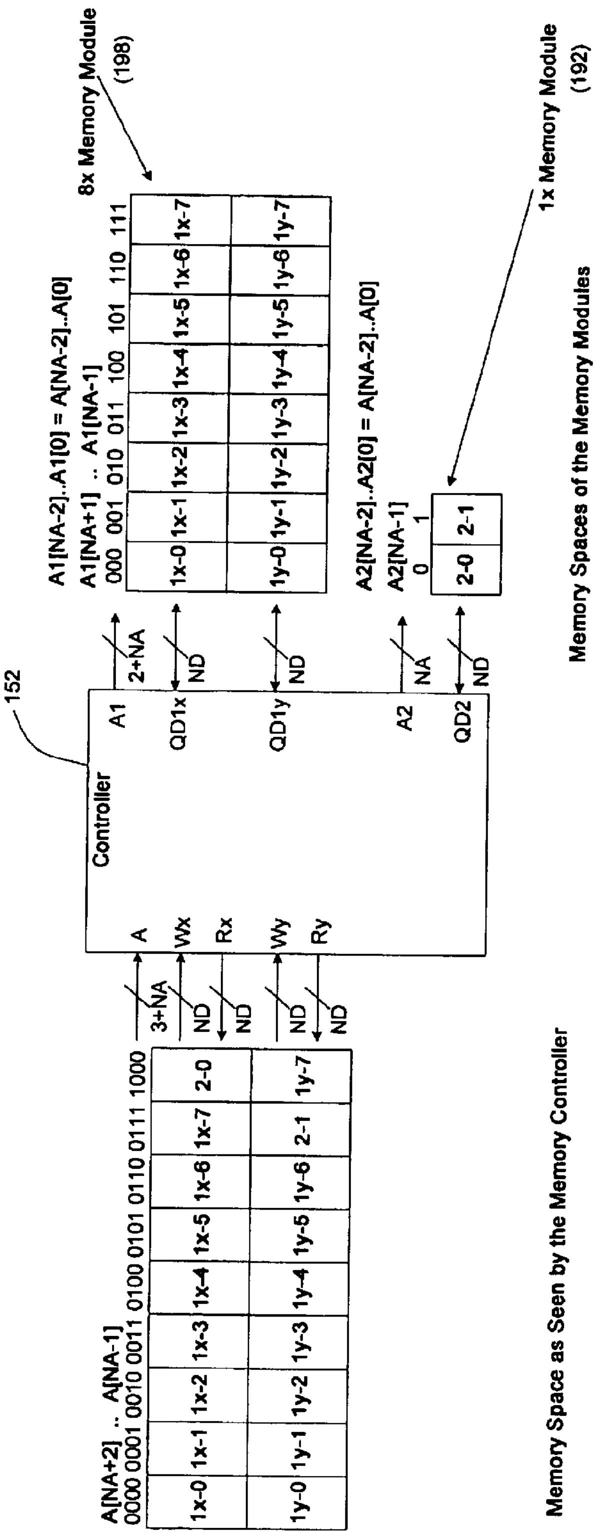
FIG. 9 illustrates how the memory spaces of the "8x"/"1x" memory modules of FIG. 8E are combined by the memory controller of FIG. 8E in accordance with the present invention.

Referring to FIG. 9, there is shown an illustration of how the memory spaces of the "8x"/"1x" memory modules 198 and 192, respectively, are combined by the memory controller 152 in the example of FIG. 8E. As shown in FIGS. 6B, 8E and 9, the "8x" memory module 198 is attached to ports 1*a* and 1*b* of the memory controller 152, and the "1x" memory module 192 is attached to port 2 of the memory controller 152. The memory space of the "8x" memory module 198 is comprised of sixteen pieces, each $2^{NA-1}$ words in size, each word comprised of ND bits. A first eight of the sixteen pieces are connected to port 1*a* (QD1x) and a second eight of the sixteen pieces are connected to port 1*b* (QD1y). One of each set of eight pieces is selected by address signals {A1[NA+1],A1[NA],A1[NA−1]}. A word from a selected piece is selected by address signals {A1[NA−2], . . . ,A2[0]}.

The memory space of the "1x" module 192 is comprised of two pieces, each $2^{NA-1}$ words in size, each word comprised of ND bits. Both of the two pieces are connected to port 2 (QD2). Each of the two pieces is selected by address signal {A2[NA−1]}. A word from a selected piece is selected by address signals {A2[NA−2], . . . ,A2[0]}.

The memory controller 152 receives an address {A[NA+2], . . . ,A1[0]} from a memory request source (not shown) (e.g., central processing unit, graphics unit, I/O unit, etc). The field {A[NA−2], . . . ,A[0]} is passed directly to address signals {A1[NA−2], . . . ,A1[0]} and {A2[NA−2], . . . , A2[0]} without modification (this portion of the address selects a word from within one of the 18 pieces of memory space). Address signals {A[NA+2],A[NA+1],A[NA],A[NA−1]} are modified to give address signals {A1[NA+1], A1[NA],A1[NA−1]} and {A2[NA−1]}.

The table of FIG. 12 shows specific examples of the above-described address modification scheme by the memory controller 152, while FIG. 9 conceptually shows how the above-described address modification scheme by the memory controller 152 operates in the asymmetric port memory system of FIG. 8E. That is, fourteen of the sixteen pieces from the "8x" memory module 198 are placed in the first fourteen slots ({A[NA+2],A[NA+1],A[NA], A[NA−1]}=0000 through 0110) of address space {A[NA+2], . . . ,A1[0]}. One piece from the "8x" memory module 198 and one piece from the "1x" memory module 192 are placed in the next two slots ({A[NA+2],A[NA+1],A[NA], A[NA−1]}=0111). The remaining piece from the "8x" memory module 198 and the remaining piece from the "1x" memory module are placed in the final two slots ({A[NA+2],A[NA+1],A[NA],A[NA−1]}=1000).

The result of mapping the two address spaces into one is that two data words may always be accessed simultaneously throughout the {A[NA+2], . . . ,A1[0]} address space. This same address space mapping may be adapted to two memory modules of any size, permitting a memory upgrade without lowering the performance of the upgraded system.

Referring to FIGS. 10–12, there are shown the three previously mentioned tables which specify how the multiplexers 200 and 202 of the memory controller 152 and the multiplexers 182 of the memory components (MEM) 174 are configured across the address space for the "8x"/"1x" memory modules in the asymmetric port memory system of example of FIG. 8E.

FIG. 10 shows how the Qy and Qx read data buses are driven from the Q1 and Q0 buses from inside the memory components (MEM) 174, and how the Dy and Dx write data buses drive the D1 and D0 buses inside the memory components (MEM) 174. There are five cases shown that are determined by the value of Config[1:0] and $A_{CL}$[0] signals for the memory component (MEM) 174. Note that other mappings that produce the same benefit are also possible. The mapping that is shown is simply an example.

FIG. 11 shows how the Ry and Rx read data buses are driven from the QD1x, QD1y and QD2 buses from the memory modules 192 and 198, and how the Wy and Wx write data buses drive the QD1x, QD1y and QD2 buses to the memory modules 192 and 198. There are three cases shown that are determined by the value of the {A[NA+2], A[NA+1],A[NA],A[NA−1]} address signals. Note that other mappings that produce the same benefit are also possible. The mapping that is shown is a simply an example.

FIG. 12 shows the values driven onto the Config[1:0], $A_{CL}$[0], and {A1[NA+2],A1[NA+1],A1[NA],A1[NA−1]} signals for the memory components (MEM) 174 of the "8x" memory module 198 connected to ports 1x/1y and the Config[1:0], $A_{CL}$[0], and {A2[NA+2],A2[NA+1],A2[NA], A2[NA−1]} signals for the memory components (MEM) 174 of the "1x" memory module 192 connected to port 2. There are three cases shown that are determined by the value of the {A[NA+2],A[NA+1],A[NA],A[NA−1]} address signals. Note that other mappings that produce the same benefit are also possible. The mapping that is shown is a simply an example.

The above-described asymmetric port memory system concepts can be extended to include other combinations of port sizes. That is, the above examples assume one port of size 2 and a second port of size 1. However, it is also possible to use a combination of 4 and 1, or 8 and 1, or any other combination. These other combinations might make a better tradeoff of unused controller pins and module configurations that are supported. Also, it is not necessary that the port sizes be limited to power-of-two pin counts. For example, some systems may be able to utilize asymmetric ports whose relative size is given by the ratio of any two integers.

Figure 13A:
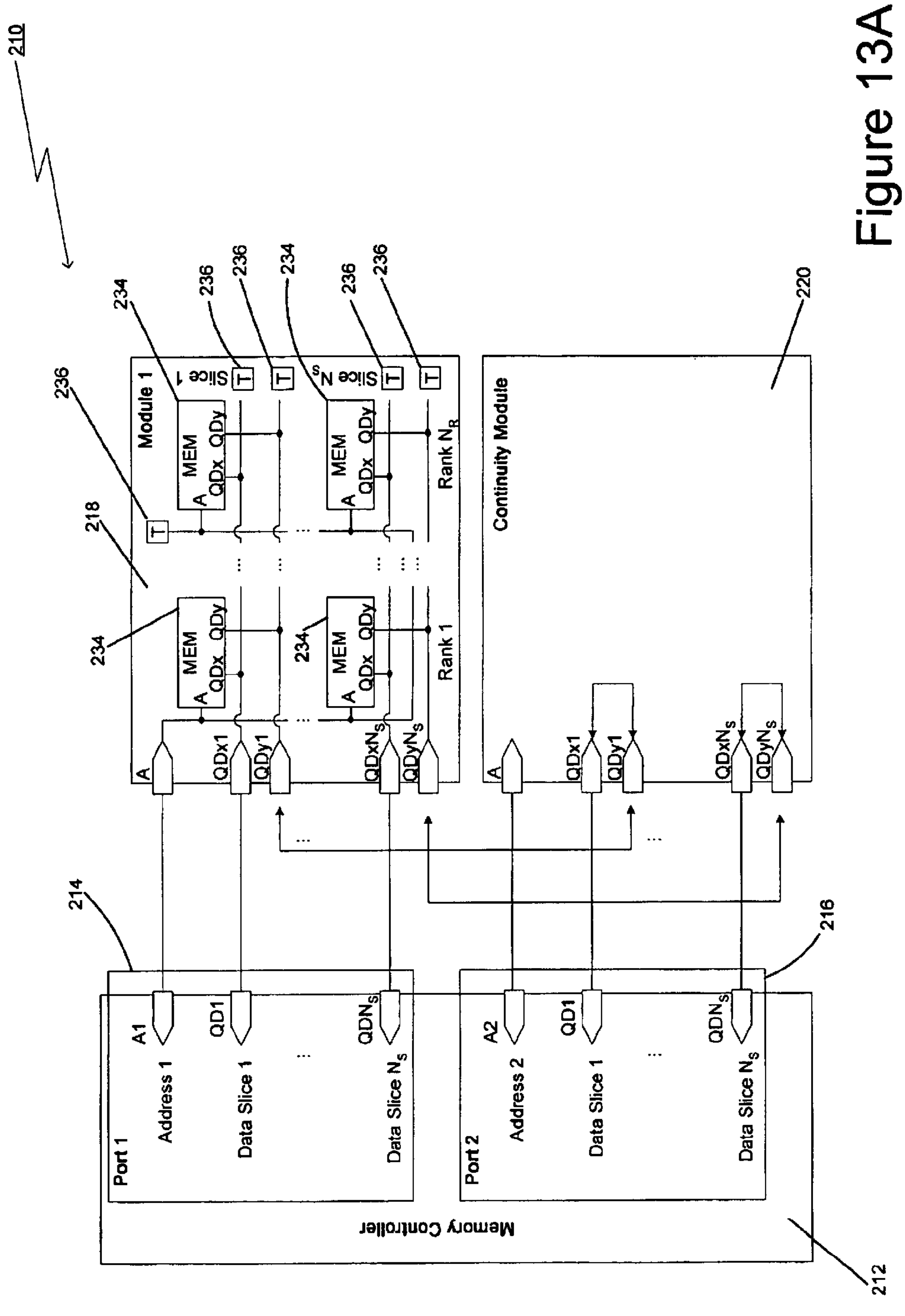
FIG. 13A shows a first bypass port memory system having a first memory module and a continuity module in accordance with the present invention.

Referring to FIG. 13A, there is shown a first bypass port memory system 210 in accordance with the present invention. The bypass port memory system 210 comprises a memory controller 212 having a first port (Port 1) 214 and a second port (Port 2) 216, both of equal size. The bypass port memory system 210 also comprises a first memory module 218 connected to the first port (Port 1) 214 of the memory controller 212, and a continuity module 220 connected to the second port (Port 2) 216 of the memory controller 212. The first memory module 218 and the continuity module 220 are also connected to each other, as described in detail below.

Figure 13B:
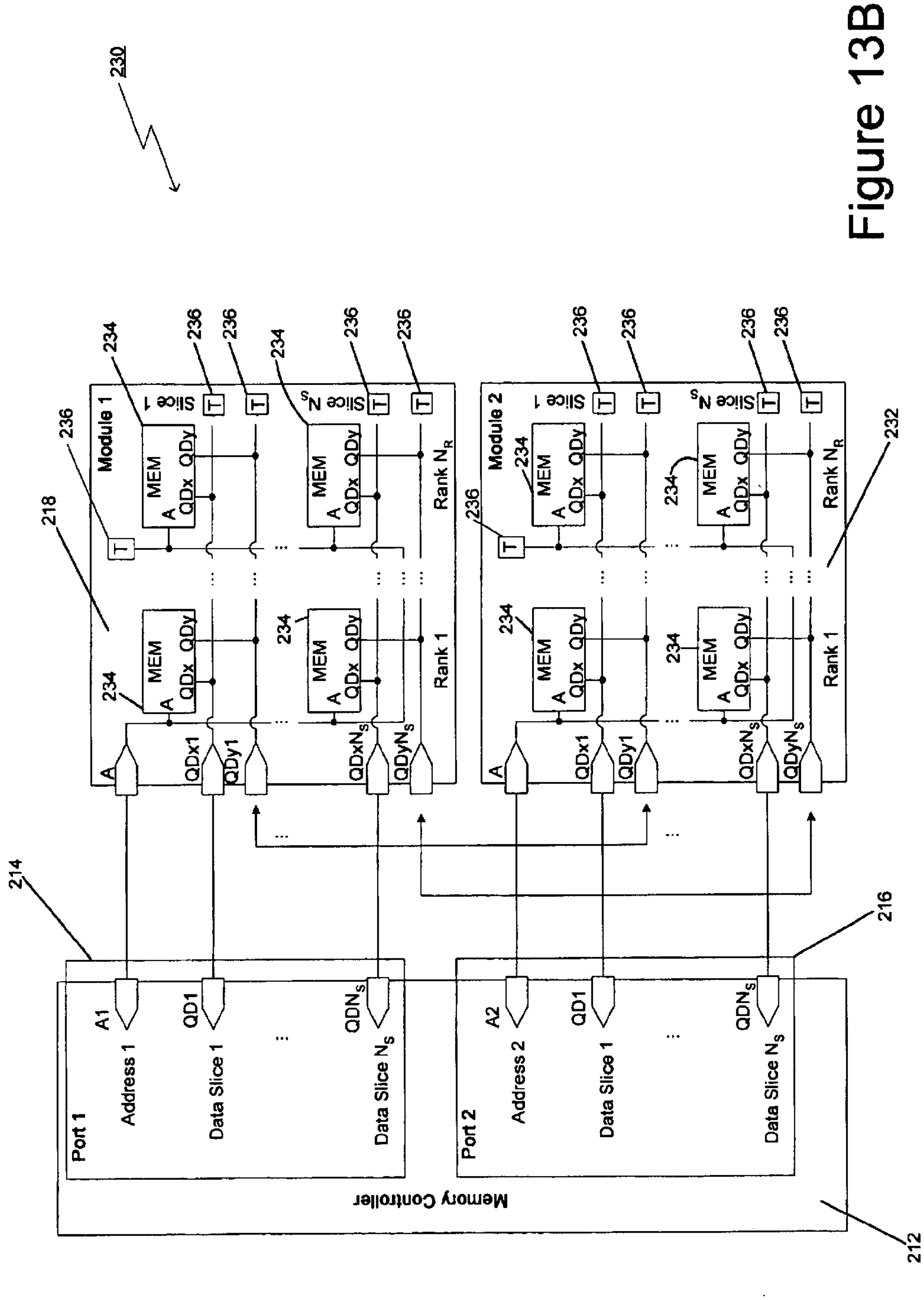
FIG. 13B shows a second bypass port memory system having first and second memory modules in accordance with the present invention.

Referring to FIG. 13B, there is shown a second bypass port memory system 230 in accordance with the present invention. The bypass port memory system 230 comprises the memory controller 212 having the first port (Port 1) 214 and the second port (Port 2) 216, both of equal size. The bypass port memory system 210 also comprises the first memory module 218 connected to the first port (Port 1) 214 of the memory controller 212, and a second memory module 232 connected to the second port (Port 2) 216 of the memory controller 212. The first memory module 218 and the second memory module 232 are also connected to each other, as described in detail below.

Similar to the memory modules 160 and 172 in FIGS. 6A and 6B, the memory modules 218 and 232 in FIGS. 13A and 13B are divided into ranks (rows) of memory components (MEM) 234. The number of ranks is denoted $N_R$, and may vary from module to module.

Also similar to memory modules 160 and 172 in FIGS. 6A and 6B, the memory modules 218 and 232 in FIGS. 13A and 13B are also divided into slices (columns) of memory components (MEM) 234. The number of slices is denoted $N_S$, and may also vary from module to module. However, the number of slices $N_S$ times the number of data-type signals per slice $N_{dq}$ is a constant ($N_{DQ}=N_S*N_{dq}$), determined by the number of data-type signals at a memory controller port $N_{DQ}$.

As described above, the notion of "slice" is used to distinguish address-type signals "A" from data-type signals "QD". The data-type signals (QD) from a slice of a memory controller port are only connected to a corresponding slice of each rank of memory components in a memory module. The address-type signals (A) are connected to all slices of each rank of memory components in a memory module. The address-type signals (A) can usually fan-out to more memory components than can data-type signals for several reasons including:[1] the signaling rate of address-type signals (A) is typically lower than data-type signals, and[2] address-type signals (A) are typically unidirectional (flowing from memory controller to memory components) and data-type signals (QD) are typically bi-directional (flowing in one direction at one time and flowing in the opposite direction at another time).

In addition to memory components (MEM) 234, each memory module 218 and 232 also contains some form of termination structure (T) 236 at the end of each signal wire. This is typically some sort of resistor component, and is typically required due to high signaling rates in a memory system.

Each memory component (MEM) 234 has two data bus ports denoted QDx and QDy. These ports are operated in two different modes. In a first mode, half the storage locations in the memory component (MEM) 234 are accessible through a QDx data bus formed on the memory modules 218 and 232, and the other half of the storage locations in the memory component (MEM) 234 are accessible through a QDy data bus formed on the memory modules 218 and 232. In a second mode, all the storage locations in the memory component (MEM) 234 are accessible through the QDx data bus, and the QDy data bus is unused.

Thus, in the bypass port memory system 210 of FIG. 13A, wherein the first memory module 218 is connected to both the first port (Port 1) 214 of the memory controller 212 through the QDx data bus and the second port (Port 2) 216 of the memory controller 212 through the QDy data bus (by way of the continuity module 220), the memory components (MEM) 234 in the first memory module 218 are operated in the first mode with half of the storage locations in the memory components (MEM) 234 accessible through the QDx data bus and the other half of the storage locations in the memory component (MEM) 234 accessible through the QDy data bus (by way of the continuity module 220). It should be noted, however, that the memory components (MEM) 234 in the first memory module 218 may also be operated in the second mode with all of the storage locations accessible through the QDx data bus, and the QDy data bus is unused.

It should be noted that the continuity module 220 does not contain any memory components, but rather contains internal electrical connections between its QDx data bus and its QDy data bus. Such internal electrical connections allow the QDx data bus of the continuity module 220 to be connected to the second port (Port 2) 216 of the memory controller 212, and the QDy data bus of the continuity module 220 to be connected to the QDy data bus of the first memory module 218, thereby allowing the second port (Port 2) 216 of the memory controller 212 to access the memory components (MEM) 234 in the first memory module 218 through the QDy data bus. It should be noted that accesses through the QDy data bus typically go through a slightly longer wire path than accesses through the QDX data bus, and thus logic circuitry within the second port (port 2) 216 of the memory controller 212 is provided to account for this.

In the bypass port memory system 230 of FIG. 13B, the first memory module 218 is connected to the first port (Port 1) 214 of the memory controller 212 through the QDx data bus of the first memory module 218, and the second memory module 232 is connected to the second port (Port 2) 216 of the memory controller 212 through the QDx data bus of the second memory module 218. Also, the first memory module 218 is connected to the second memory module 232 through the QDy data buses of both the first memory module 218 and the second memory module 232. Thus, the memory components (MEM) 234 in the first and second memory modules 218 and 232 may be operated in the first mode with some of the storage locations in the memory components (MEM) 234 accessible through the QDx data bus and the remaining storage locations in the memory component (MEM) 234 accessible through the QDy data bus, or in the second mode with all of the storage locations accessible through the QDx data bus, and the QDy data bus is unused.

Typically, in the first mode, exactly half of the storage locations in the memory components (MEM) 234 are accessible through the QDx data bus formed on memory modules 218, 232, and 244, and the other half of the storage locations in the memory components (MEM) 234 accessible through the QDy data bus formed on memory modules 218, 232, and 244.

Figure 14:
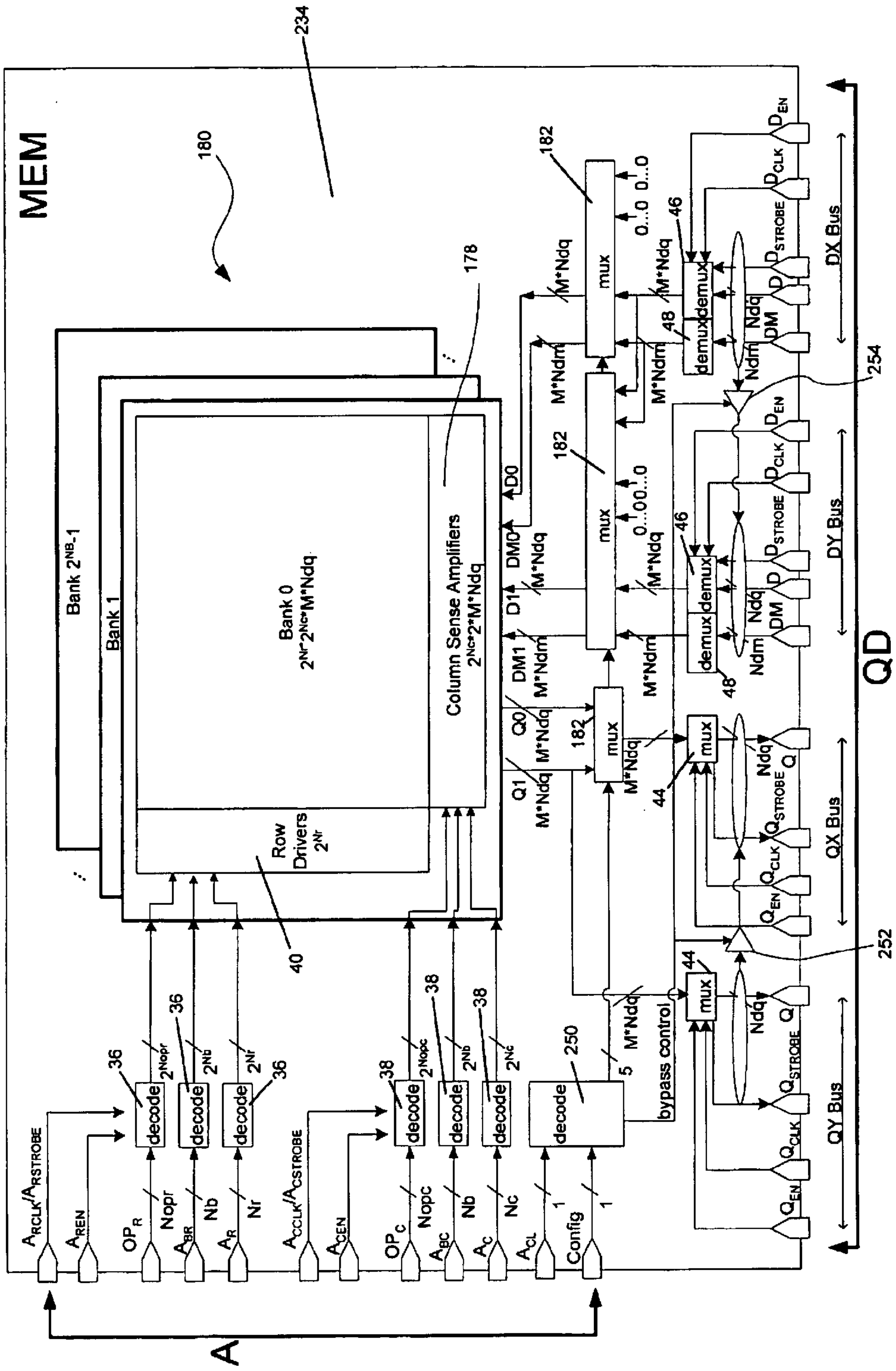
FIG. 14 shows the internal detail of the memory component (MEM) that is used in the memory modules of FIG. 13.

Referring to FIG. 14, the internal detail of the memory component (MEM) 234 is shown in accordance with the present invention. The memory component (MEM) 234 of FIG. 14 is similar to the memory component (MEM) 174 of FIG. 7, except for the addition of two bypass paths between the "QY" and "QX" buses and between the "DX" and "DY" buses. That is, a first set of bypass buffering devices 252 takes information on the "QY" bus and repeats it on the "QX" bus during selected read operations. A second set of bypass buffering devices 254 takes information on the "DX" bus and repeats it on the "DY" bus during selected write operations. The first and second sets of bypass buffer devices 252 and 254, respectively, are controlled through the Config and $A_{CL}$ signals, which are decoded by a decoder 250. The Config and $A_{CL}$ signals are also used to control the multiplexers 182, which, as previously described, enable read and write data to be steered to the external buses "QX", "QY", "DX", and "DY".

It should be noted that, as previously described, external buses "QX" and "QY" are typically multiplexed with external buses "DX" and "DY". These buses are shown separately in FIG. 14 for purposes of descriptive clarity, but are shown combined together in the bypass port memory systems of FIG. 13.

It should also be noted that the first and second sets of bypass buffer devices 252 and 254, respectively, may alternatively be implemented on the other side of the memory interface logic 44–48. This would have the benefit of allowing the same output driver to be used for the normal path as well as the bypass path, and might have advantages with respect to clock-domain crossing issues in the memory component (MEM) 234. A disadvantage of this alternative is that the bypass path might have somewhat longer transfer latency relative to the configuration shown.

It should further be noted that the first and second sets of bypass buffer devices 252 and 254, respectively, as well as the multiplexers 182 and the decode logic 184, may alternatively be implemented on the memory modules 218 and 232, thereby allowing standard memory components (with a single data bus) to be used.

Figure 13C:
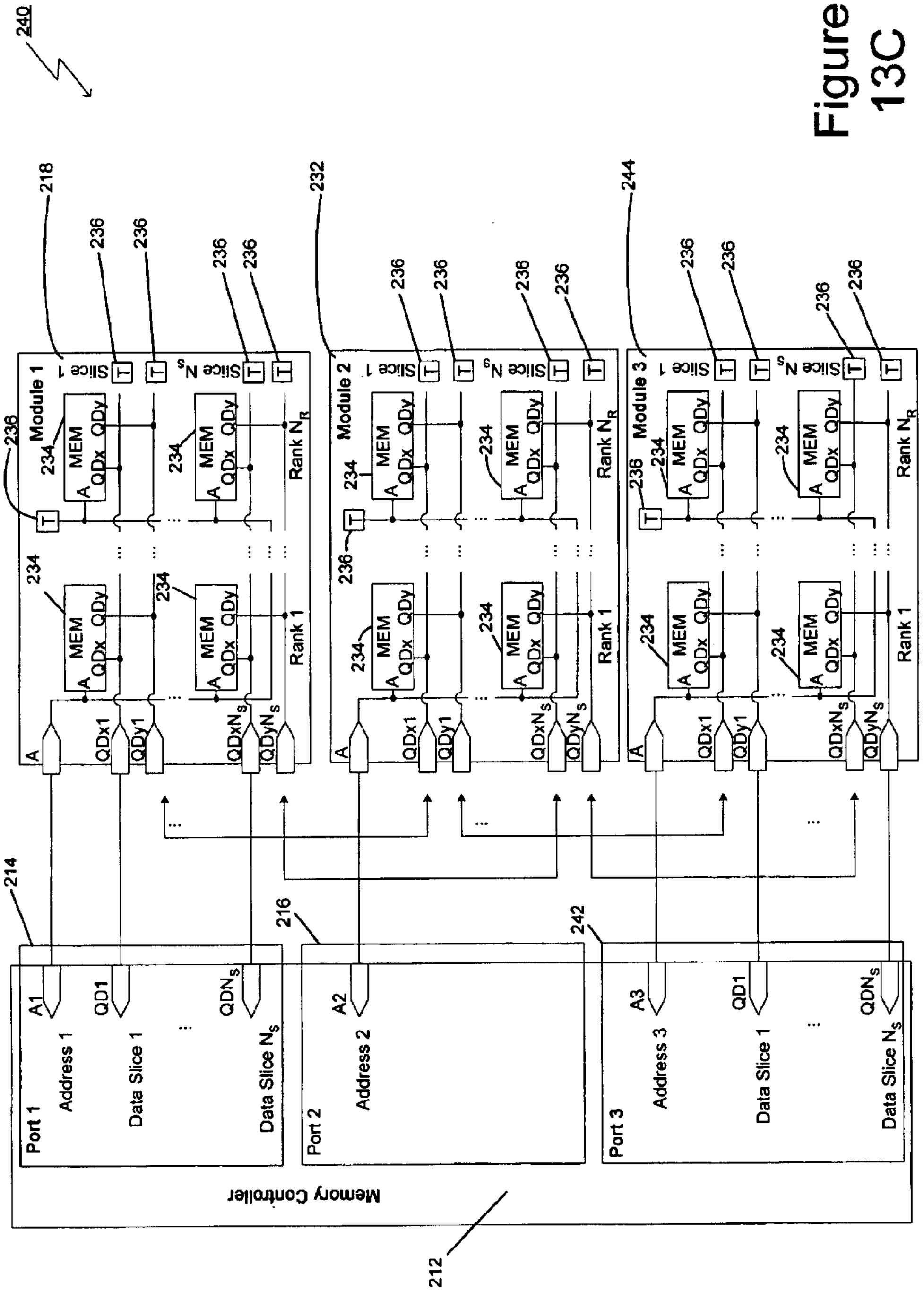
FIG. 13C shows a third bypass port memory system having first, second, and third memory modules in accordance with the present invention.

Referring to FIG. 13C, there is shown a third bypass port memory system 240 in accordance with the present invention. In this third bypass port memory system 240, the memory controller 212 has a third port (port 3) 242 and a third memory module 244 has been added. The QDx data bus of the first memory module 218 is connected to the first port (Port 1) 214 of the memory controller 212, the QDy data bus of the first memory module 218 is connected to the QDx data bus of the second memory module 232, the QDy data bus of the second memory module 232 is connected to the QDx data bus of the third memory module 244, and the QDy data bus of the third memory module 244 is connected to the third port (Port 3) 242 of the memory controller 212. Thus, the second memory module 232 does not connect directly to the memory controller 212, except for an address bus connection. However, the second memory module 232 does connect indirectly to the memory controller 212 through a connection between the QDx data bus of the second memory module 232 and the QDy data bus of the first memory module 218 (which is connected to the first port (Port 1) 214 of the memory controller 212 through a connection with the QDx data bus of the first memory module 218), and through a connection between the QDy data bus of the second memory module 232 and the QDx data bus of the third memory module 244 (which is connected to the third port (Port 3) 242 of the memory controller 212 through a connection with the QDy data bus of the third memory module 244).

The above-described connections require that the first and second sets of bypass buffer devices 252 and 254, respectively, in the memory component (MEM) 234 be made bi-directional rather than unidirectional (as shown in FIG. 14). As a result, these connections allow each memory module to be accessed at full bandwidth by using the QDx data bus transfer data to/form the first port (Port 1) 214 of the memory controller 212 and using the QDy data bus to transfer data to/from the third port (Port 3) 242 of the memory controller 212. This insures that there is uniform bandwidth available across the full memory space, no matter how many memory modules are added to the system, and no matter what combination of memory module capacities are present.

Referring to FIG. 15, there are shown five examples of bypass port memory systems in accordance with the present invention. More particularly, FIG. 15A shows the memory controller 212 with a first memory module 260 of memory capacity "1x" and a continuity module 220 (similar to the bypass port memory system 210 of FIG. 13A); FIG. 15B shows the memory controller 212 with the first memory module 260 and a second memory module 262 with memory capacities of "1x"/"1x", respectively (similar to the bypass port memory system 230 of FIG. 13B); FIG. 15C shows the memory controller 212 with the first memory module 260 and a second memory module 264 with memory capacities of "1x"/"2x", respectively (similar to the bypass port memory system 230 of FIG. 13B); FIG. 15D shows the memory controller 212 with the first memory module 260 and a second memory module 266 with memory capacities of "1x"/"4x", respectively (similar to the bypass port memory system 230 of FIG. 13B); and FIG. 15E shows the memory controller 212 with the first memory module 260 and a second memory module 268 with memory capacities of "1x"/"8x", respectively (similar to the bypass port memory system 230 of FIG. 13B).

In each example, the memory controller 212 comprises a pair of write data drivers 272 and a pair of read data drivers 274 that steer data on the QD1 and QD2 buses to/from Wx, Rx, Wy, and Ry buses that connect to the rest of the system. The memory controller 212 also comprises address decode logic 270 for controlling access to the memory modules.

Figure 15A:
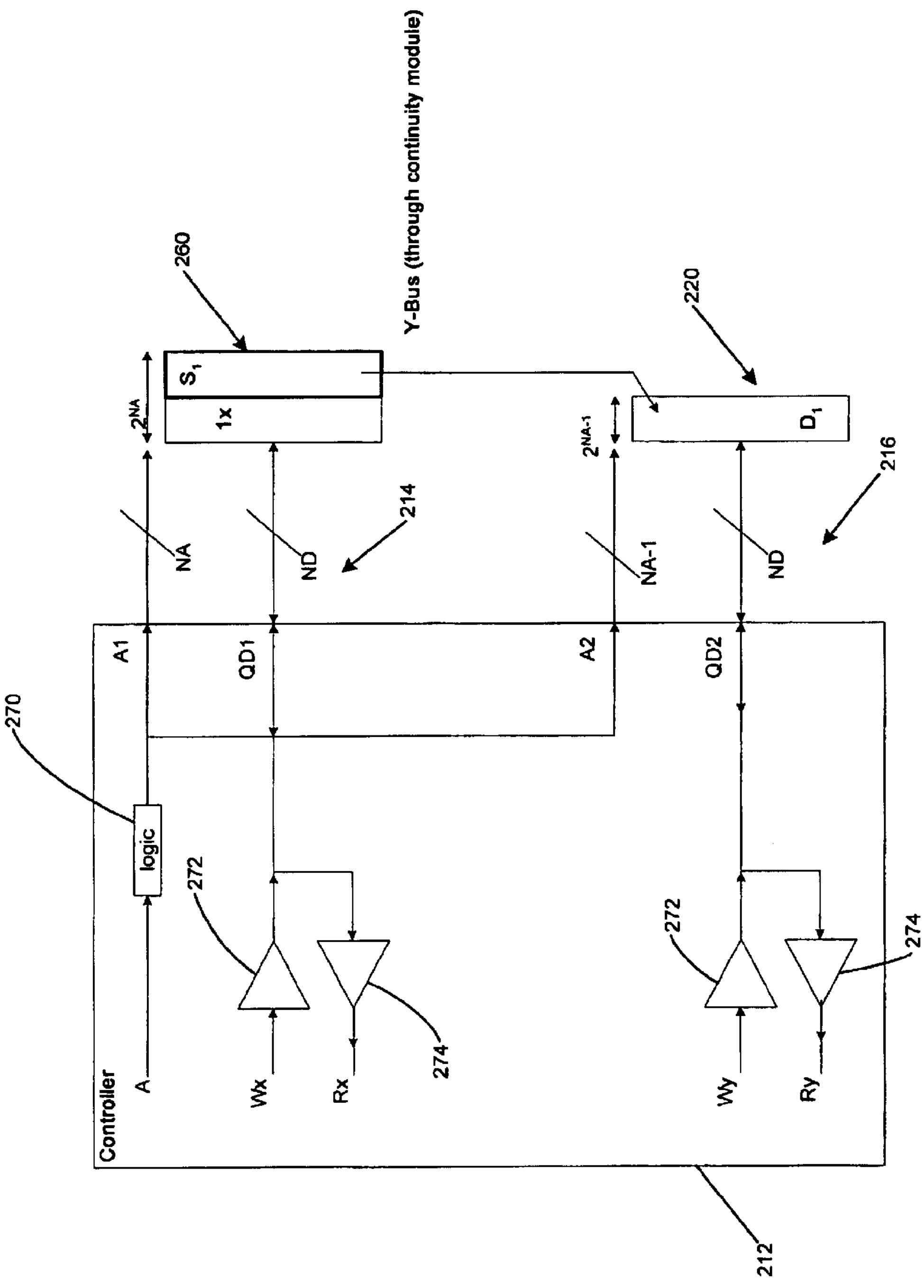
FIG. 15A illustrates a bypass port memory system having a memory module of memory capacity "1x" and a continuity module in accordance with the present invention.

In the example of FIG. 15A with the first memory module 260 of memory capacity "1x" and the continuity module 220, the memory space of the first memory module 260 is accessed simultaneously through both the first port (Port 1) 214 and the second port (Port 2) 216 of the memory controller 212. The first and second sets of bypass buffer devices 252 and 254, respectively, in each memory component (MEM) 234 of the first memory module 260 are not used in this configuration (this is similar to the asymmetric port memory system of FIG. 8A). Similar to FIG. 13A, the second port (Port 2) 216 of the memory controller 212 is connected to the QDy data bus of the memory module 260 through the continuity module 220.

The advantage of the example of FIG. 15A is that both the first port (Port 1) 214 and the second port (Port 2) 216 of the memory controller 212 and both buses (QDx and QDy) of the first memory module 260 are operated at full bandwidth. This is not true of any of the other memory systems already discussed (even the asymmetric port memory systems can only use two of three memory ports, so there are some controller pins being underutilized).

Figure 15B:
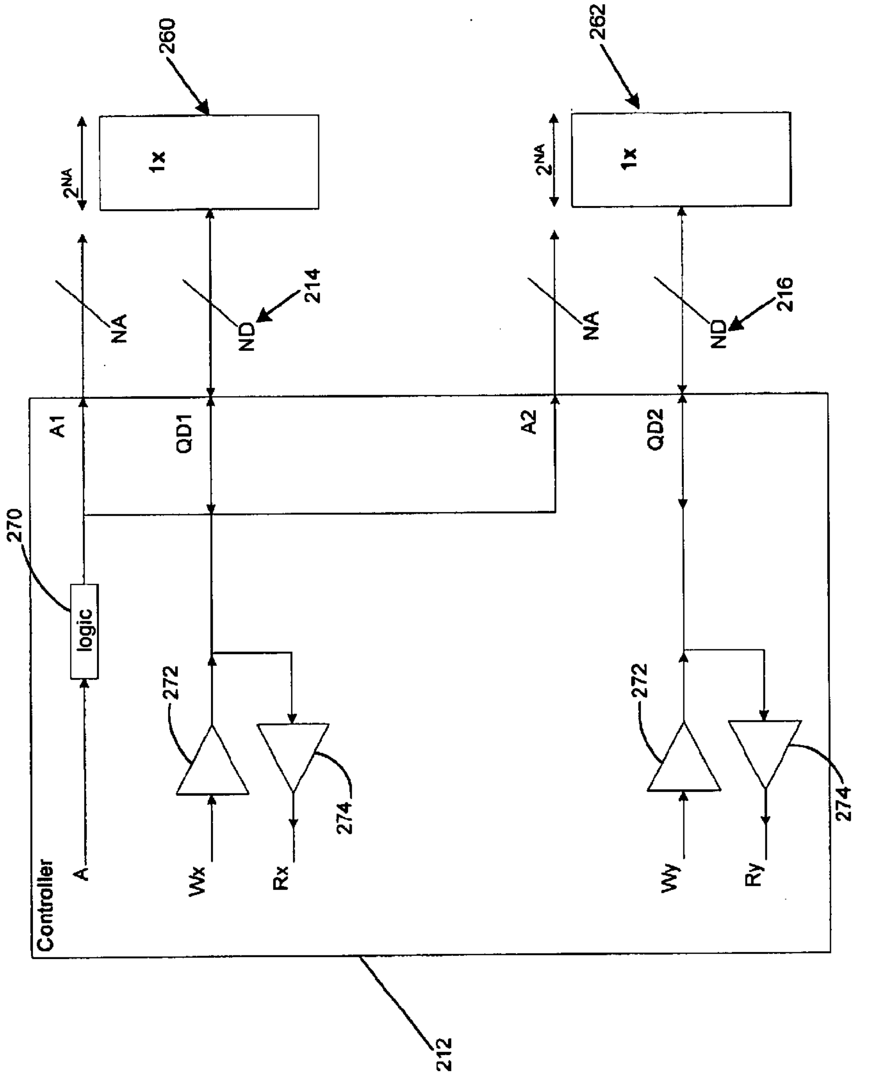
FIG. 15B illustrates a bypass port memory system having a first memory module and a second memory module with memory capacities of "1x"/"1x", respectively, in accordance with the present invention.

The example of FIG. 15B with the "1x"/"1x" memory modules is also able to use both the first port (Port 1) 214 and the second port (Port 2) 216 of the memory controller 212 and one data bus (QDx) in each of the first memory module 260 and the second memory module 262 at full bandwidth, again using the resources of the memory system at full efficiency. This is done without using the QDy data buses of the first and second memory modules 260 and 262.

Figure 1A:
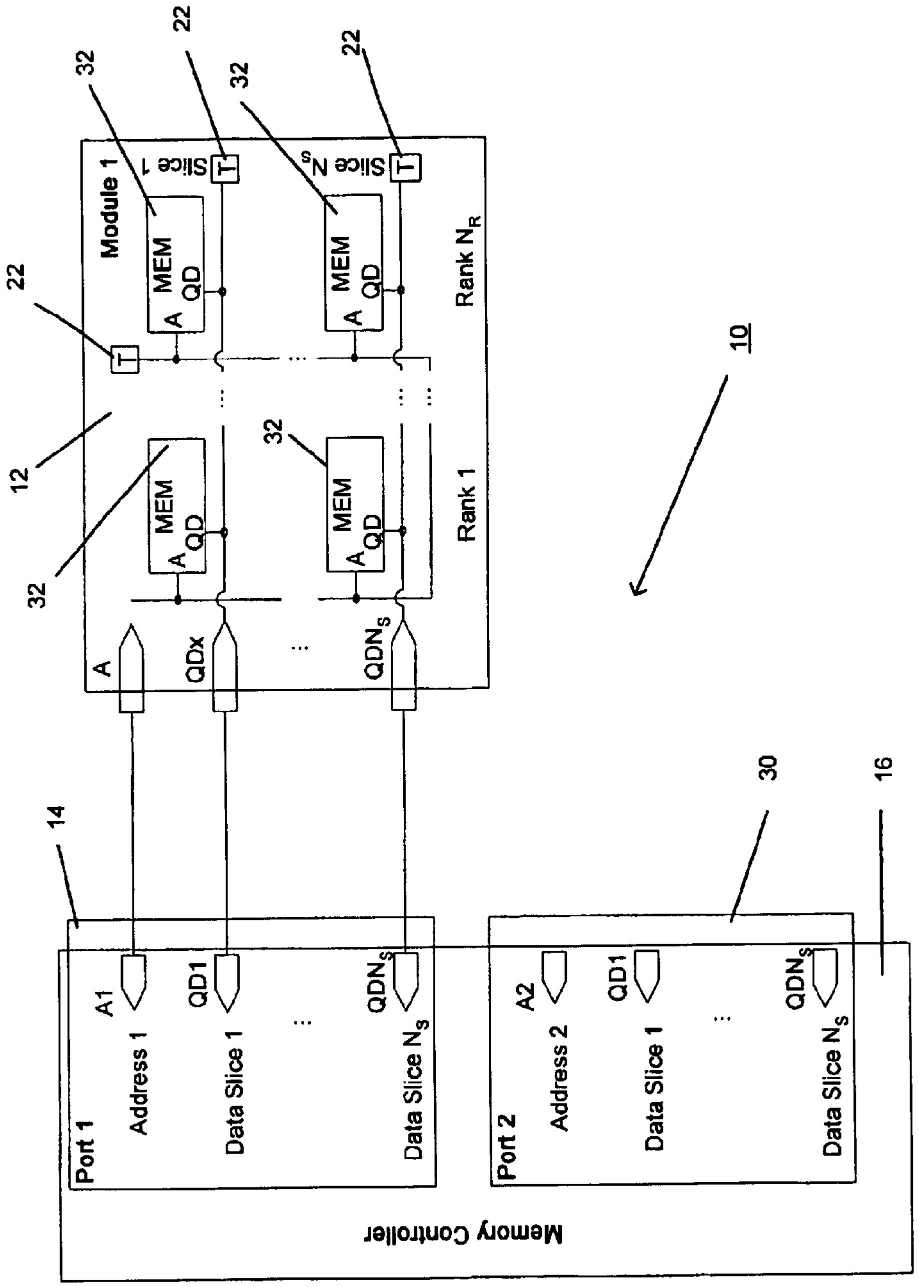
FIG. 1A shows a memory system with one memory module connected to a first port of a memory controller.
Figure 1B:
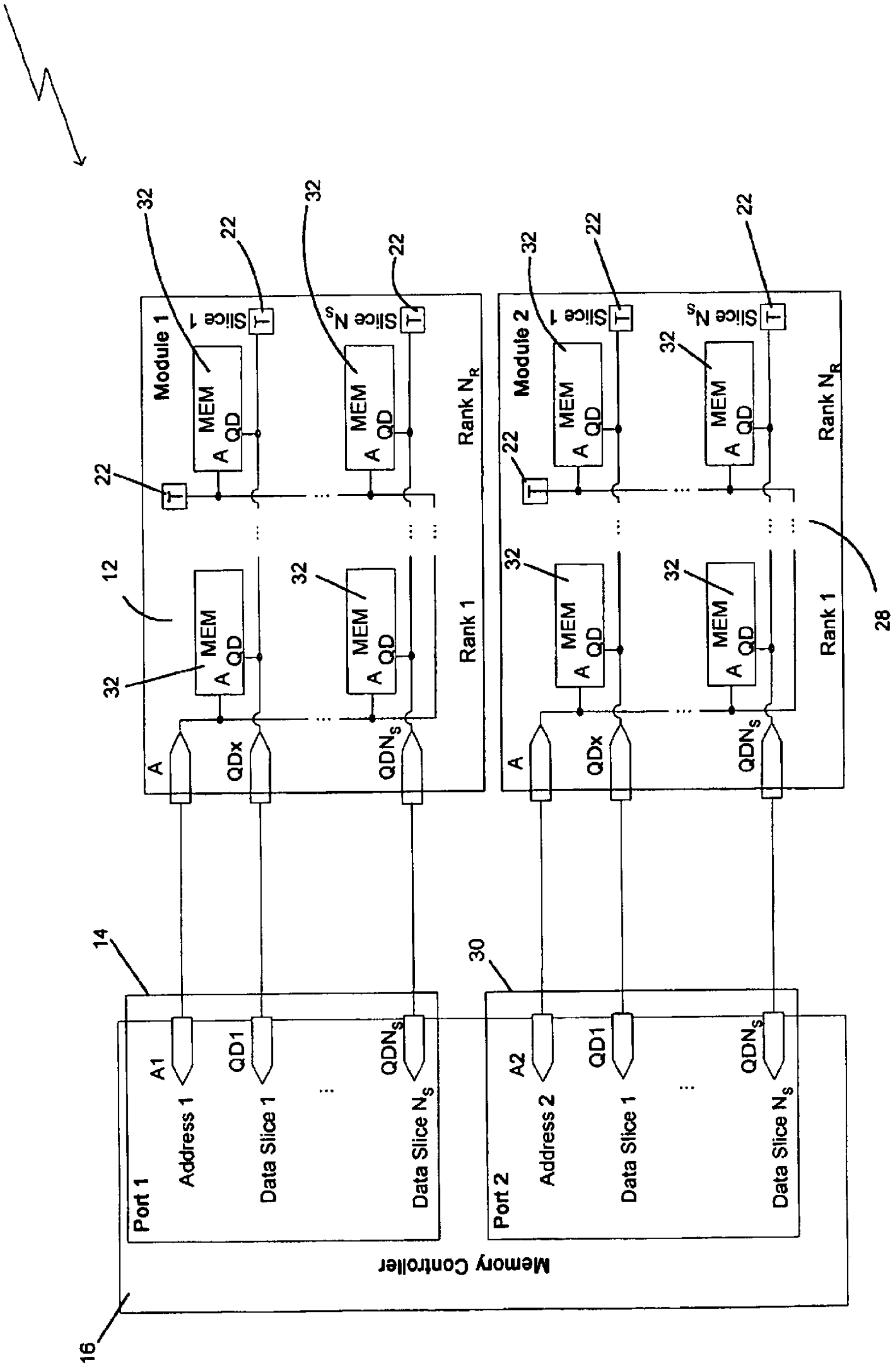
FIG. 1B shows a memory system with a first memory module connected to a first port of a memory controller, and a second memory module connected to a second port of the memory controller.
Figure 15C:
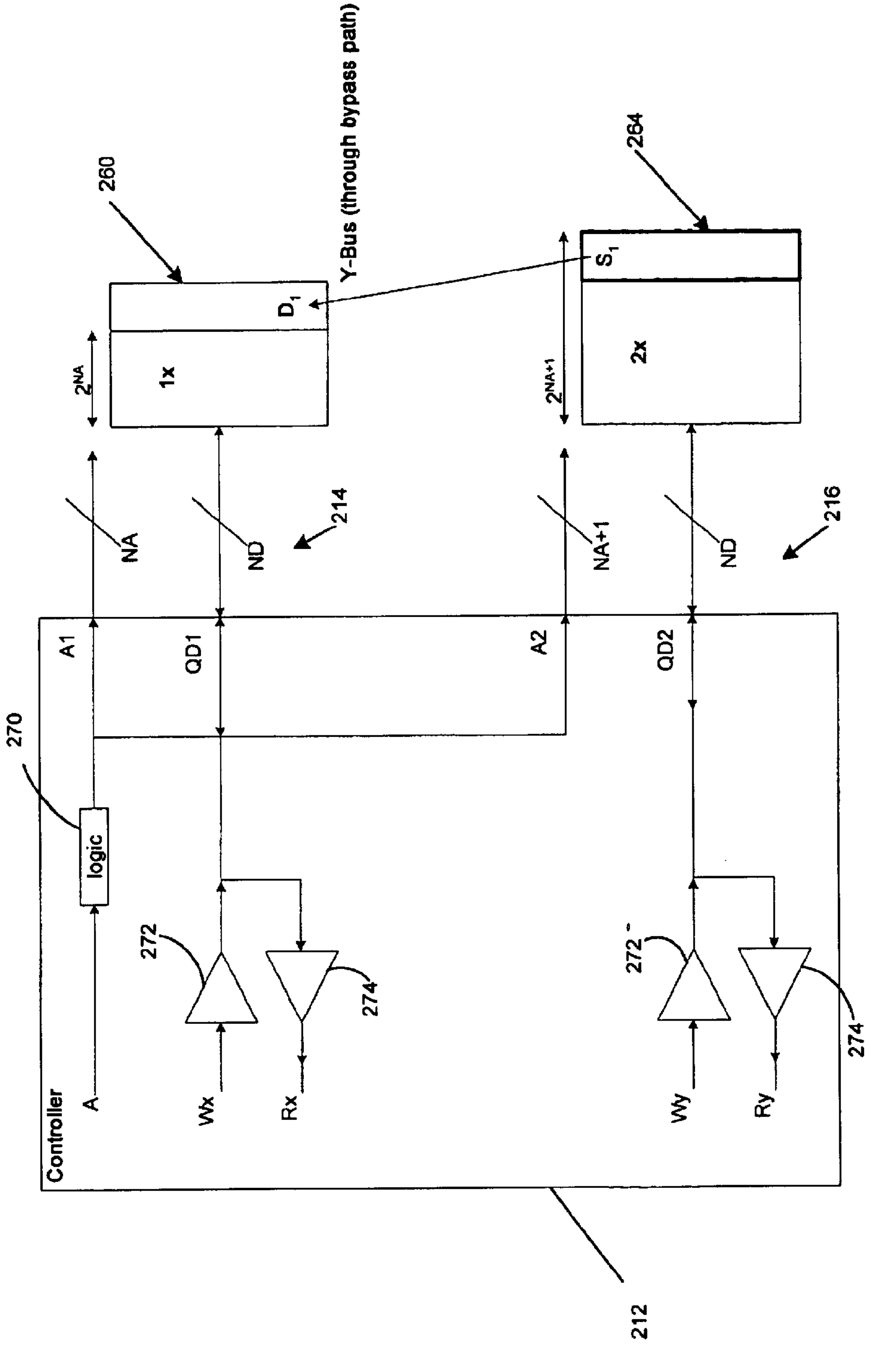
FIG. 15C illustrates a bypass port memory system having a first memory module and a second memory module with memory capacities of "1x"/"2x", respectively, in accordance with the present invention.
Figure 15D:
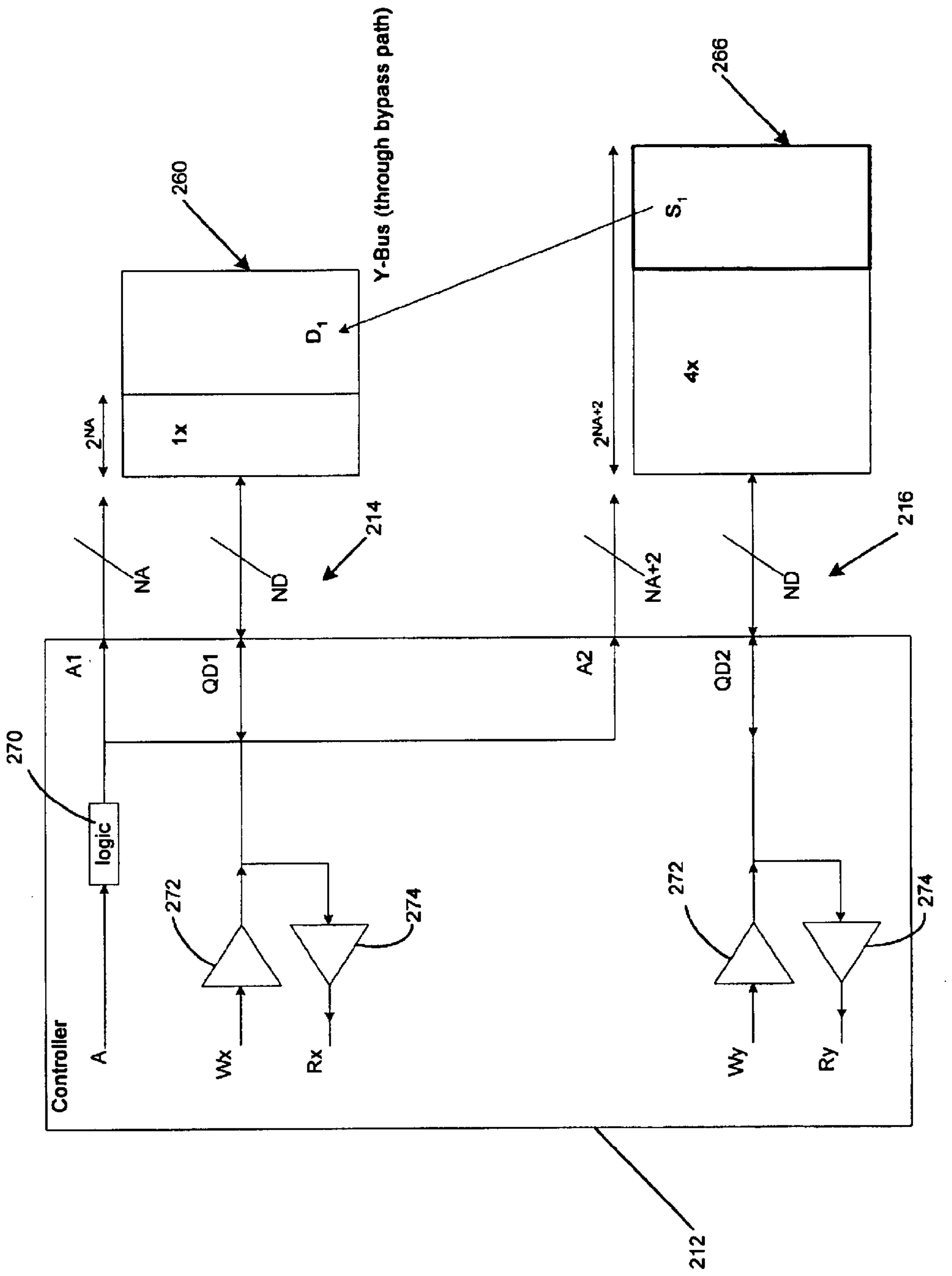
FIG. 15D illustrates a bypass port memory system having a first memory module and a second memory module with memory capacities of "1x"/"4x", respectively, in accordance with the present invention.

In the examples of FIGS. 15C, 15D, and 1SE, there are mismatched memory modules, and the QDy buses of the memory modules must be used to even the available bandwidth. The following discussion will be directed to the example of FIG. 15E with the "1x"/"8x" memory modules, but will apply to the "1x"/"2x" and "1x"/"4x" memory systems of FIGS. 15C and 15D, respectively, as well.

Figure 15E:
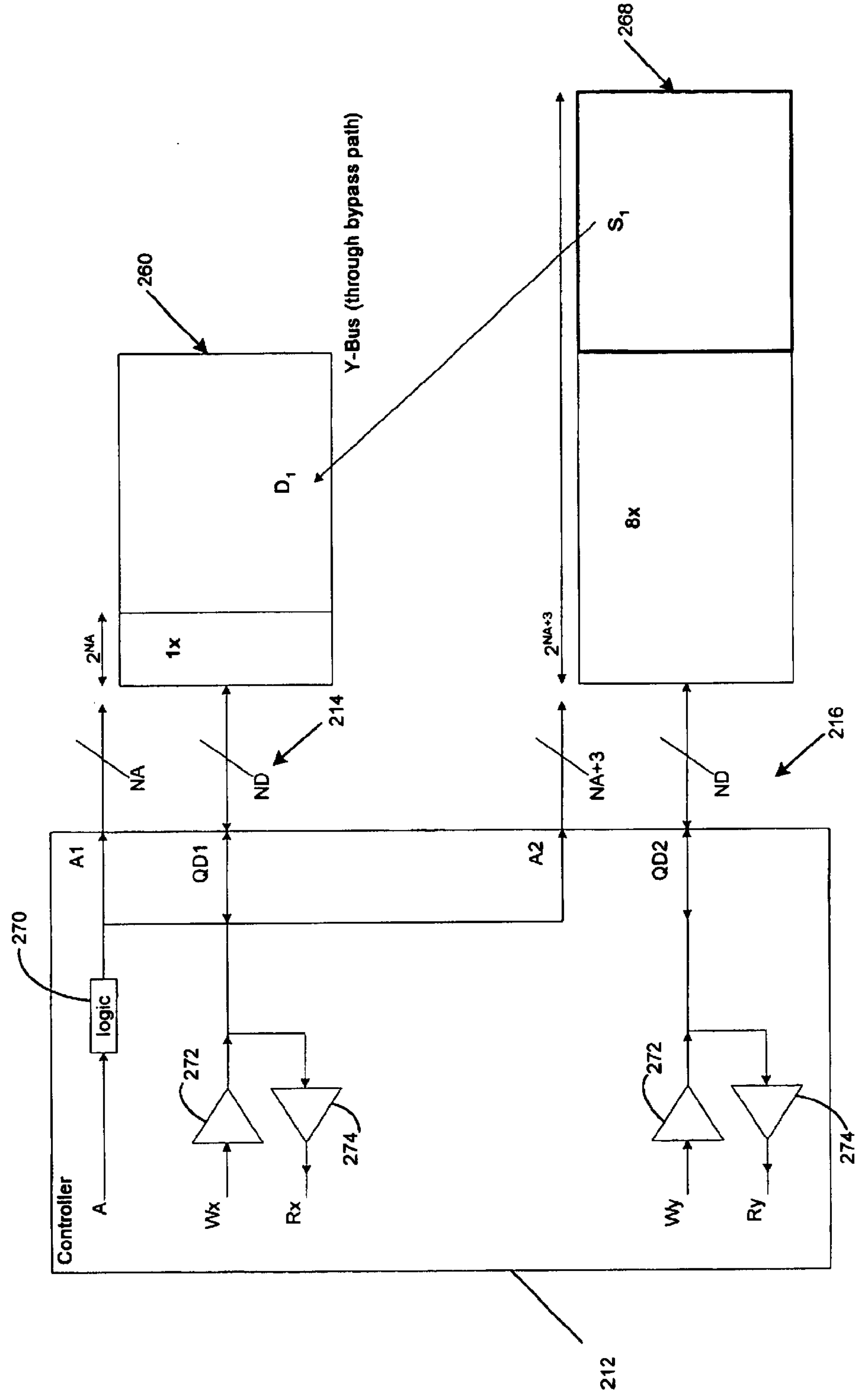
FIG. 15E illustrates a bypass port memory system having a first memory module and a second memory module with memory capacities of "1x"/"8x", respectively, in accordance with the present invention.

In the example of FIG. 15E with the "1x"/"8x" memory modules, an access to the low $2^{NA}$ words of the two memory spaces (a lockstep access is assumed) will involve transferring a word between the first port (Port 1) 214 of the memory controller 212 and the QDx data bus of the first memory module 260, and a second word between the second port (Port 2) 216 of the memory controller 212 and the QDx data bus of the second memory module 268. An access to the region above the low $2^{NA}$ words of the two memory spaces will involve transferring a word between the second port (Port 2) 216 of the memory controller 212 and the QDx data bus of the second memory module 268. A second word is transferred between the first port (Port 1) 214 of the memory controller 212 and the QDx data bus of the first memory module 260, through the first and second sets of bypass buffer devices 252 and 254, respectively, in the memory components (MEM) 234 of the first memory module 260 to the QDy data bus of the first memory module 260, through the wires connecting the two QDy data buses of the first and second memory modules 260 and 268, and into the QDy data bus of the second memory module 268. In this way, the bypass path allows the memory locations labeled "S1" in the second memory module 268 to appear as if they are in the memory locations labeled "D1" in the first memory module 260. Thus, in this way, the two mismatched memory modules 260 and 268 can provide uniform bandwidth across the full memory space, using the two controller ports 214 and 216 at full efficiency.

One drawback with the above-described bypass port memory system for handling mismatched memory modules is that there is a somewhat longer transfer time for the data which must travel through the bypass path to and from the "S1" region of the second memory module memory space. Thus, there may be an efficiency loss because the longer transfer time will mean that idle time inserted between read and write transfers must be somewhat larger for bus turnaround. This can be reduced by using write buffers in the memory controller 212, which collect and hold write transactions (allowing read transactions to proceed without delay), and then allowing a burst of write transactions to be issued. This will amortize the bus turnaround time across many write transactions.

A second efficiency loss may occur because of the time needed to switch between the non-bypass path (the low $2^{NA}$ words) and the bypass path (above the low $2^{NA}$ words). Idle time may need to be inserted to allow for the difference in the transfer time of these two paths. Again, this can be reduced by using write buffers in the memory controller 212, which collect and hold write transactions, but the write buffers are also divided into two groups according to whether the write destination is in the low $2^{NA}$ words or above the low $2^{NA}$ words. Again, this will amortize the bus turnaround time across many write transactions.

The above-described write buffering concepts may be extended to read transactions by queuing read transactions in the memory controller 212 and completing them in an out-of-order fashion. This will allow read transactions to the non-bypass path (the low $2^{NA}$ words) and the bypass path (above the low $2^{NA}$ words) to be grouped together. This will amortize the bus turnaround time across many read transactions. It should be noted that this read queuing concept must be balanced by the need to complete a read transaction as quickly as possible. It is possible to include a configuration setting (e.g., a programmable register, fuse, or jumper) in the memory controller 212 that could be used to select between a setting to maximize bandwidth and a setting to minimize latency or some setting in between. It should also be noted that it is possible for application software or operating system software to preferentially load certain data structures and code structures into the two regions (i.e., in the low $2^{NA}$ words and above the low $2^{NA}$ words), so that transactions to the two regions naturally cluster together. This would also improve the bandwidth of mismatched memory module systems.

Figure 16:
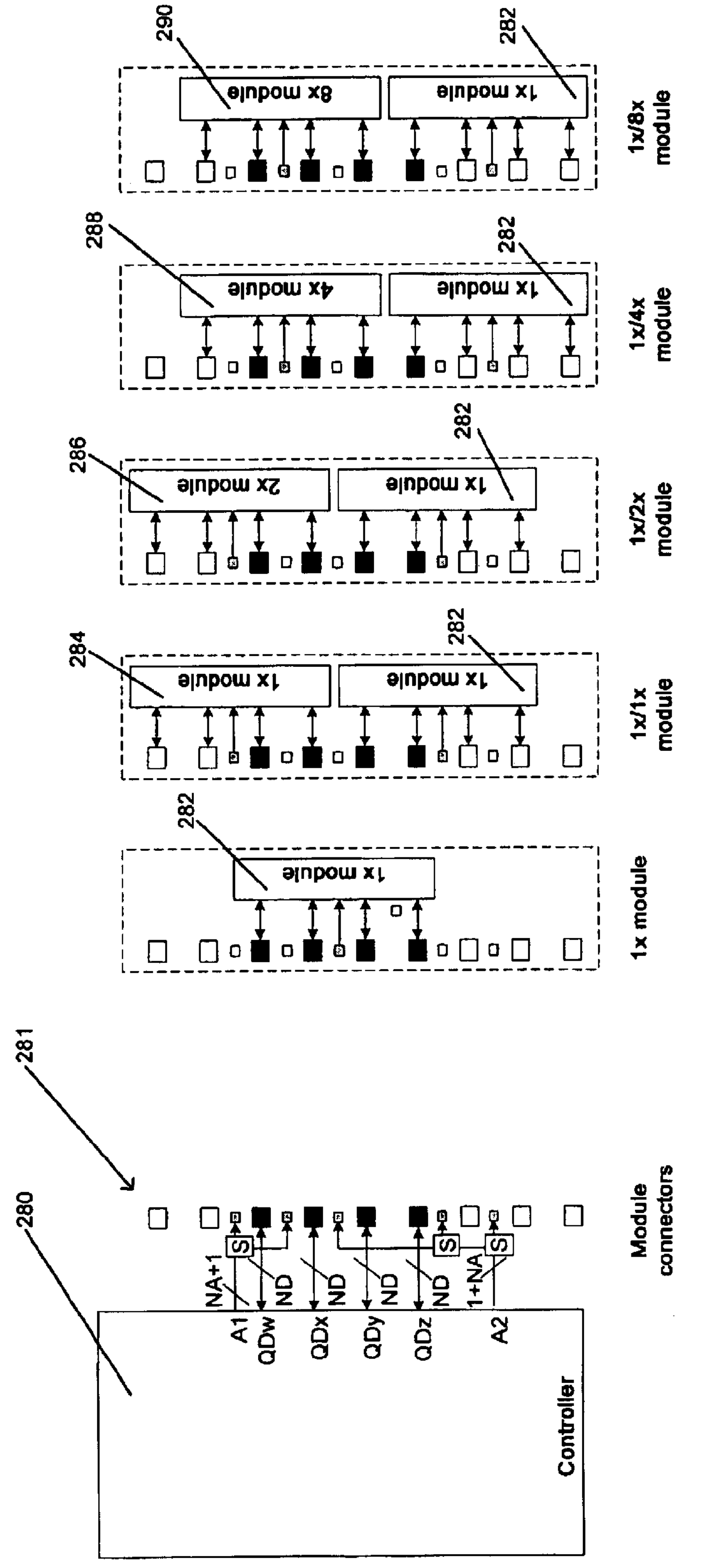
FIG. 16 shows a fractional port memory system in accordance with the present invention.

Referring to FIG. 16, there is shown a fractional port memory system in accordance with the present invention. The fractional port memory system of FIG. 16 comprises a memory controller 280 having four data buses (i.e., QDw, QDx, QDy, and QDz) and two address buses (i.e., A1 and A2). The fractional port memory system of FIG. 16 also comprises a module connector 281 for electrically connecting the data and address buses of the memory controller 280 with a set of one or two memory modules 282–290. The module connector 281 is designed to accept a set of one or two memory modules 282–290 in several different configurations. That is, the module connector 281 allows a set of one or two memory modules 282–290 to be electrically connected to the data and address buses of the memory controller 280 in a manner that is approximately proportional to the memory capacity of each memory module 282–290.

More particularly, each data bus (QDw, QDx, QDy, and QDz) of the memory controller 280 has ND signal wires which connect to one of four active sites (black squares) of the module connector 281. Each set of one or two memory modules 282–290 has four groups of contacts (black squares) that connect to the four active sites (black squares) of the module connector 281. Each memory module 282–290 contains memory components (not shown, but similar to those shown and described in FIGS. 13 and 14) having four data buses which connect to the four groups of contacts (black squares). The memory components have multiplexing logic (not shown, but similar to that shown and described in FIG. 14) which allows all the storage cells of the memory component to be accessed through any of the data buses. The memory controller 280 includes logic (not shown, but similar to that shown and described in FIG. 15) for configuring the memory components at initialization and for steering data to/from the appropriate memory controller and memory component data buses. The white squares indicate inactive sites that may be needed for mechanical support of the sets of memory modules 282–290.

In the case where the set of one or two memory modules 282–290 includes only a first memory module 282 (i.e., the “1x” module), the memory components on the first memory module 282 connect to all of the four groups of contacts (black squares). In the case where the set of one or two memory modules 282–290 includes the first memory module 282 and a second memory module 284 (i.e., the “1x”/“1x” module), the memory components on both the first memory module 282 and the second memory module 284 each connect to two groups of contacts (black squares). In the case where the set of one or two memory modules 282–290 includes the first memory module 282 and a third memory module 286 (i.e., the “1x”/“2x” module), the memory components on both the first memory module 282 and the third memory module 286 each connect to two groups of contacts (black squares). In the case where the set of one or two memory modules 282–290 includes the first memory module 282 and a fourth memory module 288 (i.e., the “1x”/“4x” module), the memory components on the first memory module 282 connect to one group of contacts (black squares) and the memory components on the fourth memory module 288 connect to three groups of contacts (black squares). In the case where the set of one or two memory modules 282–290 includes the first memory module 282 and a fifth memory module 290 (i.e., the “1x”/“8x” module), the memory components on the first memory module 282 connect to one group of contacts (black squares) and the memory components on the fifth memory module 290 connect to three groups of contacts (black squares).

The two address buses (i.e., A1 and A2) of the memory controller 280 also adapt to the different memory module configurations. For example, in FIG. 16, the A1 address bus is driven from the memory controller 280 into a splitting element “S” to create two copies of the A1 address bus. The A2 address bus is driven from the memory controller 280 into two splitting elements “S” to create three copies of the A2 address bus. The splitting elements “S” could be as simple as a single low impedance trace splitting into two traces of half the impedance. The splitting elements “S” could also be a switch or buffer component. Alternatively, the memory controller 280 could simply drive two separate copies of the A1 address bus and three separate copies of the A2 address bus, or some equivalent technique could be used to make the copies of the address buses.

Each memory module 282–290 in the example fractional port memory system of FIG. 16 receives its address bus on a set of address bus contacts located near the data bus contacts. In FIG. 16, the address bus contacts are indicated by small gray squares in each of the five different memory module configurations shown (i.e., the “1x” module, the “1x”/“1x” module, the “1x”/“2x” module, the “1x”/“4x” module, and the “1x”/“8x” module). The small white squares indicate inactive sites that may be needed for mechanical support of the sets of memory modules 282–290.

In the case where the set of one or two memory modules 282–290 includes only a first memory module 282 (i.e., the “1x” module), the memory components on the first memory module 282 use only the top copy of the A2 address bus. In the case where the set of one or two memory modules 282–290 includes the first memory module 282 and the second memory module 284 (i.e., the “1x”/“1x” module), the memory components on the first memory module 282 use the middle copy of the A2 address bus and the memory components on the second memory module 284 use the top copy of the A1 address bus. In the case where the set of one or two memory modules 282–290 includes the first memory module 282 and the third memory module 286 (i.e., the “1x”/“2x” module), the memory components on the first memory module 282 use the middle copy of the A2 address bus and the memory components on the third memory module 286 use the top copy of the A1 address bus. In the case where the set of one or two memory modules 282–290 includes the first memory module 282 and the fourth memory module 288 (i.e., the “1x”/“4x” module), the memory components on the first memory module 282 use the bottom copy of the A2 address bus and the memory components on the fourth memory module 288 use the bottom copy of the Al address bus. In the case where the set of one or two memory modules 282–290 includes the first memory module 282 and the fifth memory module 290 (i.e., the “1x”/“8x” module), the memory components on the first memory module 282 use the bottom copy of the A2 address bus and the memory components on the fifth memory module 290 use the bottom copy of the A1 address bus.

Figure 17:
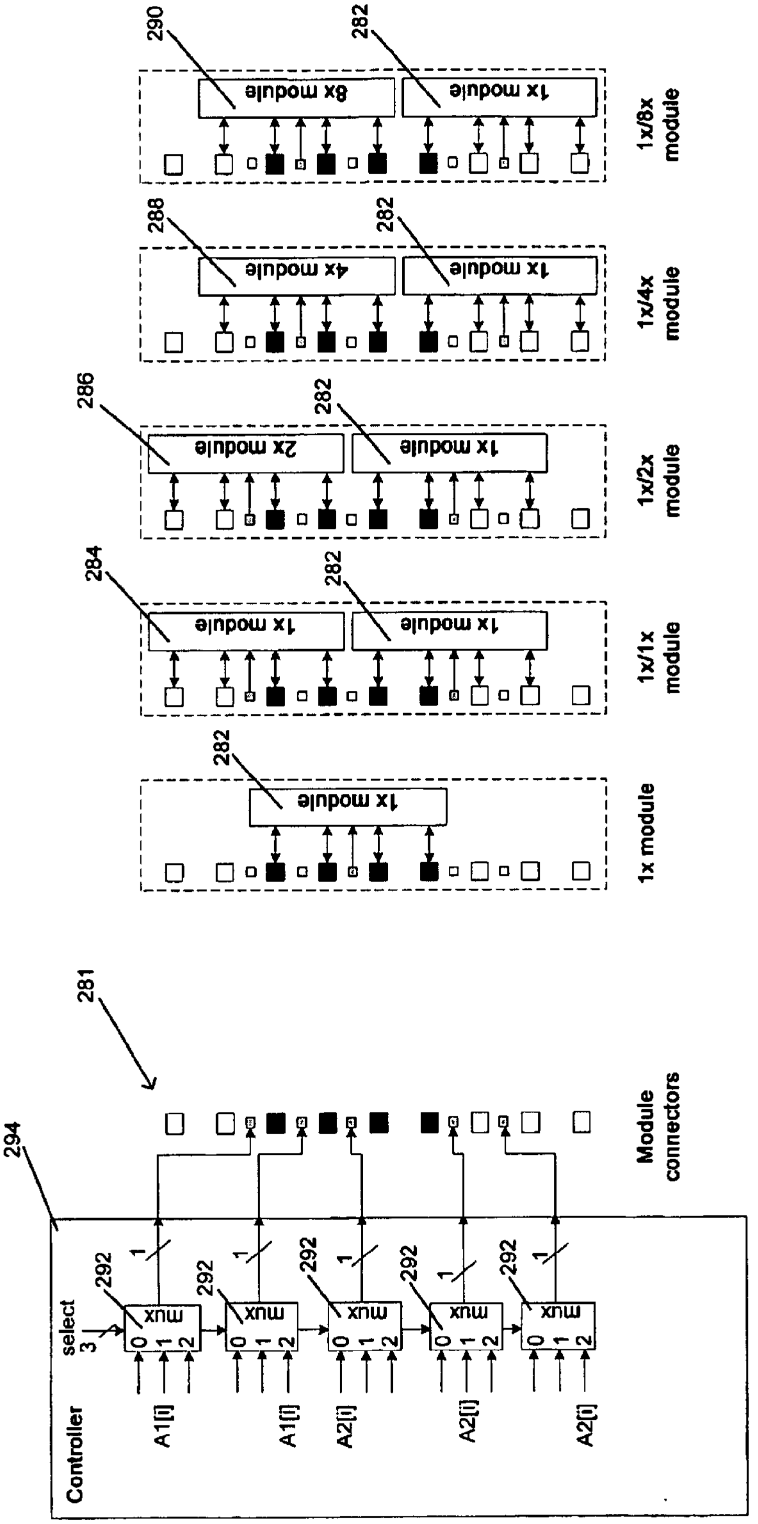
FIG. 17 shows a fractional port memory system having a modified memory controller for providing address steering in accordance with the present invention.

One characteristic of the above-described technique for distributing addresses to each of the five different memory module configurations shown (i.e., the “1x” module, the “1x”/“1x” module, the “1x”/“2x” module, the “1x”/“4x” module, and the “1x”/“8x” module) is that there are many unused signal wires. One way to overcome this characteristic is to steer individual address signals inside the memory controller 280 onto the appropriate address wires for the particular memory module configuration that is detected at initialization time. Referring to FIG. 17, there is shown an example of such an address steering technique using a set of multiplexers 292 in a modified memory controller 294. That is, the multiplexers 292 are used to route a single A1 address bit A[i] and a single A2 address bit A2[i] from inside the modified memory controller 294 to particular contacts (the small gray squares) in each set of one or two memory modules 282–290. There are three possible memory module configurations for this example, for the “1x” memory module case (select=0), for the “1x”/“1x” and “1x”/“2x” memory module cases (select=1), and for the “1x”/“4x” and “1x”/“8x” memory module cases (select=2).

For each select value, the A2[i] bit is steered to the output of one of the three lower multiplexers 292 in the modified memory controller 294. The other two multiplexers 292 carry different address bits, appropriate for that memory module combination. One multiplexer 292 drives the proper A2 address wire from the modified memory controller 294 to the appropriate memory module contact. Thus, all address wires are utilized, and none are wasted, and the only cost is the set of multiplexers 292 in the memory controller 294. The A1[i] bit is steered to the output of one of the two upper multiplexers 292 in the modified memory controller 294 in a similar fashion (although the A1 address is not used for the “1x” memory module configuration (select=0)).

The above-described techniques associated with the fractional port memory system permit the address and data buses to be subdivided as finely as the memory components allow. It should be noted that the number of data buses (QDw, QDx, QDy, and QDz) cannot exceed the total number of data wires connected to a single memory component since data multiplexing is needed in the memory components. However, if the data multiplexing were moved out of the memory components and into other buffering components on the memory module, then the number of data buses could not exceed the total number of data wires connected to one of these buffering components. It is much easier to add data wires to the buffering component, since this will not affect the memory capacity of the memory module. In contrast, changing the number of data wires on a memory component will affect the capacity of the memory module (indirectly).

Figure 18:
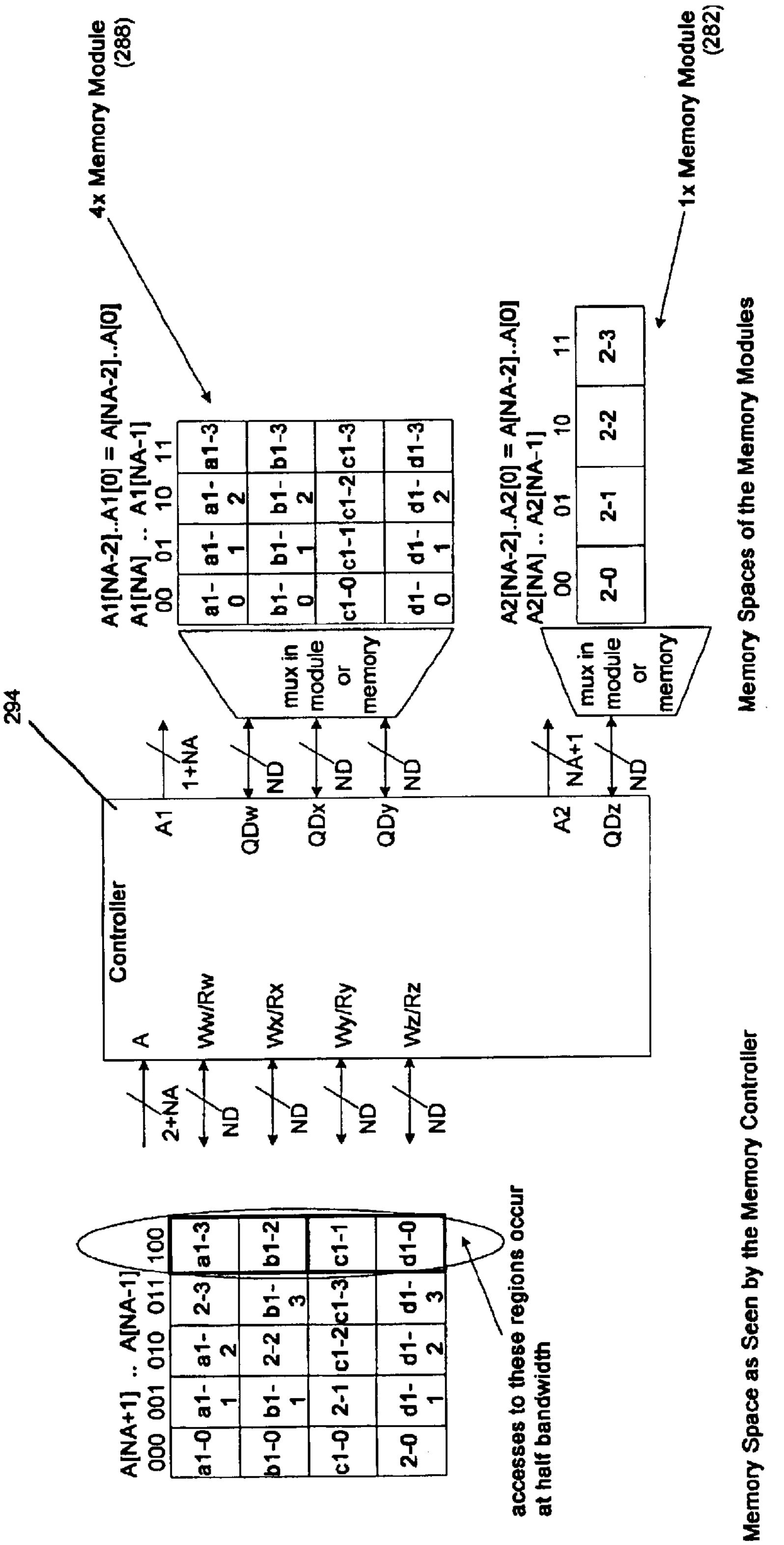
FIG. 18 shows a fractional port memory system having a first memory module and a second memory module with memory capacities of "1x"/"4x", respectively, in accordance with the present invention.

By subdividing the data bus into smaller pieces, and using the multiplexing technique for the individual bits of the address buses, it is possible to subdivide the address space in each memory module into smaller pieces. This permits the bandwidth of memory accesses to reach the maximum possible across more of the address space. Referring to FIG. 18, there is shown a particular example of this scenario with the “1x”/“4x” memory module configuration.

In FIG. 18, three data buses (QDw, QDx, and QDy) are connected to the “4x” memory module 288 and one bus (QDz) is connected to the “1x” memory module 282. The address space of the “4x” memory module is divided into 16 regions labeled “a1–0”, “b1–0”, . . . , “b1–0”, . . . , “d1–3”. Four of these regions are accessed at a time by the {A1[NA],A1[NA−1]} address bits. Three of these four regions are selected for access via the {QDw, QDx, and QDy} data buses.

The address space of the “1x” memory module is divided into 4 regions labeled “2-0”, “2-1”, . . . , “2-3”. One of these regions is accessed at a time by the {A2[NA],A2[NA−1]} address bits. The selected region is accessed via the {QDz} bus.

It should be noted that the word selection within each of the selected regions is accomplished with the {A1[NA−2], A1[NA−3], . . . ,A1[0]} and {A2[NA−2],A2[NA−3], . . . , A2[0]} address bits, which are simply copied from the {A[NA−2],A[NA−3], . . . ,A[0]} address bits.

The address space presented by the memory controller 280 to the rest of the system is shown to the left of the memory controller 294. Four of the regions are accessible at a time on the four write buses (Ww, Wx, Wy, Wz) and the four read buses (Rw, Rx, Ry, Rz). Note that in most memory controllers, these read and write buses will be unidirectional, but they have been shown as bi-directional in this diagram for clarity.

The {A[NA+1],A[NA],A[NA−1]} address bits select which four regions are to be accessed, and the {A[NA−2], A[NA−3], . . . ,A[0]} address bits select which word in each region is to be accessed. It may be seen that for {A[NA+1], A[NA],A[NA−1]}=000,001,010,011, three regions from the “4x” memory module 288 and one region from the “1x” memory module 282 are selected. The multiplexing logic in both the memory controller 294 and the memory components (or buffering components on the memory modules 282 and 288) steer the data that is accessed to create this memory space mapping. The data in these 16 regions may be accessed at the full bandwidth of the four memory controller data buses (QDw, QDx, QDy, and QDz). The remaining four regions may be accessed at 3/4 bandwidth (limited by the fact that the “4x” memory module 288 only connects to three data buses). It should be noted that another technique described in related U.S. patent application Ser. No. 09/949, 464, filed Sep. 7, 2001, entitled “Improved Granularity Memory Column Access”, is required in the memory component in order to support the two different accessing patterns to the 16 regions of the “4x” memory module 288.

Another technique for maintaining constant memory bandwidth with multiple memory controller ports and memory modules of unequal sizes is to provide extra memory controller ports and intentionally only use a subset of them at any one time. One benefit of this approach is that standard single-port memory modules (with standard single-port memory components) may be used.

Figure 19:
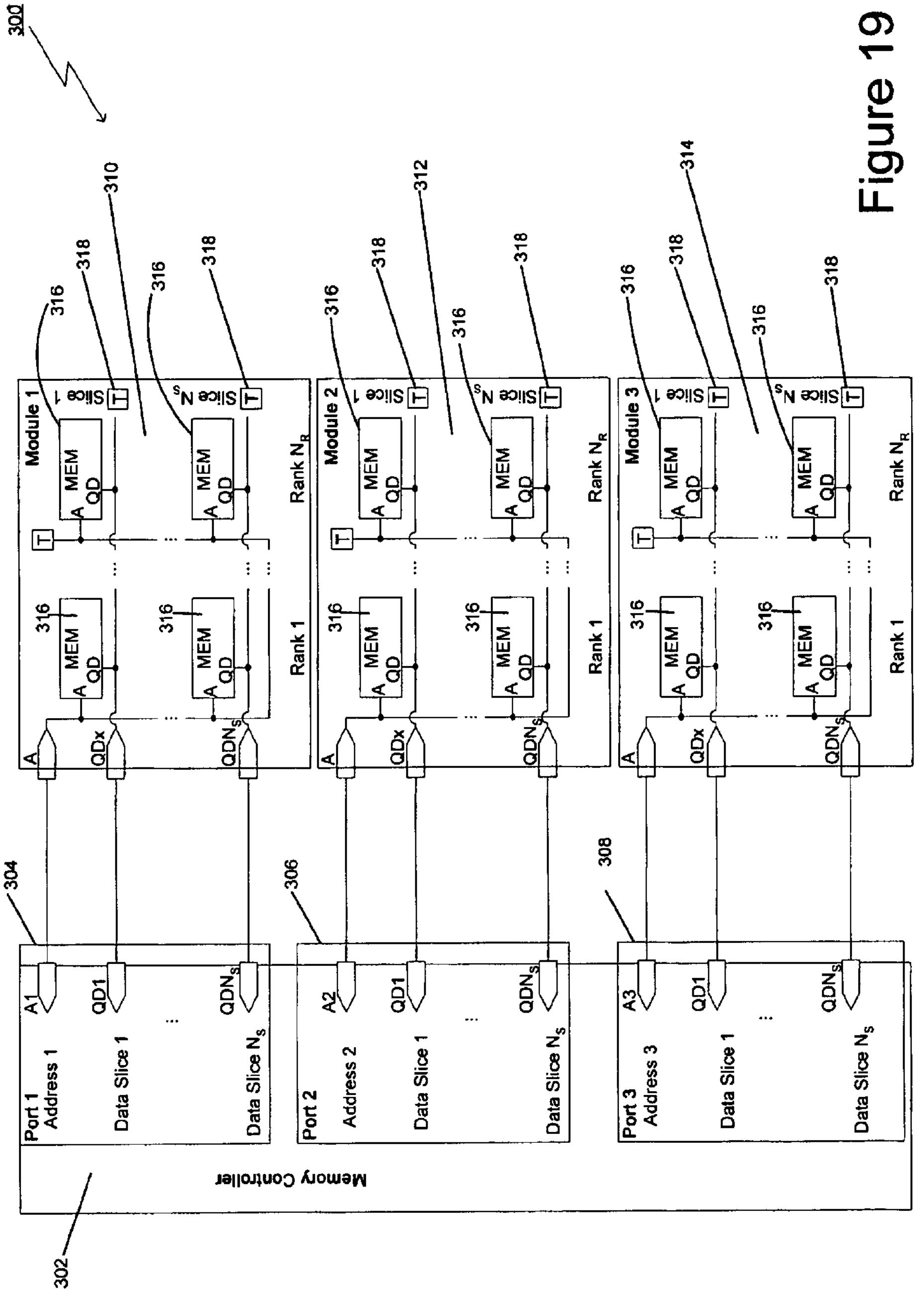
FIG. 19 shows an extra memory controller port memory system in accordance with the present invention.

Referring to FIG. 19, there is shown an extra memory controller port memory system 300 in accordance with the present invention. The extra memory controller port memory system 300 comprises a memory controller 302 having a first port (Port 1) 304, a second port (Port 2) 306, and a third port (Port 3) 308, all of equal size. The extra memory controller port memory system 300 also comprises a first memory module 310 connected to the first port (Port 1) 304 of the memory controller 302, a second memory module 312 connected to the second port (Port 2) 306 of the memory controller 302, and a third memory module 314 connected to the third port (Port 3) 308 of the memory controller 302.

The memory modules 310, 312, and 314 are divided into ranks (rows) of memory components (MEM) 316. The number of ranks is denoted $N_R$, and may vary from module to module.

The memory modules 310, 312, and 314 are also divided into slices (columns) of memory components (MEM) 316. The number of slices is denoted $N_S$, and may also vary from module to module. However, the number of slices $N_S$ times the number of data-type signals per slice $N_{dq}$ is a constant ($N_{DQ}=N_S*N_{dq}$), determined by the number of data-type signals at a memory controller port $N_{DQ}$.

As described above, the notion of “slice” is used to distinguish address-type signals “A” from data-type signals “QD”. The data-type signals (QD) from a slice of a memory controller port are only connected to a corresponding slice of each rank of memory components in a memory module. The address-type signals (A) are connected to all slices of each rank of memory components in a memory module. The address-type signals (A) can usually fan-out to more memory components than can data-type signals for several reasons including: [1] the signaling rate of address-type signals (A) is typically lower than data-type signals, and [2] address-type signals (A) are typically unidirectional (flowing from memory controller to memory components) and data-type signals (QD) are typically bi-directional (flowing in one direction at one time and flowing in the opposite direction at another time). As shown in FIG. 19, each memory component (MEM) 316 has only a single data bus port denoted QD.

In addition to memory components (MEM) 316, each memory module 310, 312, and 314 also contains some form of termination structure (T) 318 at the end of each signal wire. This is typically some sort of resistor component, and is typically required due to high signaling rates in a memory system.

Although the extra memory controller port memory system 300 is shown in FIG. 19 with three memory modules (i.e., memory modules 310, 312, and 314), the extra memory controller port memory system 300 may be populated with any of one, two, or three memory modules. Each of memory controller ports 304, 306, and 308 connect to a single socket, which can optionally hold a single memory module (this permits point-to-point wire topologies between memory controller and sockets). The sockets are identical. The memory modules 310, 312, and 314 are also identical, except that they can be configured for a range of different capacities. This is accomplished by varying the number of memory components 316 on each memory module, or by varying the density of the memory components 316, or both. In this manner, a user may select the storage capacity of the memory system 300.

As mentioned previously, it is desirable for a manufacturer to install some storage capacity in a memory system at the time it is built, and it is also desirable for a user to be able to add storage capacity to the memory system at a later point in time. It is also important that when storage capacity is added, the performance (bandwidth) of the memory system not decrease. This is a potential problem with prior art systems, as described above.

Figure 20:
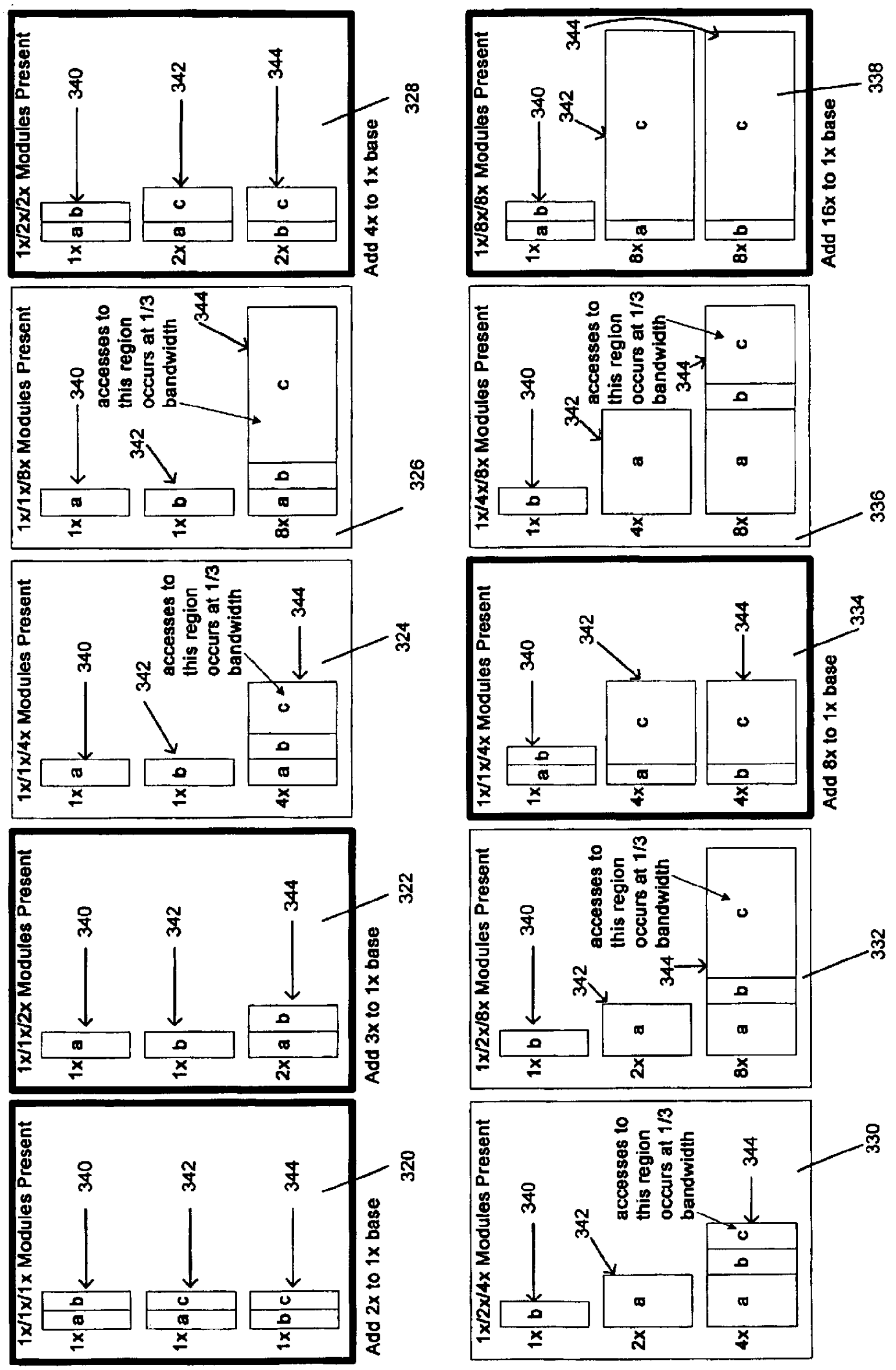
FIG. 20 illustrates how performance does not diminish when memory is added to the extra memory controller port memory system of FIG. 19 in accordance with the present invention.

In the three port memory controller 302 of FIG. 19, internal data buses are deliberately designed to only use up to two memory modules worth of bandwidth (a memory module can provide a bandwidth of "1/3"). With this limitation, it is then possible to insure that when memory is added, performance will never diminish. FIG. 20 illustrates one way in which this may be accomplished. When referring to FIG. 20, it is assumed that when the memory system 300 is built, a single memory module 340 is installed. Also, it is assumed that the memory capacity of this single memory module 340 is "1x", and that it supplies a bandwidth of "1/3".

When the system memory capacity is increased, two memory modules 342 and 344 are added. It is possible to increase the "1x" base capacity by "2x" (see block 320), "3x" (see block 322), "4x" (see block 328), "8x" (see block 334), and "16x" (see block 338) by using "1x", "2x", "4x", and "8x" memory modules in the combinations indicated below the respective blocks. In these five cases, the memory spaces in the three memory modules 340, 342, and 344 are broken into fragments, and combined with one another so that two fragments may always be accessed. The mapping logic in the memory controller 302 that does this is similar to what has already been described above for other approaches.

For example, in block 328 (i.e., "1x/2x/2x Modules Present"), the memory controller 302 will access the two fragments labeled "c" for the lowest part of the effective memory space, then it will access the two fragments labeled "b" for the next part, and finally it will access the two fragments labeled "a" for the highest part of the memory space. In all parts of the "c"/"b"/"a" memory space, two memory modules may be accessed, giving a total bandwidth of "2/3".

It should be noted that with this scheme, the memory bandwidth of the base memory ("1x") will only be "1/3", since only one memory module 340 is present. This is acceptable, since it is acceptable to increase memory bandwidth to "2/3" when memory capacity is increased. Also, it is important that the memory bandwidth never be lowered as a result of increasing memory capacity.

It should also be noted that there are a number of combinations in which some of the memory space must be accessed at "1/3" bandwidth. These combination are assumed to be unused.

Other similar mapping schemes are possible. For example, five memory ports could be provided on a memory controller, with two being used by a base memory, and three being used in an upgrade. The main idea is that the memory controller: 1.) accesses a first location of a first memory module simultaneously with a second location of a second memory module; and 2.) accesses a third location of the first memory module simultaneously with a fourth location of a third memory module. This is somewhat like lockstep accesses as described above, but this technique uses more than two memory modules in a more complex accessing pattern.

Figure 21:
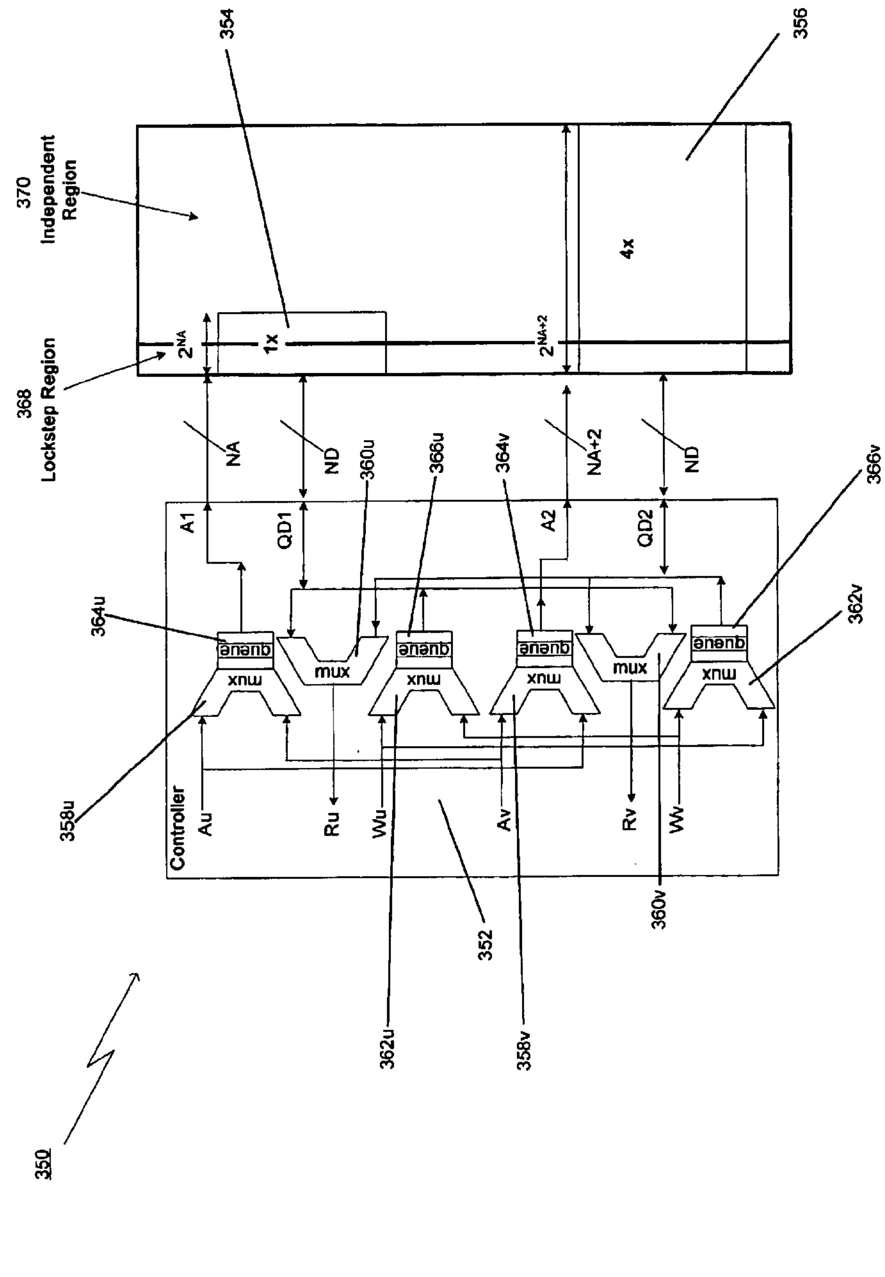
FIG. 21 shows a hybrid memory system which allows for switching between memory module access modes in accordance with the present invention.

An additional technique for maximizing memory bandwidth in memory systems with multiple memory controller ports and memory modules of unequal sizes is to provide a memory controller that can switch between different memory module access modes. For example, it would be beneficial to allow a memory controller to switch between an exclusive memory module access mode (as described above with respect to FIG. 3), an independent memory module access mode (as described above with respect to FIG. 4), and a lockstep memory module access mode (as described above with respect to FIG. 5). Referring to FIG. 21, there is shown a hybrid memory system 350 which allows for such switching between memory module access modes in accordance with the present invention. Similar to the independent port-per-module memory system shown in FIG. 4, in the hybrid memory system 350 of FIG. 21 there are two sets of address (A), read data (R), and write data (W) signals between a memory controller 352 and the rest of the system (not shown). These two sets of signals are appended with a "u" or "v" to distinguish them. They are connected to memory request sources in the system (e.g., central processing unit, graphics unit, I/O unit, etc), and they permit two simultaneous memory requests to be performed.

In FIG. 21, there is only one case shown: a first memory module 354 and a second memory module 356 with memory capacities of "1x"/"4x", respectively. However, other cases similar to those shown in FIG. 4 and others are also possible. In each case, the memory controller 352 comprises two address multiplexers **358*u* and 358*v*, two read data multiplexers 360*u* and 360*v*, and two write data multiplexers 362*u* and 362*v*. The address multiplexers 358*u* and 358*v* have address queues 364*u* and 364*v*, respectively, and the write data multiplexers 362*u* and 362*v* write data queues 366*u* and 366*v***, respectively, for accumulating memory request addresses and write data, as described in detail below.

As mentioned above, the hybrid memory system 350 allows for switching between memory module access modes. This switching function is typically controlled by the memory controller 352. For example, the memory controller 352 may permit a graphics processor to access up to two memory modules at once, while only permitting a main central processing unit to access a single memory module at a time. The memory controller 352 could use mapping hardware so that two equal regions of memory (one in each memory module) were operated in lockstep mode when accessed by the graphics processor. The remaining region on each memory module could be accessed in independent mode by the graphics processor, and all memory on both memory modules could be accessed in independent mode by the main central processing unit.

This arrangement would permit code and data structures that were used heavily by the graphics processor to be placed in a lockstep region 368. When this lockstep region 368 is accessed by the graphics processor, both memory modules would be utilized. All other accesses would only utilize one memory module, allowing pairs of transactions to be paired up, as described previously. In particular, when the main central processing unit accesses the lockstep region 368, it would be treated as an independent access, and only one memory module would be utilized at a time.

With this approach, much of the available performance (bandwidth) of the two memory modules can be used, even if the modules are badly mismatched. This particular scheme would require control registers in the memory controller 352 to specify that two types of accessing modes were to be permitted. These registers would also specify the address ranges of the lockstep region 368 and an independent access region 370 in each memory module, as well as the access mode used by each request source.

A more specific example of how the hybrid memory system 350 allows for switching between memory module access modes assumes that the graphics processor always transfers a double block (2B bytes) to or from the memory controller 352 on the Ru/Rv data buses (read) or the Wu/Wv data buses (write) when it accesses the lockstep region 368. In this example, this is the lower ½ of the "1x" memory module 354 and the lower ⅛th of the "4x" memory module 356. The graphics processor will typically be given simultaneous timing slots on the address buses (Au/Av) and write data buses (Wu/Wv) in the memory controller 352 to do this. However, it is not necessary that the two accesses happen simultaneously, and in fact this permits the design of the memory controller 352 to be kept less complicated. The address queues 364 and write data queues 366 will delay the address and write data by the appropriate amount for each memory module 354 or 356.

However, it will be necessary for the graphics processor to provide a read queue to delay either of the read data blocks (on the Ru and Rv data buses) so that they can be aligned. This is because the read transactions will not necessarily occur simultaneously on the two memory modules 354 and 356. This queue structure in the graphics processor is not shown, but is similar to the queue structures shown in the memory controller 352.

The graphics processor always transfers a single block (B bytes) to or from the memory controller on the Ru data bus (read) or the Wu data bus (write) when it accesses the independent region 370. In this example, this is the upper ½ of the "1x" memory module 354 and the upper ⅞th of the "4x" memory module 356. The graphics processor will normally be given a timing slot on the address bus (Au) and write data bus (Wu) in the memory controller 352 to do this. It will accept the read data on the Ru data bus when it becomes available.

The main central processing unit always transfers a single block (B bytes) to or from the memory controller 352 on the Rv data bus (read) or the Wv data bus (write) when it accesses the independent region 370 or the lockstep region 368. The main central processing unit will typically be given a timing slot on the address bus (Av) and write data bus (Wv) in the memory controller 352 to do this. It will accept the read data on the Rv data bus when it becomes available. It should be noted that the memory controller 352 typically provides for arbitration for the V and U buses between the main central processing unit and lockstep accesses by the graphics processor.

The type of access mode (i.e., either lockstep or independent) will depend upon both the source of a memory request (i.e., either the graphics processor or the main central processing unit) and/or the address of the memory request (lockstep region or independent region). The mode selection can be accomplished by a programmable register, fuse, jumper, etc. in the memory controller 352.

A further technique that can be used for bandwidth matching in accordance with the present invention is memory module removal. That is, when a memory module is present and a second, larger memory module is added, it is undesirable for the system performance to lessen. If none of the techniques discussed above are utilized, the possibility exists that for some memory module combinations and some applications, the addition of memory capacity will have the undesired effect of lowering the memory bandwidth across some of the address space, thereby lowering system performance.

It is possible to avoid this by removing the original, smaller memory module and only using the second, larger module. This will ensure that the memory capacity has increased, and that memory bandwidth across the full memory space remains at the maximum possible. However, the system user will be aware that the original memory is not usable (it is not installed in the system). This is undesirable for marketing reasons.

A solution is to provide a special non-functioning memory module receptacle that is indistinguishable from the memory module receptacles that are functional. This non-functioning memory module receptacle would not connect to any of the high speed address and data buses of the system, and would thus not impact system timing performance. However, a memory module mounted in this receptacle would still connect to the presence-detection hardware, letting initialization software know that a non-functioning memory module is present. The memory capacity of this memory module would be reported at initialization, but it would not be available to the application and system software. In this manner, the system user would have the illusion that the original memory is still being used, when in fact it was being deliberately disabled so that system performance is not compromised. The non-functioning memory module receptacle may also serve a secondary purpose, which is to provide a storage location for an unused memory module in case it could later be used in another system.

In summary, the above-described techniques provide a number of solutions to the problem of upgrading a memory system in which more than one memory port is present in a memory controller, but only one memory module may be connected to each port. These solutions provide maximum memory bandwidth across the full memory address space when the memory system is constrained to a single memory module per memory controller port, and the memory modules are allowed to have different densities and organizations. These solutions also keep memory bandwidth (and other performance metrics) as balanced as possible across the entire memory space.

The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breath and spirit of the present invention as disclosed herein.

What is claimed is:

1. A memory controller for controlling access to a memory module, the memory module having a memory component with a single port memory core for storing data therein, the memory controller comprising:

a first set of interface connections for providing access to the memory module;

a second set of interface connections for providing access to the memory module; and memory access circuitry for providing memory access signals to the memory module for selecting between a first mode wherein a first portion of the single port memory core is accessible through the first set of interface connections and a second portion of the single port memory core is accessible through the second set of interface connections, and a second mode wherein both the first portion and the second portion of the single port memory core are accessible through the first set of interface connections.

2. The memory controller as defined in claim 1, wherein the first and second sets of interface connections provide access to the memory module so as to read data from the single port memory core and write data to the single port memory core.

3. The memory controller as defined in claim 2, wherein the memory access circuitry includes decode logic for decoding address signals so as to generate the memory access signals.

4. A method for controlling access to a memory module, the memory module having a memory component with a single port memory core for storing data therein, the method comprising the steps of:

decoding address signals so as to generate memory access signals for the memory module; and providing the memory access signals to the memory module for selecting between a first mode wherein a first portion of the single port memory core is accessible through a first set of interface connections and a second portion of the single port memory core is accessible through a second set of interface connections, and a second mode wherein both the first portion and the second portion of the single port memory core are accessible through the first set of interface connections.

5. The method as defined in claim 4, wherein the single port memory core is accessible during the first and second modes to read data from the single port memory core and write data to the single port memory core.

6. The method as defined in claim 4, wherein the single port memory core is accessible during the first and second modes through a multiplexing stage.

7. A memory controller for controlling access to a memory module, the memory module having at least one single port memory component for providing a first group of memory storage locations and a second group of memory storage locations for storing data therein, the memory controller comprising:

a first set of interface connections for providing access to the memory module;

a second set of interface connections for providing access to the memory module; and memory access circuitry for providing memory access signals to the memory module for selecting between a first mode wherein the first group of memory storage locations is accessible through the first set of interface connections and the second group of memory storage locations is accessible through the second set of interface connections, and a second mode wherein both the first group and the second group of memory storage locations are accessible through the first set of interface connections.

8. The memory controller as defined in claim 7, wherein the first and second sets of interface connections provide access to the memory module so as to read data from the first and second groups of memory storage locations and write data to the first and second groups of memory storage locations.

9. The memory controller as defined in claim 8, wherein the memory access circuitry includes decode logic for decoding address signals so as to generate the memory access signals.

10. A method for controlling access to a memory module, the memory module having at least one single port memory component for providing a first group of memory storage locations and a second group of memory storage locations for storing data therein, the method comprising the steps of:

decoding address signals so as to generate memory access signals for the memory module; and providing the memory access signals to the memory module for selecting between a first mode wherein the first group of memory storage locations is accessible through a first set of interface connections and the second group of memory storage locations is accessible through a second set of interface connections, and a second mode wherein both the first group and the second group of memory storage locations are accessible through the first set of interface connections.

11. The method as defined in claim 10, wherein the first and second groups of memory storage locations are accessible during the first and second modes to read data from the first and second groups of memory storage locations and write data to the first and second groups of memory storage locations.

12. The method as defined in claim 10, wherein the first and second groups of memory storage locations are accessible during the first and second modes through a multiplexing stage.

13. A memory controller for controlling access to a plurality of memory modules, each of the plurality of memory modules having at least one memory component for providing memory storage locations for storing data therein, the memory controller comprising:

a first set of interface connections for providing access to a first of the plurality of memory modules;

a second set of interface connections for providing access to a second of the plurality of memory modules;

a third set of interface connections for providing access to a third of the plurality of memory modules; and memory access circuitry for controlling access to the first, second, and third memory modules through the first, second, and third sets of interface connections, respectively, such that a first memory storage location in the first memory module may be accessed through the first set of interface connections simultaneously while a second memory storage location in the second memory module is accessed through the second set of interface connections, and a third memory storage location in the first memory module may be accessed through the first set of interface connections simultaneously while a fourth memory storage location in the third memory module is accessed through the third set of interface connections.

14. The memory controller as defined in claim 13, wherein the first, second, and third sets of interface connections provide access to the first, second, and third memory modules, respectively, so as to read data from the memory storage locations and write data to the memory storage locations.

15. The memory controller as defined in claim 13, wherein the memory access circuitry includes memory mapping logic for establishing groups of memory storage locations between the first memory module and the second memory module, and between the first memory module and the third memory module.

16. The memory controller as defined in claim 13, wherein the memory access circuitry also controls access to the first, second, and third memory modules through the first, second, and third sets of interface connections, respectively, such that a fifth memory storage location in the second memory module may be accessed through the second set of interface connections simultaneously while a sixth memory storage location in the third memory module is accessed through the third set of interface connections.

17. The memory controller as defined in claim 16, wherein the memory access circuitry includes memory mapping logic for establishing groups of memory storage locations between the second memory module and the third memory module.

18. A method for controlling access to a plurality of memory modules, each of the plurality of memory modules having at least one memory component for providing memory storage locations for storing data therein, the method comprising the steps of:

mapping memory storage locations in each of the plurality of memory modules so as to establish a first group of memory storage locations between a first of the plurality of memory modules and a second of the plurality of memory modules, and a second group of memory storage locations between the first of the plurality of memory modules and a third of the plurality of memory modules;

simultaneously accessing a first memory storage location in the first memory module through a first set of interface connections and a second memory storage location in the second memory module through a second set of interface connections, the first memory location and the second memory location being part of the first group of memory storage locations; and simultaneously accessing a third memory storage location in the first memory module through the first set of interface connections and a fourth memory storage location in the third memory module through a third set of interface connections, the third memory location and the fourth memory location being part of the second group of memory storage locations.

19. The method as defined in claim 18, wherein the first, second, and third sets of interface connections provide access to the first, second, and third memory modules, respectively, so as to read data from the memory storage locations and write data to the memory storage locations.

20. The method as defined in claim 18, further comprising the steps of:

mapping memory storage locations in each of the plurality of memory modules so as to establish a third group of memory storage locations between the second memory module and the third memory module; and simultaneously accessing a fifth memory storage location in the second memory module through the second set of interface connections and a sixth memory storage location in the third memory module through the third set of interface connections, the fifth memory location and the sixth memory location being part of the third group of memory storage locations.

21. A memory controller for controlling access to a plurality of memory modules, each of the plurality of memory modules having at least one single port memory component for providing memory storage locations for storing data therein, each memory storage location having a unique address, the memory controller comprising:

a first set of interface connections for providing access to a first of the plurality of memory modules;

a second set of interface connections for providing access to a second of the plurality of memory modules; and memory access circuitry for controlling access to the first and second memory modules through the first and second sets of interface connections, respectively, such that memory storage locations in the first and second memory modules may be accessed either independently or jointly through the first and second sets of interface connections, respectively, based upon the unique addresses of the memory storage locations.

22. The memory controller as defined in claim 21, wherein the memory access circuitry also controls access to the first and second memory modules through the first and second sets of interface connections, respectively, such that memory storage locations in the first and second memory modules may be accessed either independently or jointly through the first and second sets of interface connections, respectively, based upon a source requesting access to the memory storage locations in the first and second memory modules.

23. The memory controller as defined in claim 21, wherein the memory access circuitry alternatively controls access to the first and second memory modules through the first and second sets of interface connections, respectively, such that memory storage locations in the first and second memory modules may be accessed either independently or jointly through the first and second sets of interface connections, respectively, based upon a source requesting access to the memory storage locations in the first and second memory modules.

24. The memory controller as defined in claim 21, wherein the first and second sets of interface connections provide access to the first and second memory modules, respectively, so as to read data from the memory storage locations and write data to the memory storage locations.

25. The memory controller as defined in claim 24, wherein memory storage locations in the first and second memory modules are accessed independently through the first and second sets of interface connections, respectively, such that only a single memory storage location in either the first memory module or the second memory module is accessed through the first set of interface connections or the second set of interface connections, respectively.

26. The memory controller as defined in claim 24, wherein memory storage locations in the first and second memory modules are accessed jointly through the first and second sets of interface connections, respectively, such that a first memory storage location in the first memory module is accessed through the first set of interface connections at essentially the same time as a second memory storage location in the second memory module is accessed through the second set of interface connections.

27. A method for controlling access to a plurality of memory modules, each of the plurality of memory modules having at least one single port memory component for providing memory storage locations for storing data therein, each memory storage location having a unique address, the method comprising the steps of:

receiving a request to access the plurality of memory modules; and accessing the plurality of memory modules in response to the request such that memory storage locations in a first of the plurality of memory modules and a second of the plurality of memory modules are accessed either independently or jointly through a first set of interface connections and a second set of interface connections, respectively, based upon the unique addresses of the memory storage locations.

28. The method as defined in claim 27, wherein the step of accessing the plurality of memory modules in response to the request includes accessing memory storage locations in a first of the plurality of memory modules and a second of the plurality of memory modules either independently or jointly through a first set of interface connections and a second set of interface connections, respectively, also based upon a source requesting access to the plurality of memory modules.

29. The method as defined in claim 27, wherein the step of accessing the plurality of memory modules in response to the request includes accessing memory storage locations in a first of the plurality of memory modules and a second of the plurality of memory modules either independently or jointly through a first set of interface connections and a second set of interface connections, respectively, alternatively based upon a source requesting access to the plurality of memory modules.

30. The method as defined in claim 27, wherein the first and second sets of interface connections provide access to the first and second memory modules, respectively, so as to read data from the memory storage locations and write data to the memory storage locations.

31. The method as defined in claim 27, wherein independently accessing memory storage locations includes accessing only a single memory storage location in either the first memory module or the second memory module through the first set of interface connections or the second set of interface connections, respectively.

32. The method as defined in claim 27, wherein jointly accessing memory storage locations includes accessing a first memory storage location in the first memory module through the first set of interface connections at essentially the same time as a second memory storage location in the second memory module is accessed through the second set of interface connections.

33. A memory controller for controlling access to a memory module, the memory module having a memory component with a single memory core for storing data therein, the memory controller comprising:

a first set of interface connections for providing access to the memory module;

a second set of interface connections for providing access to the memory module; and memory access circuitry for providing memory access signals to the memory module for selecting between a first mode wherein a first portion of the single memory core is accessible through the first set of interface connections and a second portion of the single memory core is accessible through the second set of interface connections, and a second mode wherein both the first portion and the second portion of the single memory core are accessible through the first set of interface connections.

34. A method for controlling access to a memory module, the memory module having a memory component with a single memory core for storing data therein, the method comprising the steps of:

decoding address signals so as to generate memory access signals for the memory module; and providing the memory access signals to the memory module for selecting between a first mode wherein a first portion of the single memory core is accessible through a first set of interface connections and a second portion of the single memory core is accessible through a second set of interface connections, and a second mode wherein both the first portion and the second portion of the single memory core are accessible through the first set of interface connections.

* * * * *